US006876946B2

(12) United States Patent
Yasuda et al.

(10) Patent No.: US 6,876,946 B2
(45) Date of Patent: Apr. 5, 2005

(54) ALIGNMENT METHOD AND APPARATUS THEREFOR

(75) Inventors: Masahiko Yasuda, Kawasaki (JP);
Osamu Furukawa, Tokyo (JP);
Masaharu Kawakubo, Kawasaki (JP);
Hiroki Tateno, Kawasaki (JP);
Nobutaka Magome, Kawasaki (JP)

(73) Assignee: Nikon Corporation, Tokyom (JP)

( * ) Notice: Subject to any disclaimer, the term of this patent is extended or adjusted under 35 U.S.C. 154(b) by 0 days.

(21) Appl. No.: 10/299,819

(22) Filed: Nov. 20, 2002

(65) Prior Publication Data

US 2003/0158701 A1 Aug. 21, 2003

Related U.S. Application Data

(63) Continuation of application No. 09/901,708, filed on Jul. 11, 2001, now abandoned, which is a division of application No. 09/240,599, filed on Feb. 1, 1999, now Pat. No. 6,278,957, which is a continuation of application No. 08/569,400, filed on Dec. 8, 1995, now abandoned, which is a continuation-in-part of application No. 08/326,952, filed on Oct. 21, 1994, now abandoned, which is a continuation-in-part of application No. 08/254,524, filed on Jun. 6, 1994, now abandoned, which is a continuation-in-part of application No. 08/183,879, filed on Jan. 21, 1994, now abandoned.

(30) Foreign Application Priority Data

| Jan. 21, 1993 | (JP) | ............................................. 5-008194 |
| Jun. 8, 1993 | (JP) | ............................................. 5-137642 |
| Jun. 8, 1993 | (JP) | ............................................. 5-137913 |
| Jun. 11, 1993 | (JP) | ............................................. 5-140580 |
| Oct. 21, 1993 | (JP) | ............................................. 5-263241 |
| Dec. 8, 1994 | (JP) | ............................................. 6-304525 |

(51) Int. Cl.$^7$ .............................................. G03B 27/42
(52) U.S. Cl. .......................... 702/152; 355/53; 250/548

(58) Field of Search ................................ 702/33–36, 40, 702/81–84, 94, 95, 117–119, 123, 150–153, 159, 170, 172, 179, 180, 183, 187, 194, FOR 123–125, FOR 131, FOR 134, FOR 135, FOR 137, FOR 139, FOR 144, FOR 145, FOR 170–FOR 172; 700/121, 60; 382/141, 144, 145, 149, 150–152; 716/25, 19; 250/548, 584, 586, 587; 356/399–401; 355/52, 53

(56) References Cited

U.S. PATENT DOCUMENTS

| 3,986,007 | A | * | 10/1976 | Ruoff, Jr. ................. 235/151.1 |
| 4,052,603 | A | * | 10/1977 | Karlson ...................... 364/120 |
| 4,414,749 | A | * | 11/1983 | Johannsmeier ............ 33/180 R |
| 4,629,313 | A | | 12/1986 | Tanimoto ..................... 355/53 |
| 4,666,237 | A | | 5/1987 | Mallinson .................. 350/96.2 |
| 4,699,515 | A | | 10/1987 | Tanimoto et al. ............. 356/40 |
| 4,710,029 | A | | 12/1987 | Katoh ........................ 356/401 |

(Continued)

FOREIGN PATENT DOCUMENTS

| JP | 55044708 | * | 3/1980 |
| JP | 01240803 | * | 9/1989 |
| JP | 03194914 | * | 8/1991 |
| JP | 4-324615 | | 11/1992 |
| JP | 3-096219 | | 11/2001 |
| JP | 3245859 | | 11/2001 |

*Primary Examiner*—Carol S. Tsai
(74) *Attorney, Agent, or Firm*—Miles & Stockbridge, P.C.

(57) ABSTRACT

A method of transferring a pattern of a mask onto shot areas on a substrate determines two sets of parameters in a single model equation. The parameters in one of the two sets relate to arrangement of a plurality of shot areas on the substrate, and the parameters in the other set relate to the shot areas per se. The mask and the substrate are moved relatively in accordance with the determined parameters.

25 Claims, 17 Drawing Sheets

U.S. PATENT DOCUMENTS

| | | | |
|---|---|---|---|
| 4,770,531 A | 9/1988 | Tanaka et al. | 356/358 |
| 4,780,616 A | 10/1988 | Nishi et al. | 250/548 |
| 4,780,617 A | 10/1988 | Umatate et al. | 250/548 |
| 4,794,648 A * | 12/1988 | Ayata et al. | 382/8 |
| 4,833,621 A | 5/1989 | Umatate | 364/491 |
| 4,860,374 A * | 8/1989 | Murakami et al. | 382/48 |
| 4,871,237 A | 10/1989 | Anzai et al. | 350/419 |
| 4,929,893 A * | 5/1990 | Sato et al. | 324/158 |
| 4,962,318 A | 10/1990 | Nishi | 250/548 |
| 5,117,255 A | 5/1992 | Shiraishi et al. | 355/53 |
| 5,124,927 A * | 6/1992 | Hopewell et al. | 364/468 |
| 5,151,750 A | 9/1992 | Magome et al. | 356/401 |
| 5,153,678 A | 10/1992 | Ota | 356/401 |
| 5,208,763 A | 5/1993 | Hong et al. | 364/551.02 |
| 5,272,501 A | 12/1993 | Nishi et al. | 355/53 |
| 5,365,051 A | 11/1994 | Suzuki et al. | 250/201.2 |
| 5,448,333 A * | 9/1995 | Iwamoto et al. | 355/53 |
| 5,461,237 A | 10/1995 | Wakamoto et al. | 250/548 |
| 5,493,402 A | 2/1996 | Hirukawa | 356/400 |
| 5,521,036 A | 5/1996 | Iwamoto et al. | 430/22 |
| 5,561,606 A * | 10/1996 | Ota et al. | 364/489 |
| 5,563,708 A | 10/1996 | Nakai | 356/363 |
| 5,646,413 A | 7/1997 | Nishi | 250/548 |
| 5,674,651 A | 10/1997 | Nishi | 430/22 |
| 5,742,067 A | 4/1998 | Imai | 250/548 |
| 5,805,866 A * | 9/1998 | Magome et al. | 395/500 |
| 5,808,910 A | 9/1998 | Irie et al. | 364/559 |
| 5,831,739 A | 11/1998 | Ota | 356/401 |
| 5,943,638 A * | 8/1999 | Aoyagi | 702/150 |
| 6,081,614 A | 6/2000 | Yamada et al. | 382/151 |
| 6,269,322 B1 * | 7/2001 | Templeton et al. | 702/150 |
| 2001/0017939 A1 * | 8/2001 | Yoshida | 382/151 |

* cited by examiner

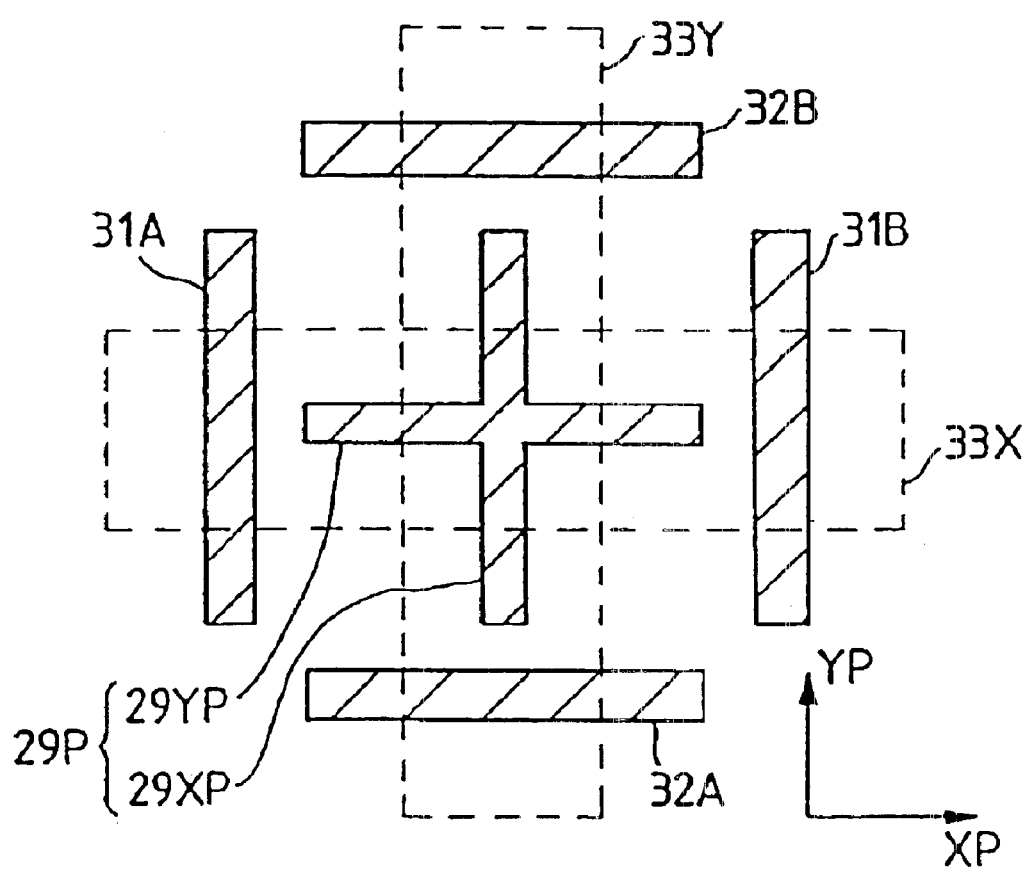

ALIGNMENT METHOD AND APPARATUS THEREFOR

CROSS-REFERENCE TO RELATED APPLICATIONS

This application is a continuation of application Ser. No. 09/901,708 filed Jul. 11, 2001 now abandoned, which is a division of application Ser. No. 09/240,599 filed Feb. 1, 1999 now U.S. Pat. No. 6,278,957, which is a continuation of application Ser. No. 08/569,400 filed Dec. 8, 1995 (abandoned), which is a continuation-in-part of application Ser. No. 08/326,952 filed Oct. 21, 1994 (abandoned), which is a continuation-in-part of application Ser. No. 08/254,524 filed Jun. 6, 1994 (abandoned), which is a continuation-in-part of application Ser. No. 08/183,879 filed Jan. 21, 1994 (abandoned).

BACKGROUND OF THE INVENTION

1. Field of the Invention

The present invention relates to an alignment method and an apparatus for determining a model equation expressing the regularity of arrangement of a plurality of processing areas on a wafer by use with, e.g., a statistical technique in order to predict an arrangement coordinate value of each of the processing areas prior to aligning each of processing areas with a predetermined position and more particularly to an alignment method and an apparatus suitable for aligning a pattern of a mask or a reticle with each of processing areas (shot areas) accurately.

2. Related Background Art

In the photolithography process for manufacturing semiconductor devices, liquid crystal display devices or the like, there are used projection exposure apparatuses, which project a pattern of a mask or a reticle (hereinafter referred to as the reticle) to each of shot areas on a sensitive substrate via a projection optical system. Recently, step and repeat type exposure apparatuses, e.g., reduction projection type exposure apparatuses (stepper) have been widely used, wherein the sensitive substrate is disposed on a two-dimensionally movable stage and the image of the pattern of the reticle is exposed on each of the shot areas on the sensitive substrate successively and repeatedly while the sensitive substrate is shifted (stepping) by the stage.

For example, in forming a semiconductor device, a plurality of circuit patterns are piled one over another on the sensitive substrate with a sensitive material applied thereon. Therefore, when exposing the circuit pattern on the first layer and thereafter, the pattern image of the reticle for the next exposure needs to be superposed accurately on the circuit pattern already formed on the wafer. That is, the wafer needs to be aligned with the reticle accurately. The alignment method for the wafer in the conventional stepper or the like is as follows (e.g., U.S. Pat. Nos. 4,780,617 and 4,833,621).

A plurality of shot area are arranged regularly on the wafer based on the predetermined alignment coordinate values and provided with the respective chip patterns having marks for alignment (alignment marks). However, when superposing another pattern on the pattern formed previously, even though the wafer is subjected to the stepping operation based on the predetermined arrangement coordinate values, sufficient alignment accuracy cannot be necessarily obtained owing to the following factors.

(1) the residual rotation error of the wafer: $\Theta$ (2) the rectangular degree error of the stage coordinate system (or shot arrangement): W (3) the linear expansion or contraction of the wafer: $R_x$, $R_y$ (4) the offset (parallel movement) of the wafer (center position): $O_X$, $O_Y$ As these four error amounts can be expressed by six parameters, the transformation matrix A of 2 lines×2 rows including elements expressed by four parameters among those and the transformation matrix 0 of 2 lines×1 row including elements of the offset (parallel movement) $O_X$, $O_Y$ are considered. And, the arrangement coordinate value upon the design $(D_{Xn}, D_{Yn})$ (n=0, 1, 2, . . . ) of the shot areas on the wafer and the arrangement coordinate values $(F_{Xn}, F_{Yn})$ for the actual alignment by the step and repeat method are expressed by use with the transformation matrices A and O as follows:

$$\begin{bmatrix} F_{Xn} \\ F_{Yn} \end{bmatrix} = A \begin{bmatrix} D_{Xn} \\ D_{Yn} \end{bmatrix} + O \qquad (1)$$

At this time, the least squares method is used to determine the transformation matrices A and O, and the deviation between the arrangement coordinate value $(FM_{Xn}, FM_{Yn})$ actually measured from each of shot areas selected from the plurality of shot areas and the arrangement coordinate value upon calculation $(F_{Xn}, F_{Yn})$ is calculated for each of the corresponding selected shot areas. Conventionally, on the basis of the determined transformation matrices A, O and the alignment coordinate upon the design $(D_{Xn}, D_{Yn})$, the arrangement value upon calculation $(F_{Xn}, F_{Yn})$ for the actual alignment position is calculated and the positions of shot areas on the wafer are determined based on the calculated arrangement coordinate value $(F_{Xn}, F_{Yn})$ However, even though the wafer is positioned in accordance with the calculated alignment coordinate value upon calculation $(F_{Xn}, F_{Yn})$, sufficient alignment accuracy cannot be necessarily obtained owing to the following factors.

(1) the residual rotation errors of the circuit patterns (chip pattern) of the shot areas on the wafer: $\theta$ (2) the rectangular degree error of the coordinate system (chip pattern) on the wafer: w (3) the linear expansion or contraction of the chip pattern in the two rectangular directions: rx, ry.

These are caused by the deviation or rotation of the reticle from a predetermined position, the projection magnification error of the projection optical system or the distortion of the projection optical system when the chip pattern is first (first layer) printed on each shot area on the wafer. Furthermore, these factors are changed by the distortion occuring at the time of processing the wafer.

Further, there is presented such a disadvantage that when a reticle is rotated or translated, a pattern image of the reticle and a chip pattern on a wafer cannot be precisely aligned with each other. Accordingly, as proposed in U.S. Pat. No. 4,699,515 or U.S. Pat. No. 4,052,603, two marks on sides of a circuit pattern on a reticle are detected so as to obtain a rotational error, and the reticle or a wafer is rotated so as to make the rotational error zero. Further, as proposed in U.S. patent application Ser. No. 093,725 (Jul. 20, 1993), marks on a reticle are transferred onto a plurality of partial areas on a wafer, respectively, and latent images formed on the partial areas are detected so as to obtain positional deviations which are then added to arrangement coordinates $(F_{Xn}, F_{Yn})$ in order to position the wafer. However, the former method offers such a problem that it is difficult to drive the rotational error into a value below a predetermined allowable value due to an error in depiction of the marks on the reticle. Further, the latter method offers such a problem that exposure operation for forming the latent images greatly lowers the through-put.

Further, another disadvantage occurs such that the pattern image of the reticle cannot precisely be aligned with the chip pattern on the wafer over their entire surfaces due to an error in the projection magnification of the projection system. Accordingly, as proposed, for example, in U.S. Pat. No. 4,629,313, projected positions of a plurality of marks on a reticle exclusively for measurement are detected in order to obtain a projection magnification of a projection optical system. However, there is present a problem in which this method has to use the reticle exclusively for measurement so that a relatively long time is required for the measurement of the magnification, causing the through-put to be greatly lowered, and further, it is difficult to precisely measure the projection magnification due to an error in the depiction of the reticle.

When the circuit patterns of the second and subsequent layers are projection-exposed on the wafers by the use of a projection exposure apparatus such as a stepper, as stated above, it is required to perform alignment of each shot area in which the circuit pattern has already formed on the wafer with a pattern image of the reticle serving as a mask to be exposed, namely alignment between the wafer and the reticle, with high accuracy. An alignment apparatus for executing such alignment is mainly comprised of an alignment sensor for generating a photoelectric signal by detecting the position of an alignment mark (wafer mark) attached in each shot area on the wafer, a signal processing system for obtaining an amount of deviation of said wafer mark from its original position by processing said photoelectric signal, and a positioning mechanism for compensating the position of the wafer or the reticle based on the obtained amount of deviation.

As a method for such alignment sensor, there are a TTR (through-the-reticle) method for observing (detecting) an alignment mark (a reticle mark) on the reticle at the same time through a wafer mark and a projection optical system, a TTL (through-the-lens) method for not detecting the reticle mark, but detecting the wafer mark only through the projection optical system, and an off-axis method for detecting the wafer mark only through a detection system which is separated from the projection optical system.

Among these methods, since the TTR method or the TTL method is designed to detect the wafer mark through the projection optical system, and which projection optical system is designed to have the most satisfactory color aberration for an exposure light, a desired light is a laser beam (monochromatic light) or a quasi monochromatic light having a wavelength range on the same level as that of the exposure light (e.g., bright line spectrum of g-ray, i-ray, etc., of a mercury-arc lamp). Accordingly, in an alignment sensor of the TTR method or the TTL method, a sensor using a laser beam as detection light is mainly used, such as a laser step alignment (hereinafter called the "LSA") sensor which relatively scans a wafer mark in a dot-array pattern form and a laser beam to be converged in a slit form and detects a diffracted light generated in a predetermined direction so as to detect the position of said wafer mark, or a laser interferometric alignment (hereinafter called the "LIA") sensor which irradiates laser beams from a plurality of directions to a wafer mark in the form of a diffraction grating so as to detect the position of said wafer mark from a phase of the interference lights of a plurality of diffracted lights emitted to the same direction from said wafer mark. An alignment sensor of the LSA method and that of the LIA method are disclosed, for example, in U.S. Pat. No. 5,151,750.

On the other hand, in the off-axis method, since there is no limitation by the projection optical system, any type of illumination light to the wafer mark can be adopted. As a result, the above-mentioned LSA alignment sensor or the LIA alignment sensor can be used. Further, for the off-axis method, an alignment sensor of an image processing system (hereinafter called the FIA (Field Image Alignment) system) is used, by which a wafer mark is illuminated having an illumination light (broad band light) with a predetermined band range (e.g., range of 200 nm or around) from a halogen lamp, or the like, and an image pick-up signal obtained by image-picking the image of said wafer mark is image-processed to obtain the position of the wafer mark.

As a method for performing alignment in each shot area on the wafer by using any of the above-mentioned alignment apparatuses, an alignment method disclosed in the above-mentioned U.S. Pat. No. 4,780,617 is proposed.

Out of the alignment sensors as mentioned above, an alignment sensor of the off-axis system and the FIA method uses an illumination light having a wide band range so that said sensor is hardly influenced from a thin film interference on a photoresist layer which is coated on the wafer and is hardly influenced from asymmetric characteristics of the wafer mark conveniently. However, according to the off-axis method, a measured position and an exposure position are separated comparatively widely, which results in a poor through-put (the number of wafers processed per unit time).

On the other hand, when an alignment sensor of the TTL system and the LIA method is used, a moving distance between the measured position and the exposure position is short (the moving distance in some cases is substantially zero) because of the TTL system, which is advantageous in terms of a through-put. However, when an alignment sensor of the LIA method or the LSA method is used, errors may be generated in measurement results of a scaling (a linear expansion or contraction of the entire wafer) and a magnification of a chip pattern within a shot area, under the influence of the asymmetric configuration generated on the surface of the wafer mark formed, for example, by aluminum vapor deposition on the wafer. Moreover, since the used light is a monochromatic laser beam, the sensor may be influenced by the thin film interference of the photoresist. There is a possibility that extent of these influences differ from one another for each lot due to non-uniformity of the process so that it is inconveniently difficult to compensate these influences only with the constants obtained in advance.

Particularly, the alignment method disclosed in the above-mentioned U.S. Pat. No. 4,780,617 is a method for improving both an alignment accuracy and a through-put (the number of wafers processed per unit time) so that it is desired to use an alignment sensor which is very satisfactory in terms of both the accuracy and the through-put. In addition, it is required not only to improve the alignment accuracy in each shot area, but also to enhance a superposition accuracy within each shot area.

SUMMARY OF THE INVENTION

It is therefore an object of the present invention to provide an alignment method and an apparatus capable of aligning each of processing areas on the wafer with a predetermined position at high speed and with accuracy even though the processing areas on the wafer are expanded, contracted or rotated.

It is another object of the present invention to provide an alignment method and an apparatus capable of aligning a pattern of the mask with each of the shot areas precisely when transferring the pattern of the mask to each shot area on the wafer.

It is still another object of the present invention to provide an alignment method sensor which is excellent in terms of an alignment accuracy, and a superposition accuracy within each shot area, as well as a through-put.

BRIEF DESCRIPTION OF THE DRAWINGS

FIG. 3 is an enlarged diagram of the index marks and the image of the alignment mark on the index plate of FIG. 2;

DETAILED DESCRIPTION OF THE PREFERRED EMBODIMENTS

Figure 1:
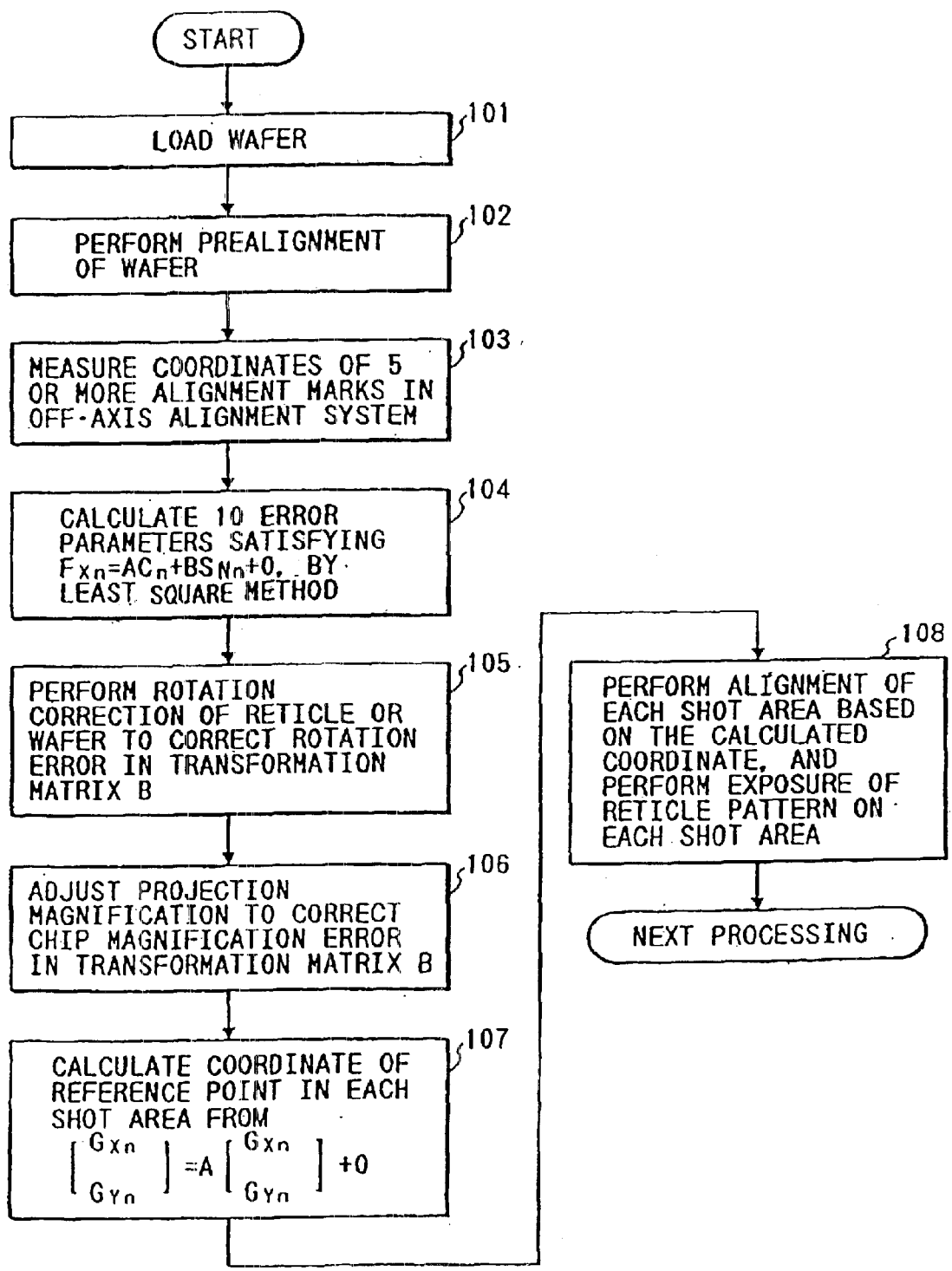
FIG. 1 is a flowchart illustrating alignment and exposure operations according to a preferred embodiment of the present invention.

In the present invention, each of a plurality of processing areas on a substrate on which a pattern of a mask is transferred is provided with a plurality of marks for alignment arranged by a predetermined positional relationship with respect to the corresponding specific points defined on the respective processing areas. Prior to aligning each of the processing areas with a predetermined transfer position in a static coordinate system for defining a moving position of the substrate, coordinate positions of a predetermined number of marks are selected from several processing areas of the plurality of processing areas on the static coordinate system. Further, statistical calculation is performed to obtain parameters in a model equation expressing the regularity of arrangement of the plurality of processing areas by use of the measured plurality of coordinate positions, the arrangement coordinate values upon design of the specific points corresponding to the respective several processing areas, and the relative arrangement coordinate values upon the design of the selected marks with respect to the respectively corresponding specific points on the several processing areas. Then, the coordinate positions of the plurality of processing areas on the static coordinate system are determined by using the calculated parameters. Therefore, it is possible to align the plurality of processing areas with the transfer position accurately by moving the substrate in accordance with the determined coordinate positions.

Further, at least one of a relative rotation error between the pattern of the mask and the processing areas and a relative configuration error between the pattern of the mask and the processing areas (magnification error, distortion error) is corrected. Therefore, the pattern of the mask can be aligned with each of the processing areas on the wafer with high accuracy. Also, when the parameters in the model equation include the information such as the rotation error, the configuration error, e.g., the directionally uniform magnification error, two-dimensional marks are used for the marks for alignment and coordinate positions of at least two marks in each of the several processing areas on the static coordinate system are measured.

Thus, in the present invention, the fact that the plurality of processing areas arranged on the substrate in accordance with the predetermined arrangement coordinate system have the rotation error or the configuration error is taken into consideration, there is used the model equation including the parameters related to the arrangement of the specific points on the processing areas on the wafer and the parameters related to the rotation error, the configuration or the like of the processing areas (chip patterns) with respect to the specific points. Using the coordinate positions of the marks for alignment on the several processing areas on the static coordinate system, the arrangement coordinate values upon design of the specific points on the several processing areas, and the relative arrangement coordinate values upon the design of the selected marks on the several processing areas with respect to the corresponding specific points on the several processing areas, statistical calculation is performed to calculate the parameters in the model equation expressing the regularity of arrangement of the plurality of processing areas. Then, the coordinate positions of the respective processing areas on the wafer on the static coordinate system are determined by use of the calculated parameters. Therefore, even though the processing areas on the wafer have the rotation error, the configuration error or the like, each of the processing areas can be aligned with the predetermined position by shifting the substrate in accordance with the previously determined coordinate positions.

The parameters in the model equation include, e.g., the residual rotation error of the arrangement coordinate system on the substrate with respect to the static coordinate system: $\Theta$, the rectangular degree error of the arrangement coordinate system (shot arrangement) on the substrate: $w$, the linear expansion or contraction of the substrate $R_x$, $R_y$, the offset of the center position of the substrate with respect to the static coordinate system: $O_X$, $O_Y$ (total=six parameters) related to the arrangement of the respective specific points of the plurality of processing areas on the substrate, and at least one parameter, e.g., the residual rotation error of the chip pattern with respect to the arrangement coordinate system on the substrate (chip rotation): $\theta$, the rectangular degree error of the chip pattern: $w$ or the linear expansion or contraction of the chip pattern $rx$, $ry$ related to the processing areas (chip pattern) on the substrate. Consequently, based on the parameters of the model equation, especially based on the parameters related to the chip pattern, at least one of the relative rotation error or configuration error (magnification error, distortion error or the like) between the pattern of the mask and the processing areas is corrected. Therefore, it is possible to align the pattern of the mask with the respective processing areas on the substrate accurately over the whole surface thereof.

When using the model equation including six parameters related to the arrangement of the processing areas (specific points) and at least one parameter related to the chip pattern, at least seven coordinate positions are needed for the statistical calculation. If the marks for alignment arranged by a predetermined positional relationship with respect to the respective specific points are one-dimensional marks, the coordinate positions of seven or more one-dimensional marks on the substrate on the static coordinate system are measured. Also, when the marks for alignment are two-dimensional marks, the coordinate positions of four or more two-dimensional marks on the substrate on the static coordinate system are measured, but in one of them it is sufficient to measure either the X or Y directional element of its coordinate position. Besides, among the six parameters related to the arrangement of the processing areas (specific points), e.g. if the linear expansion or contraction error (scaling of the substrate) $R_x$, $R_y$ is deemed to be $R_x=R_y$, the number of the parameters can be reduced. In short, the number of parameters related to the arrangement of the processing areas (specific points) is optional in the present invention, but the model equation including at least one parameter related to the chip pattern should be used.

Further, the alignment errors between the pattern of the mask and the respective processing areas (chip pattern) on the substrate are represented, except the offset errors, by four parameters related to the chip pattern, that is, the chip rotation e, the rectangular degree error of the chip pattern: $w$, the X and Y directional scaling error of the chip pattern: $rx$, $ry$. Accordingly, when using the model equation including the six parameters ($\Theta$, $W$, $R_x$, $R_y$, $O_X$, $O_Y$) related to the arrangement of the chip pattern (specific points) and four parameters ($\theta$, $w$, $rx$, $ry$) related to the chip pattern, at least ten coordinate positions need to be obtained. In short, prior to performing the statistical calculation, it is necessary to obtain the coordinate positions of equal to or more than a total number of the parameters related to the arrangement of the chip pattern (specific points) and the parameters related to the chip pattern all to be included in the model equation. When using the model equation including the ten parameters ($\Theta$, $W$, $R_x$, $R_y$, $O_x$, $O_y$, $\theta$, $w$, $rx$, $ry$), it is desirable to provide four two-dimensional marks for alignment on each of the processing areas on the wafer. At this time, it is desirable to provide the four two-dimensional marks on the respective four corners in each of the processing areas.

Besides, among the four parameters related to the chip pattern, the rectangular degree error $w$ of the chip pattern may be neglected. Also, the X and Y directional scalings $rx$, $ry$ may be deemed to be $rx=ry$ ($=M$). Then, when the rectangular degree error $w$ or the scaling errors $rx$, $ry$ are deemed to be $w=0$ or $rx=ry$, the number of the parameters related to the chip pattern becomes three. At this time, when the six parameters related to the arrangement of the chip pattern (specific points) are used, a total number of the parameters to be included in the model equation becomes nine, so that it is sufficient to obtain at least nine coordinate positions. Also, when the rectangular degree error $w$ and the scaling errors $rx$, $ry$ are set to be $w=0$ and $rx=ry$, the number of the parameters related to the chip pattern becomes two. At this time, it is sufficient to provide at least one two-dimensional mark and one one-dimensional mark on each of the processing areas on the wafer. Further, when all the six parameters related to the arrangement of the chip pattern (specific points) are used, a total number of parameters to be included in the model equation becomes eight, so that it is sufficient to obtain at least eight coordinate positions. At this time, it is sufficient to measure the respective coordinate positions of at least four two-dimensional marks, but the coordinate positions of a few of one-dimensional marks and the coordinate positions of a few of two-dimensional marks may be measured instead. Furthermore, the two-dimensional mark may be a combination of two one-dimensional marks.

When performing alignment of the m-th (integer: $2 \leq m \leq n$) substrate among n (integer: $n \geq 2$) substrates, in accordance with differences between the measured coordinate positions of the marks of the several processing areas of at least one specified substrate among the first to $(m-1)$th substrates and coordinate positions thereof calculated according to the calculated error parameters A, B and O, among the plurality of marks formed on the processing areas on the m-th substrate, the number of marks to be used for measuring the coordinate positions is increased or decreased with respect to the number of marks measured on the several processing areas on the specified substrate. When among the marks measured on the several processing areas on the specified substrate, there is a mark in which the deviation of the difference between the measured coordinate position and the calculated coordinate position is larger than a predetermined value, the mark with the large deviation may be excluded from the marks to be measured on the m-th substrate.

Namely, in the present invention, as the plurality of marks for alignment are provided on each of the shot areas on the substrate, the number of marks to be measured among the plurality of marks is optimized to improve the alignment accuracy and the throughput. Therefore, for only the first substrate in a lot or several substrates, the positions and the number of processing areas to be used for measuring coordinate positions, and the number (and positions) of marks for alignment to be measured on those processing areas are preset. Further, from the actual measurement result, the deviations of the differences (nonlinear error amounts) between the coordinate positions of the alignment marks and the calculated coordinate positions thereof are obtained. When performing alignment of the m-th (m≧2) substrate in the lot, it is sufficient to obtain the deviations of the linear error amounts with respect to at least one substrate among first to (m−1)th substrates. And, marks in which the deviation of the nonlinear error amount is larger than the predetermined value are excluded when performing measurement for the following substrate, whereby the number of alignment marks to be measured is decreased. When there are too many marks in which the deviation of the nonlinear error amount is larger than the predetermined value, new marks to be measured are set. That is, the number of processing areas to be used for measuring coordinate positions is increased and/or the number of alignment marks to be measured per processing area is increased.

Therefore, even though the plurality of marks for alignment are provided on each of the shot areas on the wafer, the number of marks for alignment to be measured can be optimized in accordance with the variations of the measurement result of the marks. Accordingly, while maintaining alignment accuracy on a high level, the reduction of the throughput can be minimized. Also, in several shot areas, the marks for alignment belonging to each of the several shot areas are measured, that is, position measurement by the use of the same shape marks is repeated a plurality of times, so that mechanical or electrical random errors of a detecting system can be reduced. Further, when marks in which the deviation of the difference between the calculated coordinate position and the measured coordinate position is larger than the predetermined value are excluded from marks to be measured on the following substrate, it is possible to perform alignment more accurately and speedily, excluding the marks by which measurement repeatability is bad.

Further, in the static coordinate system XY for prescribing the moved position of the substrate, coordinate positions of the images of a plurality of specific marks formed on a mask having a pattern to be transferred onto the substrate, which are given the projection coordinate system, are detected, and are statistically computed in order to calculate parameters for a model equation representing an arrangement of the images of the plurality of specific marks on the static coordinate system XY. The mask and the substrate are positionally aligned together with the use of these parameters, and thereafter, the image of the pattern on the mask is transferred onto the substrate.

In particular, in the case of calculating parameters for a model equation exhibiting the regularity of the arrangement of a plurality of areas on the substrate with the use of the above-mentioned statistical computation, the coordinate positions, in the static coordinate system, of a plurality of areas to be processed are preferably determined with the additional use of parameters which are obtained by statistical computation of the projected positions of the specific marks on the mask. It is noted that any one of equation (1), and equations (10), (17) can be used as the model equation exhibiting the regularity of the arrangement of the plurality of areas to be processed on the mask. Before the pattern on the mask is transferred onto an area to be processed on the substrate, at least either one of relative errors in rotation and shape between the image of the pattern on the mask and the area to be processed on the substrate can be compensated for with the use of the above-mentioned two parameters.

Further, the model equation which exhibits, in the static coordinate system XY prescribing the moved position of the substrate, the arrangement of the projected images of the plurality of specific marks on the mask, that is, the equation for transforming coordinate positions on a coordinate system (ξR, ηR) prescribed on the mask into coordinate positions in the static coordinate system XY, can be expressed by using six parameters (transformation matrices A, O), similar to equation (1). These six parameters includes an error in the rotation of the mask, errors in the magnifications of the projected image of the mask pattern in the directions X, Y (linear expansion and retraction), an error in the orthogonal degree of the mask coordinate systems (ξR, ηR), and offsets of the mask in the directions X, Y. Accordingly, the model equation, that is, the six parameters are determined with the use of a statistical technique (such as the least square process), and the thus determined parameters are used to compensate the position of the mask or the substrate in order to enhance the accuracy of alignment between the mask and the substrate.

Further, at least either one of an error in the relative rotation between the mask and the substrate and an error in the projecting magnification of the projection system is compensated for. Accordingly, the magnification of a pattern image on a first layer mask can be precisely set to a predetermined value (for example, ⅕), and an error in the rotation of the chip pattern formed on the substrate can be set substantially to zero. A rotation on a layer subsequent to the second layer, an error in relative rotation between the pattern image thereof and an area to be processed on the substrate, and an error in magnification can be set substantially to zero.

Further, in the case of calculating the parameters of the model equation exhibiting the regularity of the arrangement of a plurality of areas to be processed on the substrate with the use of a statistical technique, an error in the rotation of the substrate (and also a chip pattern), an error in magnification and the like can be compensated for. Accordingly, with the use of the above-mentioned six patterns, an error in the relative rotation between the pattern image of the mask and the area to be processed on the substrate and an error in magnification are compensated for, so as to precisely align the pattern image with the area to be processed over their entire surfaces.

According to the present invention, prior to alignment in each of a plurality of shot areas on any of the k-th (k is an integer of 2 or more) and the subsequent substrates with a reference position thereof in accordance with a coordinate position which has been calculated by a statistical; computation, one-dimensional or two-dimensional position measurement is performed at a plurality of points in a shot area by the use of two alignment sensors for at least one of the first to the (k-1)th substrates, and differences in a result of the statistical computation of a coordinate position measured by the two alignment sensors and a result of the statistical computation in the shot area of the coordinate position measured by the two alignment sensors are stored. When alignment on any of the k-th and subsequent substrates is performed, one-dimensional or two-dimensional position measurement is performed at one point in the shot area only by one of these two alignment sensors, and a result which is obtained from the statistical computation of these results of measurement is corrected by using the already-stored difference in the result of the statistical computation of the coordinate position measured by the respective alignment sensors and the already-stored result of the statistical computation within the shot area of the coordinate position measured by the respective alignment sensors, thereby performing the alignment based on a result of this correction.

In this case, when the alignment on any of the k-th and subsequent substrates is performed, one-dimensional or two-dimensional position measurement may be performed at one point in the shot area by the use of only one of the two alignment sensors, and a one-dimensional coordinate position at another point in the shot area to a predetermined direction may be measured by any of the alignment sensors. Then, the result of measurement at said one point in said shot area, and the result obtained by statistically computing the result of measurement at the other point may be corrected by using the already-stored difference in the statistical computation of the coordinate position measured by the two alignment sensors and the result of the statistical computation in said shot area of the coordinate position measured by the two alignment sensors, respectively. Then, alignment may be performed based on a result of this compensation.

According to the present invention having such structure, with respect to the first substrate in one lot which comprises N substrates or first several (to the k-th) substrates, two types of alignment sensors (e.g., an LIA type sensor of the TTL system and an FIA type sensor of the off-axis system) are used to measure a one-dimensional or two-dimensional position of a wafer mark at a plurality of measuring points, respectively, in the same sample shot. Then, alignment of the method of statistically processing a result of this measurement is performed. Then, differences between the sensors of each parameter value for performing, a statistical processing which is obtained for the two alignment sensors are calculated and stored.

When any of the subsequent wafers is exposed, only an alignment sensor, for example, of the LIA type, or the like, of the TTL system capable of a high throughput is used to perform the alignment disclosed in U.S. Pat. No. 4,780,617, and the parameters (e.g., a scaling) which may generate predetermined deviations by the LIA system, or the like, are corrected by the difference with those by, for example, the FIA system which is already stored. With respect to an in-shot parameter such as a magnification of a chip pattern (shot magnification), an alignment sensor which is the most suitable for processing said substrate (e.g., an FIA sensor for the shot magnification, and an LIA sensor for the shot rotation) is used for the measurement, and the already stored parameters are used to effect exposure. Thus, it is possible to enhance an alignment accuracy and a superposition accuracy in a shot area, while maintaining a high throughput.

With respect to any substrate subsequent, for example, to the k-th substrate, alignment is conducted by the method disclosed in U.S. Pat. No. 4,780,617 by using basically only an alignment sensor of the LIA system of the TTL method, for example, which renders a high through-put. Components which are easily changed for each wafer out of the parameters in a shot area (a shot magnification, shot rotation, or the like) are determined on the basis of a result which is obtained by actually performing measurement at a few points by using an alignment sensor most suitable out of the two alignment sensors. As a result, a superposition accuracy between shot areas can be further enhanced without lowering the through-put much.

Now, will be described a first preferred embodiment of the present invention with reference to FIG. 1. In this embodiment, the present invention is applied to a projection exposure apparatus (stepper) for transferring a pattern of a reticle on each shot area of a sensitive substrate (wafer) by a step and repeat method. FIG. 1 is a flowchart illustrating an example of an exposure sequence of this embodiment and FIG. 2 is a schematic diagram of a projection exposure apparatus to be used in this embodiment.

Figure 2:
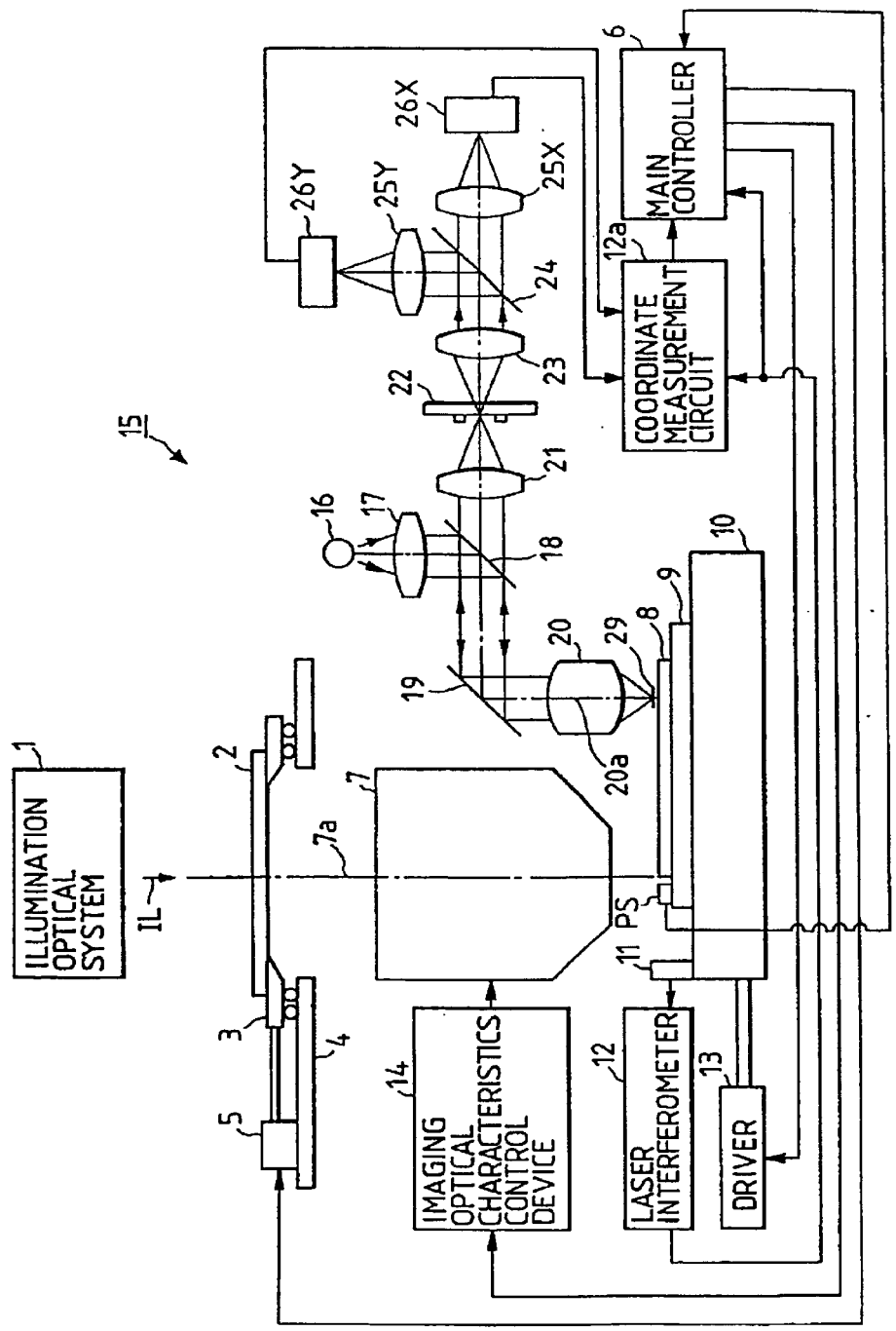
FIG. 2 is a schematic diagram of a projection exposure apparatus of the present invention.

In FIG. 2, exposure light IL emitted from an illumination optical system 1 illuminates a reticle 2 with approximately uniform luminous intensity. As is not illustrated, the illumination optical system 1 has an exposure light source, a fly eye lens, an aperture opening (a aperture), a reticle blind, a condenser lens or the like and the exposure light IL is a higher harmonic wave such as g-ray, i-ray, KrF or ArF excimer laser or YAG laser. Especially, in the case of the excimer laser, the inclination angle of the etalon for selection of wavelengths is adjusted while in the case of YAG laser, the wavelength of the laser emitted from a wavelength variable laser constituting a higher harmonic generator is changed, thereby enabling the wavelength of the exposure light IL to be changed. Thus, the imaging optical characteristics (e.g., projection magnification) of a projection optical system 7 can be finely regulated.

A reticle 2 is supported on a reticle stage 3, which can be two-dimensionally shifted and slightly rotated on a base plate 4 by a driver 5. Also, the reticle 2 can be shifted parallely in the direction of the optical axis of the projection optical system 7 on the reticle stage 3 and inclined with respect to the plane perpendicular to the optical axis by a plurality of piezo-electric elements, as disclosed in U.S. Pat. No. 5,117,255. Accordingly, it is possible to finely regulate the imaging optical characteristics such as distortion. The movement of the reticle stage 3 is controlled via the driver 5 by a main controller 6 for controlling the entire operations of the apparatus.

The exposure light IL passing through the reticle 2 enters the projection optical system 7 and projects the image of the pattern of the reticle on a wafer 8 by reducing the pattern of the reticle 2 in the ratio of 1 to 5. In this embodiment, the projection optical system 7 is constituted of a plurality of refractive elements (lens elements) and at least one lens element close to the reticle 2 is held slightly movably by a lens barrel. The wafer 8 is supported by a slightly rotatable wafer holder 9, which is disposed on a wafer stage 10. As disclosed in U.S. Pat. No. 4,770,531, the wafer stage 10 has an XY stage for moving two-dimensionally in a plane (XY plane) perpendicular to the optical axis of the projection optical system 7, a Z stage provided on the XY stage for moving in a direction (Z direction) parallel to the optical axis and a leveling stage provided on the Z stage for inclining the wafer holder 9 with respect to the XY plane.

A photoelectric sensor PS is provided on the wafer holder 9 (or the topmost stage of the wafer stage 10). The photoelectric sensor PS is composed of a slit plate formed with an opening having a shape and dimensions substantially identical with those of a bright part of the projected image of an alignment mark on the reticle 2, and a photoelectric detector below the slit plate and adjacent to the latter, for receiving light transmitted through the slit. Further, the outer surface of the slit plate is set at a height substantially equal to that of the exposed surface (for example the outer surface) of the wafer 8. The photoelectric sensor PS delivers an output signal to the main control system. In this embodiment, by driving the wafer stage 10 so as to move the photoelectric sensor PS in a plane perpendicular to the optical axis 7a of the projection optical system 7, the positions of projected images of a plurality of alignment marks on the reticle 2 are measured. An example of the structure of the photoelectric sensor PS is disclosed in U.S. Pat. No. 4,629,313, and accordingly, detailed expression thereof is omitted.

A movable mirror 11 is secured to an end portion of the wafer stage 10 and laser interferometers 12 are disposed so as to face the movable mirror 11, as illustrated simply in FIG. 2, in a rectangular coordinate system in a plane perpendicular to the optical axis of the projection optical system that has a X-coordinate and a Y-coordinate. The movable mirror 11 is constituted of a plane mirror having a reflecting surface perpendicular to the X-coordinate and a plane mirror having a reflecting surface perpendicular to the Y-coordinate. The laser interferometers 12 are constructed of two sets of laser interferometers for the X-coordinate for emitting laser beams to the movable mirror 11 along the X-coordinate and a set of laser interferometers for the Y-coordinate for emitting laser beams to the movable mirror 11 along the Y-coordinate axis. The coordinate positions of the wafer stage 10 in the X and Y coordinate direction are regularly measured by a set of the laser interferometer for the X-coordinate and the interferometer for the Y-coordinate. Thus defined rectangular coordinate system {X, Y} will be hereinafter referred to as the stage coordinate system or the static coordinate system. The rotation amount (rotation angle) of the wafer stage 10 is measured by the differences of measured values of the two sets of laser interferometers for the X-coordinate. The information of the X and Y-coordinate values on static coordinate system XY and the rotation angle measured by the interferometers 12 are supplied to a coordinate measurement circuit 12a and the main controller 6. The main controller 6 controls the positioning operation of the wafer stage 10 via a driver 13 while monitoring the information. As not illustrated in FIG. 2, an interferometer system identical to those provided on the side of the wafer is provided on the side of the reticle.

Further, there is provided an imaging optical characteristics control device 14 for adjusting the imaging optical characteristics (e.g., projection magnification, curvature of field, distortion or the like), as described in, e.g., U.S. Pat. No. 5,117,255. The imaging optical characteristics control device 14 moves, e.g., independently three sets of lens elements close to the reticle 2 among the plurality of lens elements constituting the projection optical system 7, thereby adjusting the projection magnification and the distortion. The imaging optical characteristics may be adjusted by sealing a space between two lens elements and changing its internal pressure, as disclosed in, e.g., U.S. Pat. Nos. 4,871,237 and 4,666,237. Further, both the above lens moving method and the internal pressure changing method may be used in the imaging optical characteristics control device 14. As described above, it is possible to adjust the imaging optical characteristics of the projection optical system 7 by providing the imaging optical characteristics control device 14, shifting the wavelength of the exposure light IL or moving the reticle 2 in this embodiment.

An off-axis type alignment system 15 is disposed on a side of the projection optical system 7. A light source 16 emits light having a wavelength band so as not to expose the photoresist. The light emitted from the light source 16 is incident on an area including an alignment mark 29 on the wafer 8 via a collimator lens 17, a beam splitter 18, a mirror 19 and an object lens 20. In the off-axis system, there is preliminarily measured a base line amount corresponding to the distance between an optical axis 20a of the object lens 20 and the optical axis 7a of the projection optical system 7. The reflected light from the alignment mark 29 reaches an index plate 22 via the object lens 20, the mirror 19, the beam splitter 18 and a condensing lens 21. An image of the alignment mark 29 is formed on the index plate 22. The light passing through the index plate 22 is incident on a beam splitter 24 via a first relay lens 23. The light passing through the beam splitter 24 is focused on the pick-up surface of an image pick-up device (e.g., a two-dimensional CCD) 26X by a second relay lens 25X for the X-coordinate while the reflected light by the beam splitter 24 is focused on the pick-up of an image pick-up device (e.g., a two-dimensional CCD) 26Y by a second relay lens 25Y for the Y-coordinate. Then, the image of the alignment mark 29 and the images of index marks of the index plate 22 are formed on the respective pick-up surfaces of the image pick-up devices 26X and 26Y. Respective image signals from the image pick-up devices 26X and 26Y are supplied to the coordinate measurement circuit 12a.

FIG. 3 illustrates a pattern on the index plate 22. A cross-shaped image 29P of the alignment mark 29 is formed on the middle portion thereof. The XP and XY directions perpendicular to respective linear pattern images 29YP and 29YP of the image 29P correspond to the X and Y directions of the stage coordinate system of the wafer stage 10 in FIG. 2. The linear pattern images 29XP and 29YP intersect at right angles. Two index marks 31A and 31B are formed so as to sandwich the alignment mark image 29P with respect to the XP direction while two index marks 32A and 32B are formed so as to sandwich the alignment mark image 29P with respect to the YP direction.

The index marks 31A, 31B and the linear pattern image 29XP arranged in the XP direction in a detection area 33X are picked up by the image pick-up device 26X of FIG. 2 while the index marks 32A, 32B and the linear pattern image 29 YP arranged in the YP direction in a detection area 33 are picked up by the image pick-up device 26Y of FIG. 2. Further, the scanning directions for reading photoelectric conversion signals from pixels of the image pick-up devices 26X and 26Y are set to be the XP and YP directions respectively. By processing the image signals from the image pick-up devices 26X and 26Y, it is possible to obtain the positional deviations of the alignment mark image 29P in the XP and YP directions thanks to the index marks 31A, 31B and the index marks 32A, 32B. Accordingly, the coordinate measurement circuit 12a obtains the coordinate position of the alignment mark 29 on the stage coordinate system (X, Y) by the positional deviations between the image of the alignment-mark 29 on the wafer 8 and the index marks of the index plate 22 and the measurement result of the laser interferometers 12. Thus obtained coordinate value is sent to the main controller 6.

Next, will be described operations for performing alignment between the pattern image of the reticle 2 and each shot area on the wafer 8 and performing exposure on each shot area.

Figure 4A:
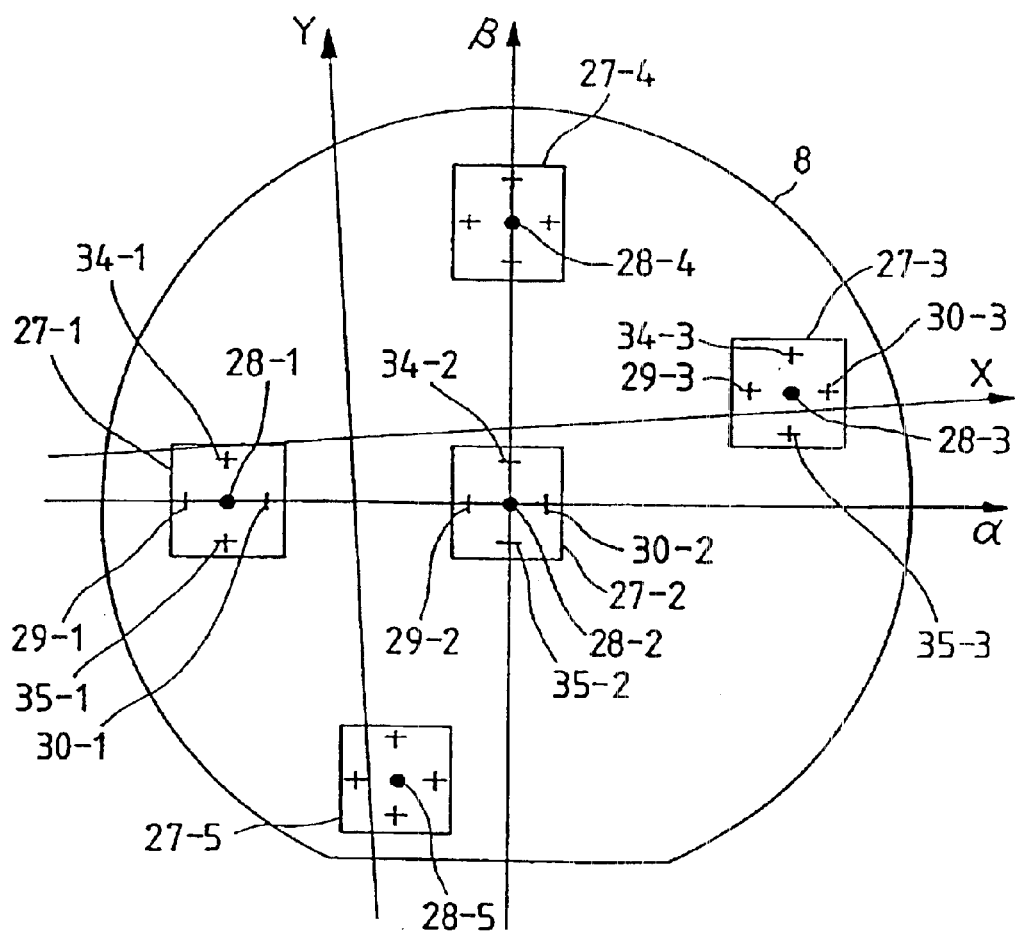
FIG. 4A is a diagram illustrating an example of the arrangement of shot areas on a wafer.

In FIG. 4A illustrating the wafer 8, a plurality of shot areas 27-n (n=0, 1, 2, . . . ) are arranged along an arrangement coordinate system (α, β) on the wafer 8 in a matrix-like form. The shot area 27-n is formed with a chip pattern having been formed under the previous exposure and development processes. In FIG. 4A, only five shot areas 27-1 to 27-5 are represented among the plurality of shot areas.

Figure 4B:
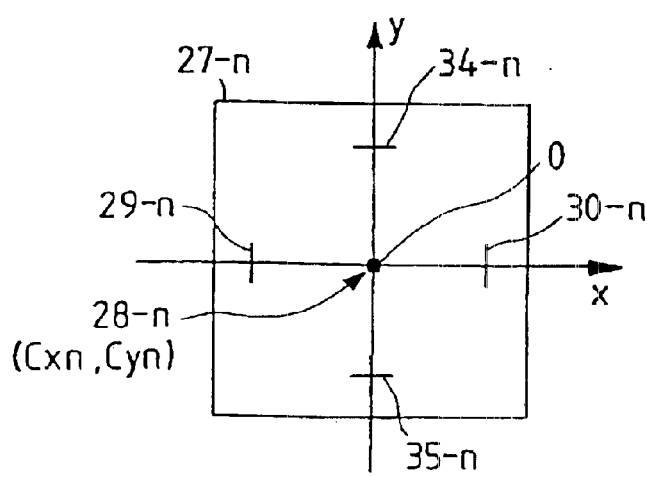
FIG. 4B is an enlarged diagram of a shot area of FIG. 4A.

A reference position (specific point) is defined in the shot area 27-n. For example, if it is assumed that the reference position is a reference point 28-n in the center of the shot area 27-n, the coordinate value upon the design of the reference point 28-n in the coordinate system (α, β) on the wafer 8 is expressed by ($C_{Xn}$, $C_{Yn}$). Also, the shot area 27-n is provided additionally with four marks for alignment 29-n, 30-n, 34-n and 35-n. In this case, when a coordinate system (x, y) for each shot area is defined on the shot area 27-n as illustrated in FIG. 4B, the coordinate values on the design of the alignment marks 29-n, 30-n, 34-n and 35-n on the coordinate system (x, y) are represented by ($S_{1Xn}$, $S_{1Yn}$), ($S_{2Xn}$, $S_{2Yn}$), ($S_{3Xn}$, $S_{3Yn}$) and ($S_{4Xn}$, $S_{4Yn}$), Returning to FIG. 4A, the wafer 8 is disposed on the wafer stage 10 of FIG. 2 and the image of the reticle is exposed successively on each of the plurality of shot areas with the chip patterns having been formed previously by the step and repeat method. At this time, the relationship between the stage coordinate system (X, Y) for regulating the movement of the wafer stage and the coordinate system ($\alpha$, $\beta$) of the wafer does not necessarily correspond to that in the previous process. Therefore, even though the coordinate value of the reference point 28-$n$ on the stage coordinate system (X, Y) is obtained from the coordinate value upon the design ($C_{Xn}$, $C_{Yn}$) of the reference point 28-$n$ of the shot area 27-$n$ on the coordinate system ($\alpha$, $\beta$) and the wafer is shifted on the basis of the obtained coordinate values, each shot area 27-$n$ might not be positioned accurately. Then, in this embodiment, there is assumed that the alignment error occurs due to the following four factors the same as conventional.

[1] Rotation of the Wafer: This is expressed by the residual rotation error $\Theta$ of the coordinate system ($\alpha$, $\beta$) of the wafer with respect to the stage coordinate system (X, Y).

[2] Rectangular Degree of the Stage Coordinate system (X, Y): This is caused by the reason that the advancement of the wafer stage 10 in the X and Y directions is not performed rectangularly and expressed by the rectangular degree error W.

[3] Linear Expansion or Contraction (Wafer Scaling) of the Wafer in the $\alpha$ and $\beta$ Directions in the Coordinate System ($\alpha$, $\beta$): This occurs during processing of the wafer 8. The amount of expansion or contraction is expressed by a wafer scaling Rx in the $\alpha$ direction or a wafer scaling Ry in the $\beta$ direction. The wafer scaling Rx is a ratio of the actually measured value of the distance between two points on the wafer 8 in the a direction to the designed value thereof while the wafer scaling Ry is a ratio of the actually measured value of the distance between two points on the wafer 8 in the $\beta$ direction to the designed value thereof.

[4] Offset of the Wafer Coordinate System ($\alpha$, $\beta$) with Respect to the Stage Coordinate System (X, Y):
This is caused by the reason that the entire wafer 8 is slightly displaced with respect to the wafer stage 10 and expressed by the offset amounts $O_X$ and $O_Y$. When the above error factors [1] to [4] are added, the shot area 27-$n$ with the reference point 28-$n$ of the coordinate value upon design ($C_{Xn}$, $C_{Yn}$) needs to be positioned for an exposure on the basis of the coordinate value ($C'_{Xn}$, $C'_{Yn}$) on the stage coordinate system (X, Y). The coordinate value ($C'_{Xn}$, $C'_{Yn}$) is obtained by the following equation:

$$\begin{bmatrix} C'_{Xn} \\ C'_{Yn} \end{bmatrix} = \begin{bmatrix} Rx & 0 \\ 0 & Ry \end{bmatrix} \begin{bmatrix} \cos\theta & -\sin\theta \\ \sin\theta & \cos\theta \end{bmatrix} \begin{bmatrix} 1 & -\tan W \\ 0 & 1 \end{bmatrix} \begin{bmatrix} C_{Xn} \\ C_{Yn} \end{bmatrix} + \begin{bmatrix} O_X \\ O_Y \end{bmatrix} \quad (2)$$

When the rectangular degree error W and the residual rotation error $\theta$ are deemed to be extremely small amounts, the equation (2) is approximated to the following equation:

$$\begin{bmatrix} C'_{Xn} \\ C'_{Yn} \end{bmatrix} = \begin{bmatrix} Rx & -Rx \cdot (W+\theta) \\ Ry \cdot \theta & Ry \end{bmatrix} \begin{bmatrix} C_{Xn} \\ C_{Yn} \end{bmatrix} + \begin{bmatrix} O_X \\ O_Y \end{bmatrix} \quad (3)$$

It has been so far described to position the reference position of each shot area 27-$n$ (reference point in the center of each shot area) accurately. However, even though the reference points of the shot areas are positioned accurately, the projected image of the reticle is not necessarily superposed on the entire chip pattern of each shot area precisely.

Next, the alignment errors in the respective shot areas will be described. As described above, in FIG. 4B, the alignment marks 29-$n$. 30-$n$, 34-$n$ and 35-$n$ are formed on the coordinate values upon the design ($S_{1Xn}$, $S_{1Yn}$) to ($S_{4Xn}$, $S_{4Yn}$) on the coordinate system (x; y) on the shot area 27-$n$. In this embodiment, it is assumed that the alignment errors in the respective shot areas are induced by the following factors.

[5] Rotation of a Chip Pattern (Chip Rotation):
This is caused by the reason that, e.g., when exposing the image of the reticle 2 on the wafer 8, the reticle 2 is rotated with respect to the stage coordinate system (X, Y) or yawing is included in the movement of the wafer stage 10, and expressed by the rotation error $\theta$ with respect to the coordinate system (x, y) of each shot area.

[6] Rectangular Degree Error of a Chip:
This is caused due to the distortion of the pattern itself on the reticle 2 or the distortion of the projection optical system 7, e.g., at the time of exposing the image of the reticle 2 on the wafer 8 and expressed by the angle error w.

[7] Linear Expansion or Contraction of a Chip (Chip Scaling): This is due to the projection magnification error at the time of exposing the image of the reticle 2 on the wafer 8 or the whole or partial expansion or contraction of the wafer 8 during processing and expressed by the chip scaling rx in the x direction and the chip scaling xy in the y direction. The chip scaling rx is a ratio of the actually measured value of the distance between two points in the x direction on the coordinate system (x, y) on each shot area to the designed value thereof, while the chip scaling ry is a ratio of the actual measured value of the distance between two points in the y direction to the designed value.

Figure 5A:
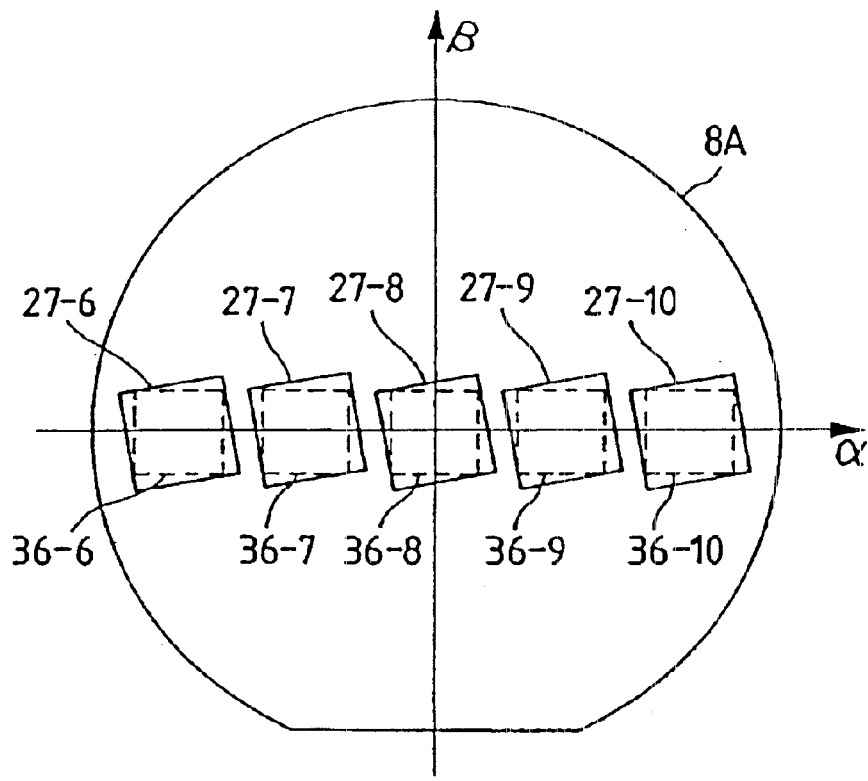
FIG. 5A is a diagram illustrating an example of a wafer with chip patterns having rotation and magnification errors.
Figure 5B:
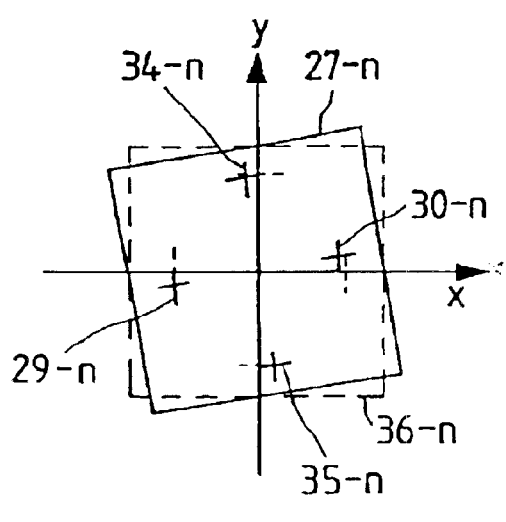
FIG. 5B is an explanatory diagram illustrating the condition of the chip rotation.
Figure 5C:
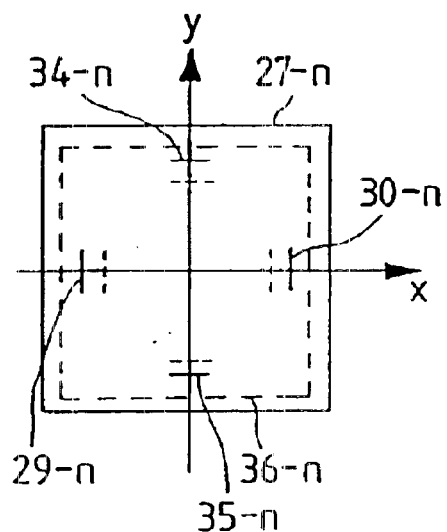
FIG. 5C is an explanatory diagram illustrating the condition of the magnification error of a chip pattern.

FIG. 5A illustrates the wafer 8A having the chip pattern of the shot area 27-$n$ formed in the previous process, wherein the rotation and magnification errors occur in the chip patterns. In FIG. 5A, shot areas 36-6 to 36-10 as indicated by broken lines are an example of shot areas where no rotation or magnification error occurs. On the other hand, the rotation angle and the magnification in the shot areas 27-6 to 27-10 on the wafer 8A are different from those in the shot areas 36-6 to 36-10. These errors can be separated into the chip rotation error as illustrated in FIG. 5B and the chip scaling error as illustrated in FIG. 5C. In the case of the chip rotation error, the shot area 27-$n$ is inclined relative to the shot area 36-$n$ while in the case of the chip scaling error, the magnification in the shot area 27-$n$ is different from that in the shot area 36-$n$.

However, it is to be noted that in FIGS. 5A to 5C, there is no rectangular degree error w of the chip patterns and the chip scaling in the x direction is equal to the chip scaling in the y direction.

When the above error factors [5] to [7] are added, the alignment marks 29-$n$. 30-$n$, 34-$n$. 35-$n$ with the coordinate values upon design ($S_{NXn}$, $S_{NYn}$)(n=n) need to be aligned actually on the basis of the coordinate value ($S'_{NXn}$, $S'_{NYn}$) on the coordinate system (x, y). The coordinate value ($S'_{NXn}$, $S'_{NYn}$) is obtained by the following equation:

$$\begin{bmatrix} S'_{NXn} \\ S'_{NXn} \end{bmatrix} = \begin{bmatrix} rx & 0 \\ 0 & ry \end{bmatrix} \begin{bmatrix} \cos\theta & -\sin\theta \\ \sin\theta & \cos\theta \end{bmatrix} \begin{bmatrix} 1 & -\tan W \\ 0 & 1 \end{bmatrix} \begin{bmatrix} S_{NX_n} \\ S_{NY_n} \end{bmatrix} \quad (4)$$

When the rectangular degree error w and the rotation error $\theta$ are deemed to be extremely small, the equation (4) is approximated to the following equation:

$$\begin{bmatrix} S'_{NXn} \\ S'_{NYn} \end{bmatrix} = \begin{bmatrix} rx & -rx \cdot (W+\theta) \\ ry \cdot \theta & ry \end{bmatrix} \begin{bmatrix} S_{NXn} \\ S_{NYn} \end{bmatrix} \quad (5)$$

Referring to FIG. 4B, the arrangement value of the reference point 28-$n$ of the shot area 27-$n$ on the stage coordinate system (X, Y) is ($C_{Xn}$, $C_{Yn}$), so that the coordinate value upon the design ($D_{NXn}$, $D_{NYn}$) of a certain alignment mark (29-n or 30-n) on a certain shot area 27-n on the stage coordinate system (X, Y) is obtained from the following equation. It is to be noted that the alignment marks 29-n to 35-n are discriminated by the value N (1 to 4).

$$\begin{bmatrix} D_{NXn} \\ D_{NYn} \end{bmatrix} = \begin{bmatrix} C_{Xn} \\ C_{Yn} \end{bmatrix} + \begin{bmatrix} S_{NXn} \\ S_{NYn} \end{bmatrix} \quad (6)$$

Three errors [5] to [7] occur when a chip pattern is printed on the layer of the wafer 8 which has the printed alignment marks on the respective shot areas. Further, the errors [2] and [3] caused by the processing of the wafer 8 need to be taken into consideration additionally. Therefore, when the coordinate value on the stage coordinate system (X, Y) where the alignment marks 29-n, 30-n, 34-n, 35-n, need to be actually positioned is ($F_{NXn}$, $F_{NYn}$)(N=1 to 4), the coordinate value ($F_{NXn}$, $F_{NYn}$) is expressed from the equations (3) and (5) by the following equation:

$$\begin{bmatrix} F_{NXn} \\ F_{NYn} \end{bmatrix} = \begin{bmatrix} C'_{Xn} \\ C'_{Yn} \end{bmatrix} + \begin{bmatrix} S'_{NXn} \\ S'_{NYn} \end{bmatrix} \quad (7)$$

$$= \begin{bmatrix} Rx & -Rx \cdot (W+\theta) \\ Ry \cdot \Theta & Ry \end{bmatrix} \begin{bmatrix} C_{Xn} \\ C_{Yn} \end{bmatrix} + \begin{bmatrix} O_X \\ O_Y \end{bmatrix} +$$

$$\begin{bmatrix} rx & -rx \cdot (w+\theta) \\ ry \cdot \Theta & ry \end{bmatrix} \begin{bmatrix} S_{NXn} \\ S_{NYn} \end{bmatrix}$$

Next, in order to facilitate the application of the least squares method in this embodiment, the wafer scaling Rx in the α direction and the wafer scaling Ry in the β direction in the equation (7) are expressed by utilizing respective new parameters Γx and Γy as the following equation (8). Similarly, the chip scaling rx in the x direction and the chip scaling ry in the y direction in the equation (7) are expressed by utilizing respective new parameters γx and γy.

$$R_x = 1 + \Gamma x, \; R_y = 1 + \Gamma y,$$

$$rx = 1 + \gamma x, \; ry = 1 + \gamma y \quad (8)$$

When the equation (7) is renewed by utilizing these new four parameters Γx, Γy, γx and γy expressing new amounts of linear expansion or contraction, the equation (7) is approximated to the following equation:

$$\begin{bmatrix} F_{NXn} \\ F_{NYn} \end{bmatrix} = \begin{bmatrix} 1+\Gamma x & -(W+\theta) \\ \theta & 1+\Gamma y \end{bmatrix} \begin{bmatrix} C_{Xn} \\ C_{Yn} \end{bmatrix} + \quad (9)$$

$$\begin{bmatrix} 1+\gamma x & -(w+\theta) \\ \theta & 1+\gamma y \end{bmatrix} \begin{bmatrix} S_{NYn} \\ S_{NYn} \end{bmatrix} + \begin{bmatrix} O_X \\ O_Y \end{bmatrix}$$

In the equation (9), when the two-dimensional vector is deemed to be the matrix of 2 lines×1 row, the equation (9) is rewritten by the coordinate transformation equation for use with the following transformation matrices.

$$F_{Nn} = AC_n + BS_{Nn} + O \quad (10)$$

The respective transformation matrices in the equation (10) are defined as follows.

$$F = \begin{bmatrix} F_{NXn} \\ F_{NYn} \end{bmatrix}, \quad A = \begin{bmatrix} 1+\Gamma x & -(W+\theta) \\ \theta & 1+\Gamma y \end{bmatrix} \quad (11)$$

$$B = \begin{bmatrix} 1+\gamma x & -(w+\theta) \\ \theta & 1+\gamma y \end{bmatrix}, \quad O = \begin{bmatrix} O \\ O \end{bmatrix}$$

$$C_n = \begin{bmatrix} C_{Xn} \\ C_{Yn} \end{bmatrix}, \quad S_N = \begin{bmatrix} S_{NXn} \\ S_{NYn} \end{bmatrix}$$

That is, in the equation (10), the matrix $F_{Nn}$ of 2 lines×1 row is expressed by the sum of the matrix $AC_n$, the matrix $BS_{Nn}$ and the matrix O. The ten parameters (Θ, W, Γx(= Rx−1), Γy, $O_X$, $O_Y$, θ, w, Yx (=rx−1), γy) in the transformation matrices A, B and O in the coordinate transformation equation (10) can be, e.g., obtained by the least squares method. In this embodiment, the coordinate values upon calculation on the stage coordinate system (X, Y) for respective shot areas, the chip rotation error and the chip magnification error are determined on the basis of the coordinate transformation equation (10). Then, after the chip rotation error, the chip magnification error or the like are corrected, the alignment between each shot area on the wafer 8 and the reticle is performed. One does not necessarily need to apply the least squares method to the equation (10) and the ten error parameters may be obtained by the equation (7).

In this embodiment, as will be described later in detail, alignment marks are selected from preliminarily selected shot areas (sample shots) from all the shot areas on the wafer and the coordinate positions of the selected alignment marks on the stage coordinate system (X, Y) are measured. Then, the result of the measurement is utilized for the equation (10) and the ten parameters are obtained by the least squares method. Thereafter, the arrangement coordinate values of respective shot areas are calculated. Such a calculation wherein predetermined error parameters. (less than ten possible) are obtained from the result of measurement of preliminarily selected alignment marks (sample shots) is called the enhanced global alignment (hereinafter called "EGA") calculation. The method of performing alignment based on the calculation result is called the EGA method alignment.

Next, will be described an example of alignment and exposure operations based on the coordinate transformation equation (10) with reference to the flowchart in FIG. 1. First, in the step 101, the wafer 8 is disposed on the wafer holder 9 of FIG. 2. The chip patterns have been already formed on the respective shot areas under the previous process. Further, as illustrated in FIG. 4B, the four cross-shaped alignment marks 29-n, 30-n, 34-n and 35-n are formed in the shot area 27-n. Also, the alignment of the reticle 2 has been already completed and the deviations of the reticle 2 in the X, Y and rotation directions with respect to the rectangular coordinate defined by the interferometer (not illustrated) are approximately zero.

Next, in the step 102, the origin of the wafer 8 is set (prealignment). Then, in the step 103, the off-axis alignment system 15 is utilized to measure the coordinate values ($FM_{NXn}$, $FM_{NYn}$) of five or more alignment marks (29-n. 30-n, 34-n or 35-n) on the wafer on the stage coordinate system XY. One alignment mark has two elements in X and Y directions. Therefore, when the coordinate values of five or more alignment marks are measured, it is possible to determine values of ten or more parameters.

In this embodiment, although the alignment marks need to be selected from three or more shot areas 27-n, one does not necessarily need to select four alignment marks from one shot area 27-n and one alignment mark 429-n, 30-n, 34-n or 35-n) may be selected from one shot area 27-n.

In this case, the arrangement coordinate values upon the design ($C_{Xn}$, $C_{Yn}$) on the coordinate system ($\alpha$, $\beta$) on the wafer 8 for the reference points 28-$n$ of a plurality of shot areas 27-$n$ selected on the wafer 8 and the coordinate values (relative coordinate values) upon design ($S_{NXn}$, $S_{NYn}$) on the coordinate systems (x, y) on the respective shot areas 27-$n$ for the measured alignment marks are known in advance. Then, in the step 104, the arrangement coordinate values upon design ($C_{Xn}$, $C_{Yn}$) of the reference points of the shot areas having the measured alignment marks and the relative coordinate values upon design ($S_{NXn}$, $S_{NYn}$) of the measured alignment marks relative to the corresponding reference points are substituted for the right side of the equation (10) to obtain the coordinate values upon calculation ($F_{NXn}$, $F_{NYn}$) on the stage coordinate system (X, Y) wherein the alignment marks need to be positioned.

Thereafter, ten error parameters ($\Theta$, W, $\Gamma x$, $\Gamma y$, $O_X$, $O_Y$, $\theta$, w, $\gamma x$, $\gamma y$) satisfying the equation (10) are obtained by the least squares method. Concretely, the difference ($E_{NXn}$, $E_{NYn}$) between the actually measured coordinate value ($FM_{NXn}$, $FM_{NYn}$) and the coordinate value upon calculation ($F_{NXn}$, $F_{NYn}$) is deemed to be the alignment error. Therefore, $E_{NXn}=FM_{NXn}-F_{NXn}$ and $E_{NYn}=FM_{NYn}-F_{NYn}$ are concluded. And, five sets or more of alignment errors, that is, ten or more alignment errors are squared and added. The obtained value is then partially differentiated sequentially by the respective ten error parameters. Further, ten equations are formed such that the partially differentiated values each equal to zero. Thereafter, the simultaneous equation of the ten equations is solved to obtain the ten error parameters. These are the EGA calculation in this embodiment.

Next, in the step 105, the reticle 2 is rotated properly via the reticle stage 3 of FIG. 2 or the wafer 8 is properly rotated such that the rotation error $\theta$ of the chip pattern in the transformation matrix B is corrected, thereby the rotation of the chip pattern relative to the stage coordinate system (X, Y) is corrected. This means that the reticle 2 or the wafer 8 is rotated in accordance with the rotation error $\theta$ in the transformation matrix B in the equation.

However, when the wafer 8 is rotated, the offset errors ($O_X$, $O_Y$) of the wafer 8 might be changed. Therefore, after measuring the coordinate values of the alignment marks, the error parameters need to be again obtained by performing the conventional EGA calculation. Then, for example, when the wafer 8 is rotated at an angle $\theta$, the errors in the chip patterns are not taken into consideration at this time as conventional and the coordinate values of alignment marks of at least three shot areas on the wafer on the stage coordinate system XY are measured again. Based on the result of the measurement, six error parameters ($\Theta$, W, Rx, Ry, $O_X$, $O_Y$) are determined. Further, the arrangement coordinate values are determined by the determined error parameters and the respective shot areas are aligned for exposure based on the arrangement coordinate values.

Next, the rectangular degree error w of the chips cannot be corrected strictly speaking, but may be minimized by properly rotating the reticle 2 or the wafer 8. Therefore, it is possible to determine the rotation amount of the reticle 2 or the wafer 8 optimumly such that the sum total of the absolute values of the rotation error $\Theta$, the rotation error $\theta$ and the rectangular degree error w is minimized.

Thereafter, in the step 106, the projection magnification of the projection optical system 7 is adjusted via the imaging optical characteristics control device so as to correct the chip scaling error in the transformation matrix B in the equation (10). This means that the projection magnification of the projection optical system 7 is adjusted in accordance with the chip scalings rx and ry in the transformation matrix B.

Then, in the step 107, the transformation matrices A and O including the error parameters obtained in the step 104 are utilized as known from the following equation. And, the arrangement coordinate value upon the design ($C_{Xn}$, $C_{Yn}$) of the reference point 28-$n$ of each shot area 27-$n$ on the wafer 8 is substituted for the following equation to obtain the arrangement coordinate value ($G_{Xn}$, $G_{Yn}$) of the reference point 28-$n$ on the stage coordinate system (X, Y). However, as described above, when the wafer 8 is rotated to correct the rotation error in the step 105, the arrangement coordinate value upon calculation ($G_{Xn}$, $G_{Yn}$) is obtained on the basis of the remeasured coordinate values of the alignment marks.

$$\begin{bmatrix} G_{Xn} \\ G_{Yn} \end{bmatrix} = A \begin{bmatrix} C_{Xn} \\ C_{Yn} \end{bmatrix} + O \quad (12)$$

Thereafter, in the step 108, each reference point 28-$n$ of the shot area 27-$n$ on the wafer 8 is positioned in a respective one of predetermined position within the exposure field of the projection optical system 7 of FIG. 2 sequentially based on the obtained arrangement coordinate value ($G_{Xn}$, $G_{Yn}$) and the preliminarily obtained base line amount. Then, the pattern image of the reticle 2 is exposed on the predetermined shot area 27-$n$. After the entire shot areas on the wafer 8 have been exposed, the wafer 8 is subjected to the development process.

In this embodiment, not only the transformation matrices A, O but also the transformation matrix B consisting of the parameters such as the chip rotation, the rectangular degree error of the chips and the chip scalings is taken into consideration, so that the influence of the expansion or contraction or the rotation of the chip patterns of the respective shot areas is reduced to a small degree and then it is possible to superpose the projected image of the pattern of the reticle on each of the chip patterns of the shot areas on the wafer with high accuracy.

In the above embodiment, as illustrated in FIG., 4B, there are provided the cross-shaped alignment marks 29-$n$, 30-$n$, 34-$n$ and 35-$n$ by which positionings in the X and Y directions on the stage coordinate system can be performed simultaneously. Also, two alignment marks 29-$n$ and 30-$n$ are provided on the x-coordinate axis of the coordinate system of each shot area while two alignment marks 34-$n$ and 35-$n$ are provided on the y coordinate axis thereof. However, this does not necessarily need to be so, e.g., if four alignment marks are not arranged on one line. For example, the alignment marks may be arranged on four corners of each shot area. Also, each alignment mark may be formed on street line areas between each shot areas. Further, one-dimensional alignment marks for the X direction may be provided separately from one-dimensional alignment marks for the Y direction, if precautions are taken as to their arrangement.

However, if one-dimensional alignment marks (diffraction grating mark or the like) for detecting positions only in the X or Y direction are utilized instead of the cross-shaped alignment marks capable of specifying two-dimensional positions, the coordinate values of ten or more one-dimensional alignment marks need to be actually measured in order to determine the values of ten parameters.

In the above-described embodiment, in order to obtain the rotation error $\theta$ of the chip rotation, the rectangular degree error w of the chip and the chip scalings rx and ry, the four two-dimensional alignment marks 29-$n$. 30-$n$, 34-$n$ and 35-$n$ are provided on each shot area 27-$n$ on the wafer 8. However, although-each offset (x and y directions) of the reference point of the shot area 27-$n$ is taken into consideration, the number of parameters which need to be selected is six, so that only three two-dimensional alignment marks (e.g., 29-*n*, 30-*n* and 34-*n*) may be provided on each shot area 27-*n*. Thus, when utilizing two-dimensional alignment marks, always two alignment marks are selected. However, when utilizing one-dimensional alignment marks, six alignment marks need to be formed on each shot area 27-*n*.

Also, in the above embodiment, the rotation of the reticle (or wafer) and the magnification of the projection optical system are corrected by utilizing the four parameters (the chip rotation 0, the rectangular degree error w, the chip scaling rx, the chip scaling ry) related to the chip pattern. However, the rotation of the reticle (or wafer) and the magnification of the projection optical system do not necessarily need to be corrected and only the respective positions of the shot areas may be adjusted in accordance with the arrangement coordinate values obtained in the above embodiment. At this time, the correction of the magnification may not be performed by utilizing the parameters Rx and Ry (or rx and ry) of the scalings concerning, e.g., the wafer. Further, instead of obtaining the arrangement coordinate values of the shot areas from the equation (12), they may be obtained from the equation (7) or the equation (9).

Also, in the above embodiment, of all the four parameters (the chip rotation θ, the rectangular degree error w, the chip scaling rx (=1+γx), the chip scaling ry (=1+γy) concerning the chip pattern), only one of these may be paid attention to and the equation (7) (or the equation (9)) may be utilized. Concretely, when paying attention to the rotation error θ only, the rectangular degree error w and the chip scalings rx and ry are assumed to be 0 and 1 respectively and the equation (7) is utilized. When the chip scalings rx and ry are paid attention to, it is assumed that rx=ry, i.e., the linear expansion or contraction is uniform in the x and y directions and the equation (7) may be utilized. In short, kinds or the number of parameters to be selected from the four parameters should be determined in accordance with, e.g., kinds (characteristics) of wafers, the degree of transformation of chip patterns or the like.

Besides, when the rectangular degree error w is assumed to be 0 and the chip scalings are uniform in the X and Y directions (i.e., rx=ry=M) among four parameters (the chip rotation θ, the rectangular degree error w, the chip scaling rx, the chip scaling ry), the equation (7) is simplified as follows:

$$\begin{bmatrix} F_{NXn} \\ F_{NYn} \end{bmatrix} = \begin{bmatrix} Rx & -Rx \cdot (W+\theta) \\ Ry \cdot \theta & Ry \end{bmatrix} \begin{bmatrix} C_{Xn} \\ C_{Yn} \end{bmatrix} + \begin{bmatrix} O_X \\ O_Y \end{bmatrix} + \begin{bmatrix} M & -M \cdot \theta \\ M \cdot \theta & M \end{bmatrix} \begin{bmatrix} S_{NXn} \\ S_{NYn} \end{bmatrix} \quad (13)$$

When the directionally uniform chip scaling M is set to be (1+δM), the equation (8) is utilized and the slight amount is neglected. And the equation (13) is approximated to the following equation:

$$\begin{bmatrix} F_{NXn} \\ F_{NYn} \end{bmatrix} = \begin{bmatrix} 1+\Gamma x & -(W+\theta) \\ \theta & 1+\Gamma y \end{bmatrix} \begin{bmatrix} C_{Xn} \\ C_{Yn} \end{bmatrix} + \begin{bmatrix} O_X \\ O_Y \end{bmatrix} + \begin{bmatrix} 1+\delta M & -\theta \\ \theta & 1+\delta M \end{bmatrix} \begin{bmatrix} S_{NXn} \\ S_{NYn} \end{bmatrix} \quad (14)$$

In the equation (14), there are two parameters concerning the chip patterns, so that the offset is taken into consideration and it is sufficient to provide only two two-dimensional alignment marks 29-*n* and 30-*n* in FIG. 4B on each shot area 27-*n* on the wafer 8. Besides, there are eight parameters in all. Therefore, in order to determine the values of these error parameters by utilizing the least squares method in the equation (14), it is sufficient to measure at least four two-dimensional alignment marks.

Now, a second preferred embodiment of the present invention will be described. The difference from the first embodiment is only the structure of a model equation for calculating the arrangement coordinate value of each shot area (chip pattern) on the wafer.

Although the coordinate value ($F_{NXn}$, $F_{NYn}$) on the stage coordinate system (X, Y) of the alignment marks is expressed in the equation (7) in the first embodiment, in this embodiment, the coordinate value ($F_{NXn}$, $F_{NYn}$) is expressed from the equations (3) and (5), as follows:

$$\begin{bmatrix} F_{NXn} \\ F_{NYn} \end{bmatrix} = \begin{bmatrix} Rx & -Rx \cdot (W+\theta) \\ Ry \cdot \theta & Ry \end{bmatrix} \left\{ \begin{bmatrix} C_{Xn} \\ C_{Yn} \end{bmatrix} + \begin{bmatrix} S'_{NXn} \\ S'_{NYn} \end{bmatrix} \right\} + \begin{bmatrix} O_X \\ O_Y \end{bmatrix} \quad (15)$$

When the equation (15) is rewritten by utilizing the four parameters rx, rY as expressed in the equation (8), it becomes as follows:

$$\begin{bmatrix} F_{NXn} \\ F_{NYn} \end{bmatrix} = \begin{bmatrix} 1+\Gamma x & -(W+\theta) \\ \Theta & 1+\Gamma y \end{bmatrix} \begin{bmatrix} C_{Xn} \\ C_{Yn} \end{bmatrix} + \begin{bmatrix} 1+\gamma x & -(w+\theta) \\ \theta & 1+\gamma y \end{bmatrix} \begin{bmatrix} S_{NXn} \\ S_{NYn} \end{bmatrix} + \begin{bmatrix} O_X \\ O_Y \end{bmatrix} \quad (16)$$

When the two-dimensional vector is deemed to be the matrix of 2 lines×1 row, the equation (16) can be rewritten by the coordinate transformation equation having the following transformation matrices. The respective transformation matrices of the equation (17) are defined by the equation (11) the same as in the equation (10).

$$F_{Nn} = A\{C_n + BS_{Nn}\} + O \quad (17)$$

In this embodiment, the ten parameters in the transformation matrices A, B, 0 in the coordinate transformation equation (17) should be calculated by utilizing the statistical calculation (e.g., least squares method). In this embodiment, similarly to the first embodiment, even though there exist the chip rotation θ, the rectangular degree error w and the chip scalings rx and ry, each shot area on the wafer can be positioned to the predetermined position with high accuracy, and the projected image of the pattern of the reticle 2 can be precisely superposed on each shot area (chip pattern).

As the coordinate transformation equation (10) is utilized in the first embodiment, in the step 105, the reticle 2 or the wafer 8 is rotated in accordance with the chip rotation θ in the transformation matrix B in the equation (10). Thereby, the relative rotation errors between the projected image of the pattern of the reticle and each shot area (chip pattern) on the wafer are corrected. On the other hand, as the coordinate transformation equation (17) is utilized in this embodiment, the reticle 2 or the water 8 needs to be rotated in accordance with the sum (Θ+θ) of the wafer rotation Θ in the transformation matrix A and the chip rotation θ in the transformation matrix B so as to correct the above-mentioned relative rotation errors. This is caused by the difference between the coordinate transformation equations (10) and (17). The correction operation for the rectangular degree error w or the chip scalings rx and ry in the transformation matrix B in the equation (17) is the same as in the first embodiment.

Figure 6A:
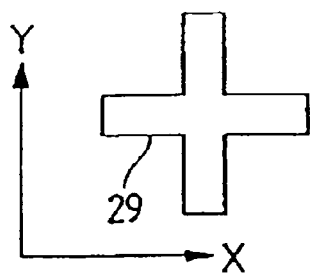
FIGS. 6A to 6C are diagrams illustrating examples of two-dimensional alignment marks.
Figure 6B:
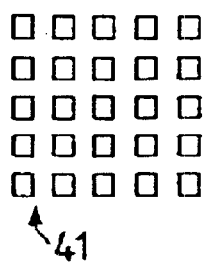
Figure 6C:
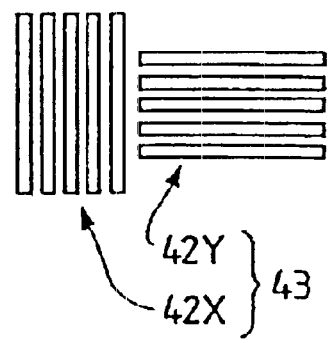

Next, examples of actually usable alignment marks will be described with reference to FIGS. 6A to 6C. First, as alignment marks (two-dimensional marks) for indicating the two-dimensional coordinate, there are an L-shaped, T-shaped or chevron-shaped mark other than the cross-shaped alignment mark 29 (see FIG. 6A) used in the above embodiments. When using the double luminous flux interfering type or the laser step alignment type alignment system as disclosed in U.S. Pat. No. 5,151,750, a two-dimensional grating pattern 41 (see FIG. 6B) becomes the two-dimensional mark also. And, when using the laser step alignment type or the image pick-up type alignment system as in the above embodiments, an alignment mark 43 having a line and space pattern 42X arranged in the X direction and a line and space pattern 42Y arranged in the Y direction so as to be adjacent to the pattern 42X become: the two-dimensional mark (see FIG. 6C) also.

When selecting one of these two dimensional marks, two data respectively for X and Y coordinates can be obtained as the data for calculating ten (or less) parameters in the equation (10) or (17) by means of the least squares method. Accordingly, the selection of one cross-shaped alignment mark (e.g., 29-1) in the above embodiments is equivalent to the selection of two alignment marks (one-dimensional mark) for indicating one dimensional coordinate. However, even when selecting a two-dimensional mark, only one coordinate data for the X-coordinate or the Y-coordinate data may be used.

Figure 7A:
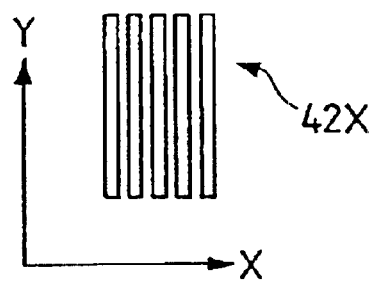
FIGS. 7A and 7B are diagrams illustrating examples of one-dimensional marks.
Figure 7B:
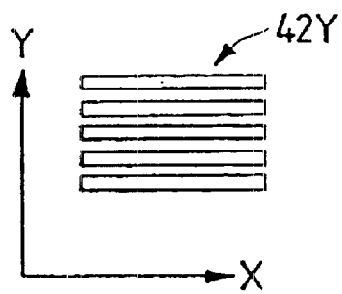

As the one-dimensional mark for indicating the X-coordinate as illustrated in FIG. 7A, there is the line and space pattern (or diffraction grating mark) 42X arranged at a constant pitch in the X direction. Also, as the one-dimensional mark for indicating the Y-coordinate, there is the line and space pattern (or diffraction grating mark) 42Y arranged at a constant pitch in the Y direction, as illustrated in FIG. 7B. Further, the two-dimensional grating pattern 41 of FIG. 6B may be deemed to be a one-dimensional mark in the X or Y direction.

Next, will be described another example of selecting sample shots and alignment marks in detail. In this case, the exposure apparatus effects the EGA calculation on the condition that the result of measurement of the alignment marks formed in the previous exposure process is utilized. Therefore, the positions and the number of alignment marks in each shot area upon the design are identical in the respective shot areas.

First, in the conventional EGA type alignment method, as disclosed in U.S. Pat. No. 4,780,617 wherein errors in the chip patterns are not taken into account, there are six error parameters ($\Theta$, W, Rx, Ry, $O_X$, $O_Y$. Therefore, if two-dimensional alignment marks are converted into one-dimensional alignment marks, at least six alignment marks need to be measured. That is, it is sufficient to measure the X and Y coordinate values in each of at least three measuring points which are not positioned in a common line on the wafer. At this time, it is not necessary to measure both a one-dimensional mark in the X direction and a one-dimensional mark in the Y direction on the same shot area. That is, in two shot areas, a one-dimensional mark in the X direction on the one shot area and a one-dimensional mark in the Y direction on the other shot area can be measured separately.

Figure 8A:
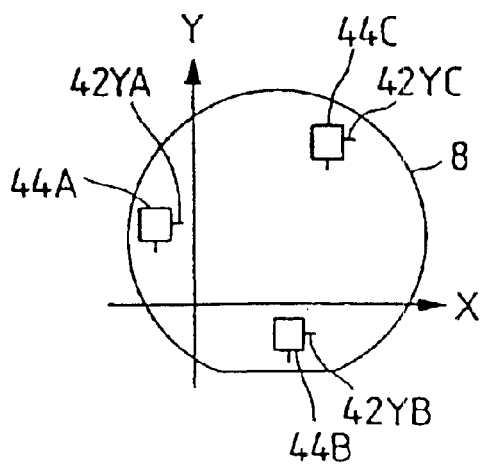
FIGS. 8A and 8B are diagrams illustrating an example of selecting alignment marks according to a conventional EGA method.
Figure 8B:
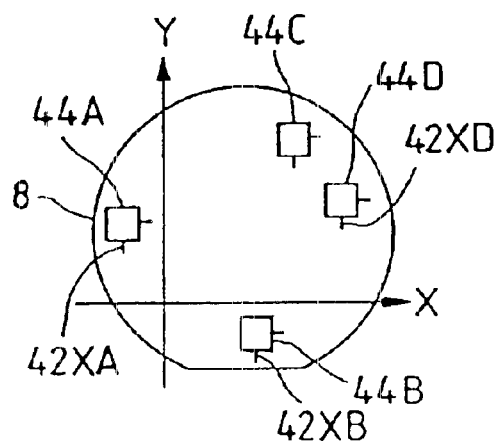

FIGS. 8A and 8B illustrate such a method of selecting the alignment marks. In respective shot areas 44A, 44B . . . , there are provided one-dimensional marks (hereinafter called "X marks") 42XA, 42XB, . . . , for indicating the coordinate in the X direction and one-dimensional marks (hereinafter called "Y marks") 42YA, 42YB . . . , for indicating the coordinate in the Y direction respectively.

Then, in order to measure the coordinate values of e.g., six alignment marks, as illustrated in FIG. 8A, first, the Y-coordinate values of the Y marks 42YA, 42YB and 42YC of the three shot areas 44A, 44B and 44C are measured. From the result of the measurement, three parameters ($\theta$, Ry, $O_Y$) are obtained. Thereafter, as illustrated in FIG. 8B, the X-coordinate values of the X marks 42XA, 42XB and 42XD of the three shot areas 44A, 44B and 44D are measured. From the result of this measurement, three parameters (W, Rx, $O_X$) are obtained. In this case, the shot area 44D used in FIG. 8B is different from the shot area 44C used in FIG. 8A, which causes no convenience.

Besides, after X and Y marks in different shot areas are measured, X-coordinate values and Y-coordinate values at predetermined measuring points may be obtained by calculation and the EGA calculation may be performed based on the obtained coordinate values.

Next, with reference to FIGS. 9A to 9C, will be described a method of selecting alignment marks when obtaining predetermined error parameters selected from the four error parameters (the chip rotation $\theta$, the rectangular degree error w, the chip scaling rx, the chip scaling ry), besides the conventional six error parameters. Five cases for selection of the error parameters will be described.

(1) Calculation of Chip Scaling ry (or γy) Only:

There are seven parameters to be obtained, so the coordinate values of at least three X marks and four Y marks need to be measured. In this case, as illustrated in FIG. 9A, in addition to an X mark 42X and a Y mark 42Y, a Y mark 46Y whose Y-coordinate value is different from the Y mark 42Y needs to be provided for the shot area 44. The condition of selecting the Y marks to be used for the EGA calculation is to select a Y mark (e.g., 46Y) which is not positioned on a line 45 passing the selected one Y mark 42Y and parallel to the X-coordinate axis. However, two Y marks satisfying the condition do not need to be on the same shot area.

Figure 9A:
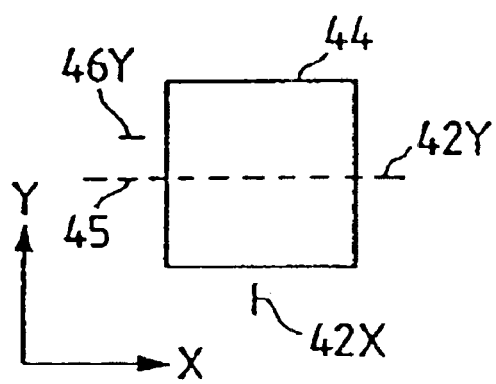
FIGS. 9A to 9C are explanatory diagrams illustrating an example of selecting alignment marks according to an embodiment of the present invention.
Figure 9B:
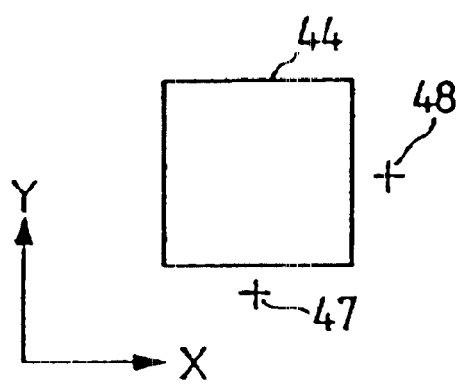
Figure 9C:
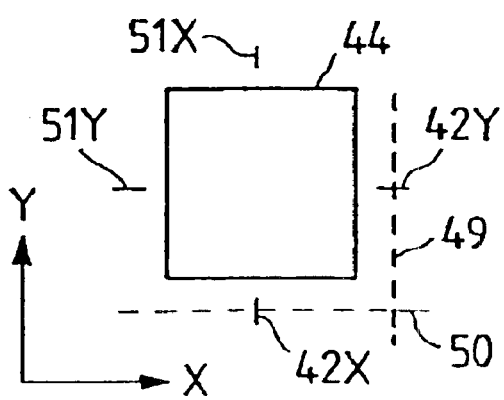

Ordinarily, the mark arrangement in FIG. 9A is not adopted and two two-dimensional marks 47 and 48 are often provided on a street line area adjacent to the shot area. In this case, there are two ways for obtaining the coordinate values of two Y marks. In the first way, the Y-coordinate values of two two-dimensional marks 47 in the same first shot area are obtained. In the other way, the Y-coordinate value of the two-dimensional mark 47 in the first shot area and the Y-coordinate value of the two-dimensional mark 47 in the other shot area are obtained.

(2) Calculation of the Chip Rotation Only:

In addition to at least three X marks and three Y marks, the coordinate value of at least one X mark or one Y mark needs to be measured. The condition of selecting the last X mark is, as illustrated in FIG. 9C, to select an X mark 51 which is not positioned on a line 50 passing the previously selected X mark 42X and parallel to the X-coordinate axis. Also, when selecting a Y mark instead of the X mark, a Y mark 51Y which is not positioned on a line 49 passing the previously selected Y mark 42Y and parallel to the Y-coordinate axis needs to be selected. Also, in this case, two X marks (or Y marks) satisfying the above condition do not need to be on the same shot area.

(3) Calculation of the Chip Scaling ry and the Chip Rotation $\theta$:

In addition to at least three X marks and three Y marks, two Y marks (one of them may be an X mark) need to be selected. Besides the above conditions (1) and (2) are satisfied, three marks which are not positioned on the same line need to be selected.

(4) Calculation of the Chip Scaling rx (or γx) Only:

The coordinate values of at least four X marks and three Y marks need to be measured. Similarly to the above case (1), the condition of selecting the four X marks is to select two points which will not be parallel to the Y-coordinate axis.

(5) Calculation of the Rectangular Degree Error w Only:

In addition to at least three X marks and three Y marks, e.g., one X mark needs to be selected. Similarly to the above case (2), the condition of selecting the four X marks is to select two points which will not be parallel to the X-coordinate axis.

(6) Calculation of the Chip Scaling rx and the Rectangular Degree Error:

In addition to three X marks and three Y marks, two X marks need to be selected. Similarly to the above cases (3) and (4), the condition of selecting the four X marks is to select three points which will not be positioned on the same line.

As described above, either of the coordinate values of the Y mark and the X mark may be utilized to calculate the chip rotation θ. Also, either of the coordinate values of the X mark and Y mark may be utilized to calculate the rectangular degree error w. However, in the case of the rectangular degree error w, the equations (7) and (15) (or equations (9) and (16)) of the above embodiment are expressed so as to use the X mark, so the X mark is used in the above embodiment. Also, the selection of the alignment marks will not be limited to the same shot area.

Further, e.g., when the rectangular degree error w of the chip is deemed to be zero, the number of error parameters necessary to be determined in the equation (10) or (17) is nine. Consequently, the number of the parameters to be decided in the step 104 of FIG. 1 is nine, so it is sufficient to measure the coordinate values of only nine or more one-dimensional alignment marks defining positions in the X or Y directions in the step 103.

Furthermore, when the rectangular degree error w of the chip is deemed to be zero and the expansion or contraction of the chip in the X and Y directions are deemed to be directionally uniform (rx=ry), it is sufficient to provide two alignment marks (e.g., 29-n and 30-n) in each shot area 27-n.

In this case, the number of parameters necessary to be determined is eight, so it is sufficient to measure the coordinate values of four or more two-dimensional alignment marks (or the coordinate values of eight or more one-dimensional alignment marks) in the step 103 of FIG. 1.

On the other hand, more than four alignment marks may be provided in each shot area. In this case, the measurement errors at the time of measuring the coordinate values of alignment marks are averaged. Further, the influence of the deviations of the alignment marks from the designed positions due to the distortion of the projection optical system at the time of printing the first chip pattern (first layer) are preferably averaged by increasing the number of alignment marks.

Especially, when utilizing the TTL (through the lens) type alignment system for performing alignment by directly observing or detecting the alignment marks through a projection optical system, the measurement errors of the coordinate values caused by the projection optical system can be reduced by increasing the number of alignment marks. Furthermore, when the number of alignment marks in each shot area is increased so as to take their arrangement positions into consideration, it is possible to obtain not only the rotation and the linear expansion or contraction but also the nonlinear distortion in the chip pattern.

For example, when providing three alignment marks in each shot area along the X direction, the nonlinear distortion in the X direction can be obtained. Thus, by increasing the number of alignment marks, it is possible to detect distortion elements of the chip patterns (parallel movement, rotation, magnification, rectangular degree, trapezoid distortion, barrel distortion, pincushion distortion) collectively. In short, as the number of alignment marks is increased, the number of error parameters can be increased, enabling the occurences of errors to be detected more accurately.

The distances between the reference point 28-n of each sample shot on the wafer and the alignment marks formed relatively to the reference point 28-n are comparatively short. Therefore, regarding four error parameters (θ, w, rx, ry) among ten error parameters, errors due to measurement repeatability are liable to occur. In order to minimize such errors, it is necessary to increase the number of sample shots and the number of alignment marks to be measured, which reduces the throughput. Then, in a third embodiment of the present invention, the reduction of the throughput is prevented and alignment accuracy is highly maintained by the following sequence. The following method utilizes the fact that wafers in the same lot have the same tendencies of linear and nonlinear errors and distortions of chip patterns of shot areas thereof.

Figure 12:
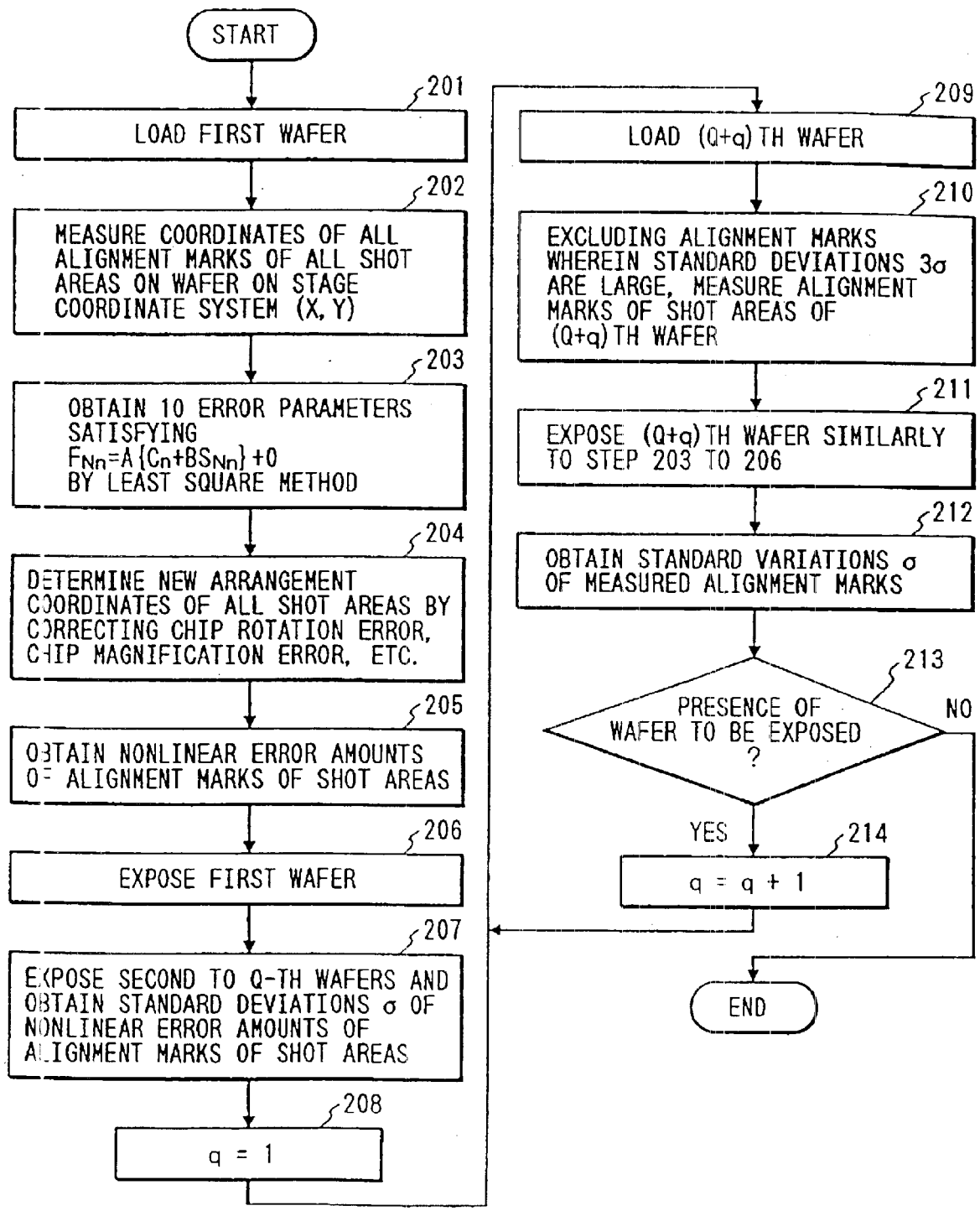
FIG. 12 is a flowchart illustrating alignment and exposure operations according to a third embodiment of the present invention.
Figure 13:
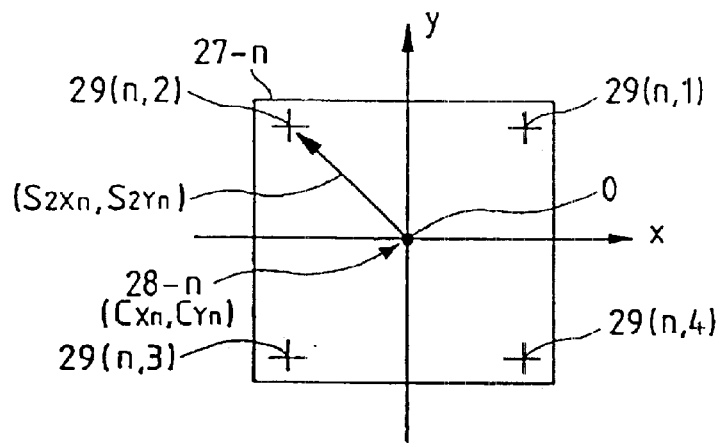
FIG. 13 is a diagram illustrating four alignment marks on a shot area to be used in the third embodiment.

The operations of alignment and exposure of this embodiment based on the coordinate transformation (17) will be described with reference to a flowchart in FIG. 12. First, in the step 201, a first wafer 8 to be exposed is taken out of a predetermined lot and loaded on the wafer holder 8. And, its origin is set (prealignment). All shot areas on the wafer 8 have chip patterns formed in the previous process. As shown in FIG. 13, four cross-shaped alignment marks 29 (n, N) (N=1 to 4) are formed on each shot area 27-n on the wafer 8. In this embodiment, the alignment marks are formed in four corners of each shot area 27-n. Also, the alignment of a reticle 2 has been finished and deviations thereof in the X and Y directions with respect to the rectangular coordinate system (X, Y) defined by the interferometers (not shown) and the direction of rotation are approximately zero.

Next, in the step 202, by utilizing the alignment system 15 in FIG. 2, coordinate values ($FM_{NXn}$, $FM_{NYn}$) of all the alignment marks 29 (n, N) of all the shot areas 27-n on the wafer 8 on the stage coordinate system (X, Y) are actually measured. This means that all the shot areas on the wafer 8 are made to be sample shots and all the alignment marks are subject to measurement. However, it is not always necessary to make all the shot areas 27-n be sample shots and the number of sample shots may be slightly larger than that of sample shots selected conventionally. It is necessary to measure coordinate values of at least five or more two-dimensional alignment marks to determine values of ten or more parameters.

In this case, the arrangement coordinate values upon the design ($C_{Xn}$, $C_{Yn}$) of the reference points 8-n of the shot areas 27-n on the coordinate system (α, β) on the wafer 8 and the coordinate values (relative coordinate values) upon the design ($S_{NXn}$, $S_{NYn}$) of the measured alignment marks on the coordinate systems (x, y) on the respective shot areas 27-n are known beforehand. Then, in the step 203, the arrangement coordinate values ($C_{Xn}$, $C_{Yn}$) upon the design of the reference points of the shot areas including the measured alignment marks and the relative coordinate values upon the design ($S_{NXn}$, $S_{NYn}$) representing positions of the measured alignment marks with respect to the corresponding reference points are substituted into the right side of the equation (16) to obtain coordinate values upon calculation ($F_{NXn}$, $F_{NYn}$) on the stage coordinate system (X, Y) in which those alignment marks should be located.

Then, ten error parameters ($\Theta$, W, $\Gamma x$, $\Gamma y$, $O_X$, $O_Y$, $\theta$, w, $\gamma x$, $\gamma y$) satisfying the transformation (17) are obtained by the least square method. Specifically, the differences ($E_{NXn}$, $E_{NYn}$) between the actually measured coordinate values ($FM_{NXn}$, $FM_{NYn}$) and the respective coordinate values upon the calculation ($F_{NXn}$, $F_{NYn}$) are considered as alignment errors. Accordingly, $E_{NXn}=FM_{NXn}-F_{NXn}$ and $E_{NYn}=FM_{NYn}-F_{NYn}$ hold. The alignment errors ($E_{NXn}$, $E_{NYn}$) of the measured alignment marks are respectively squared and added. The obtained value is partially differentiated sequentially by the ten error parameters. Then, ten equations are established such that the partially differentiated expressions become zero. Thereafter, the simultaneous equation of the ten equations is solved to obtain the ten error parameters.

Then, in the step 204, the rotation error of the chip pattern with respect to the stage coordinate system (X, Y) is corrected by properly rotating the reticle 2 via the reticle stage 2 in FIG. 2 or rotating the wafer 8 such that the residual rotation error (wafer rotation) $\theta$ of the wafer in the transformation matrix A of the transformation (17) and the chip rotation $\theta$ in the transformation matrix B thereof are corrected. This means that the reticle 2 or the wafer 8 is rotated in accordance with the sum ($\theta+\theta$) of the residual rotation error $\theta$ constituting an element of the transformation matrix A of the transformation (17) and the rotation error $\theta$ constituting an element of the transformation matrix B thereof.

However, when the wafer 8 is rotated, there is a danger that the offset error ($O_X$, $O_Y$) of the wafer 8 is changed. Therefore, it is necessary to remeasure coordinate values of the alignment marks and to reperform calculation (EGA calculation) for obtaining parameters by the above-mentioned least square method, thereby obtaining error parameters. Namely, when the wafer 8 is rotated by the angle ($\Theta+\theta$), the above steps 202 and 203 need to be repeated. This also means checking whether the value of a new residual rotation error $\Theta$ after the rotation of the wafer 8 corresponds to the angle by which the wafer 6 is rotated in the step 204. Strictly speaking, the rectangular error w of the chip cannot be corrected, but can be limited to a small amount by rotating the reticle 2 appropriately. Then, it is possible to optimize the amount of rotation of the reticle 2 or the wafer 8 such that the sum of the absolute values of the rotation error $\Theta$, the rotation error $\theta$ and the rectangular degree error w is minimized.

Next, the magnification of the projection optical system 7 in FIG. 2 is adjusted via the imaging optical characteristics control device 14 such that the chip magnification error of the transformation matrix B of the transformation 17 is corrected. This means that the magnification of the projection optical system 7 is adjusted in accordance with the chip scalings rx (=$\gamma x-1$) and ry ($\gamma y-1$) constituting an element of the transformation matrix B of the equation (11).

Thereafter, by utilizing the transformation matrices A and O including elements consisting of the error parameters obtained in the step 203 and substituting the arrangement coordinate values upon the design ($C_{Xn}$, $C_{Yn}$) of the reference points 28-n of the respective shot areas 27-n on the wafer 8 into the equation (12), arrangement coordinate values upon calculation ($G_{Xn}$, $G_{Yn}$) on the stage coordinate system (X, Y) are obtained.

Further, in the step 205, the ten error parameters obtained in the step 203, the coordinate values upon the design of the reference points of the shot areas and the coordinate values upon the design of the alignment marks 29 (n, N) are substituted into the transformation (17) to obtain coordinate values upon calculation ($F_{NXn}$, $F_{NYn}$) of the alignment marks 29 (n, N). The differences of the measured coordinate values ($FM_{NXn}$, $FM_{NYn}$) of the alignment marks 29 (n, N) and the coordinate values upon the calculation ($F_{NXn}$, $F_{NYn}$) are obtained as nonlinear error amounts ($\Delta_{NXn}$, $\Delta_{NYn}$), which are stored in a memory. It is to be noted that when the wafer 8 is rotated in the step 204, nonlinear error amounts calculated based on the result of the remeasurement are stored in the memory.

In the step 206, in accordance with the calculated arrangement coordinate values ($G_{Xn}$, $G_{Yn}$) and the preliminarily obtained base line amount, the reference points 28-n of the shot areas 27-n are successively aligned with a predetermined position within the exposure field of the projection optical system 7 in FIG. 2 to expose the pattern of the reticle 2 to the respective shot areas 27-n. After the whole shot areas on the wafer have been exposed, a second wafer is loaded on the wafer holder 9 in FIG. 2.

Next, in the step 207, the pattern of the reticle is exposed to each of shot areas of the second to Q-th. (Q is an integer of 2 or more) wafers in a similar manner to the first wafer. At this time, for the alignment marks 29 (n, N) of the shot areas 27-n on the respective first to Q-th wafers, nonlinear error amounts ($\Delta_{NXn}$, $\Delta_{NYn}$) which are the differences between measured coordinate values ($FM_{NXn}$, $FM_{NYn}$) and calculated coordinate values ($F_{NXn}$, $F_{NYn}$) are obtained. Further, for all the first to Q-th wafers, the average value ($A_{NXn}$, $A_{NYn}$) and standard deviations ($\sigma_{NXn}$, $\sigma_{NYn}$) of the nonlinear error amounts ($\Delta_{NXn}$, $\Delta_{NYn}$) of the alignment marks 29 (n, N) are obtained. In this embodiment, a shot area in which the sum of the standard deviations ($\sigma_{NXn}$, $\sigma_{NYn}$) of the alignment marks thereof is larger than a predetermined value is excluded from the sample shots.

In the step 208, the initial value of a variable q is set to be 1, and in the step 209, a (Q+q)-th wafer is loaded on the wafer holder 9. In the step 210, among all alignment marks of all shot areas on the wafer, shot areas in which the sum of the standard deviations ($\sigma_{NXn}$, $\sigma_{NYn}$) of the alignment marks thereof is larger than the predetermined value is excluded from the sample shots and coordinate values of alignment marks of left sample shots on the stage coordinate system (X, Y) are measured. In the step 211, the (Q+q)-th wafer is exposed in the same procedure as in the steps 203 to 206. At this time, the measurement result of the alignment marks to be used to obtain ten error parameters correspondingly to the step 203 are the measurement result of the alignment marks actually measured in the step 210. In the step 212, the average value ($A_{NXn}$, $A_{NYn}$) and standard deviations ($\sigma_{NXn}$, $\sigma_{NYn}$) of nonlinear error amounts ($\Delta_{NXn}$, $\Delta_{NYn}$) of the alignment marks of the (Q+q) wafer measured in the step 210 are obtained.

In the step 213, it is checked whether a wafer to be exposed is left in the lot. When there is a wafer to be exposed, the value of the variable q is increased by one in the step 214 and the procedure goes back to the step 209. When there is no wafer to be exposed, the whole operation is finished. In this case, as the number of exposed wafers in the lot increases, the number of sample shots to be measured decreases. When the number of sample shots to be measured becomes approximately equivalent to that of sample shots used in the ordinary EGA method, the number of sample shots and the positions thereof are fixed. Thereby, while the alignment accuracy is maintained with high accuracy, reduction of the throughput of the exposure process can be prevented.

Instead of decreasing the number of shot areas in the step 210, the number of alignment marks on the sample shots to be measured may be decreased. In this case, as exposures to the wafers in the lot progress, the number of sample shots decreases and the number of alignment marks on the sample shots as well as the arrangement thereof are changed. However, when, e.g., alignment marks in the four corners of a sample shot are measured, there is a case that only the standard deviation of the alignment mark in one corner (e.g., only 29 (n, N) in FIG. 13) becomes large. In this case, only that alignment mark may not be measured. But, independently of that, alignment marks to be measured may be decreased uniformly from alignment marks in four corners on sample shots. For decreasing alignment marks uniformly, it is preferable to decrease first an alignment mark having the much larger standard deviation of the nonlinear error amount for each corner (e.g., for each alignment mark 29 (n, N)). Also, there is a method not that the number of sample shots is determined to be large and all alignment marks thereof are measured but that about one or two alignment marks for each sample shot are measured uniformly.

Further, for increasing or decreasing alignment marks in this embodiment, there is another method in which alignment marks to be measured are selected so as to be arranged constantly uniformly (approximately uniform density distribution) on the entire surface of a wafer, and their density is changed by the increase or decrease of the number of alignment marks. That is, for example, a method can be considered in which the entire surface of a wafer is divided into a plurality of blocks in the shape of a grating and first it is set that the respective blocks have the same number of alignment marks to be measured. Thereafter, the number of alignment marks in each block is decreased or increased by the same rate in accordance with nonlinear error amounts of measurement results. Such a method is advantageous in that the measurement information of alignment marks can be obtained approximately uniformly over the entire surface of the wafer.

Also, in the alignment of the conventional EGA method in which the number of error parameters ($\Theta$, W, Rx, Ry, $O_X$, $O_Y$) is six, without lowering the throughput and the alignment accuracy, the number of alignment marks to be measured can be optimized by increasing or decreasing the number of alignment marks to be measured in accordance with nonlinear error amounts of measured alignment marks.

In this embodiment, as shown in FIG. 13, the four cross-shaped two dimensional alignment marks 29 (n, N) by which alignment can be performed simultaneously in the X and Y directions on the stage coordinate system are formed in the respective four corners on the diagonal lines of the shot area 27-n. However, it is not always necessary to take such a way if four alignment marks are not arranged on a line. Also, it is not always needed to form alignment marks within the shot area 27-n. For example, four alignment marks 29 (n, 1) to 29 (n, 4) may be formed in the centers of sides of a street line area between the shot area 27-n and adjacent shot areas.

Figure 14A:
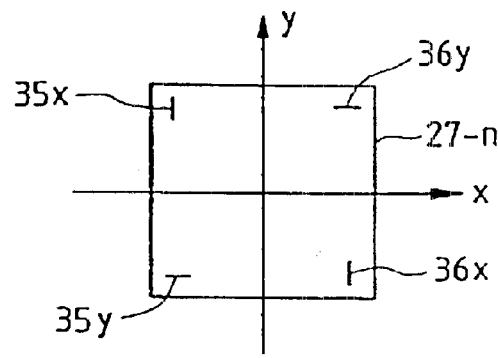
FIGS. 14A and 14B are diagrams showing other examples of alignment marks.
Figure 14B:
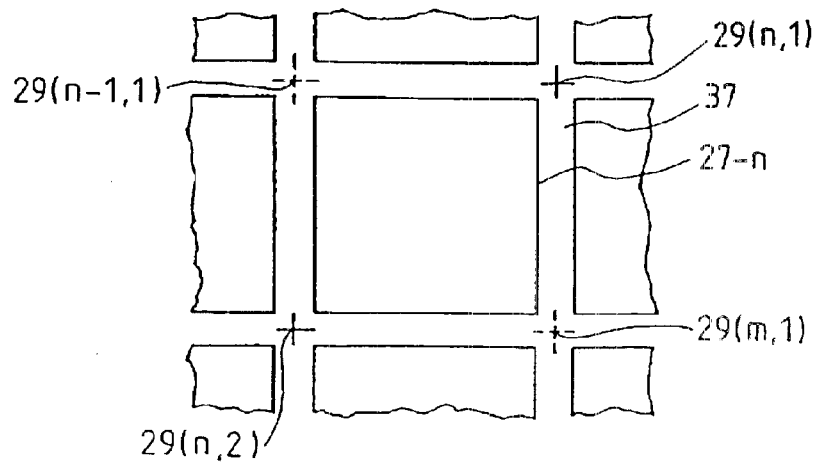

Also, the number of alignment marks 29 (n, N) on the shot area 27-n may be less than four. For example, as shown in FIG. 14B, two alignment marks 29 (n, 1) and 29 (n, 2) may be formed on a diagonal line of a street line area 37 surrounding the shot area 27-n. In this case, alignment marks 29 (n-1, 1) and 29 (m, 1) belonging to other shot areas are formed at other positions of the street line area 37.

Also, one-dimensional alignment marks for the X direction and one-dimensional alignment marks for the Y direction may be separately provided to obtain the transformation matrices A, B and O of the equations (10) and (17) if precaution is taken with their arrangement. Specifically, as shown in FIG. 14A, alignment marks 35X and 36X indicating positions in the X direction and alignment marks 35y and 36y indicating positions in the Y direction may be formed in the four corners of the shot area 27-n. However, when using one-dimensional alignment marks capable of specifying positions in the X or Y direction as shown in FIG. 14A instead of cross-shaped alignment marks capable of specifying two-dimensional positions as shown in FIG. 13, it is required to measure coordinate positions of ten or more alignment marks to determine ten parameters. Further, there is a case that only at least one parameter among the four parameters ($\theta$, w, rx, ry) may be obtained in addition to the conventional six parameters ($\Theta$, W, Rx, Ry, $O_X$, $O_Y$). Thus, when obtaining seven parameters in total, it is sufficient to measure coordinate values of seven or more one-dimensional alignment marks.

Among the four parameters ($\theta$, w, rx, ry) related to the chip pattern, if there are parameters (e.g., chip scalings rx and ry) in which an average value of the measurement results of several initial wafers is utilized, which will be described later in detail, the number of unknown parameters is further reduced, whereby the minimum number of alignment marks to be measured in the step 210 is reduced. In short, when converted to one-dimensional marks, it is sufficient to measure coordinate values of alignment marks the number of which is at least the same as that of unknown parameters.

Next, a fourth embodiment of the present invention will be described. In this embodiment, the process of exposing a plurality of wafers of a lot successively by the projection exposure apparatus of FIG. 2 is changed from that in the third embodiment and only the operation different from that in the third embodiment will be described.

Also, in this embodiment, four alignment marks 29 (n, 1) to 29 (n, 4) as shown in FIG. 13 are formed on each of shot areas of the wafers. When exposing the first to Q-th wafers in a similar manner to the third embodiment, approximately all the shot areas on each wafer are made to be sample shots and coordinate values of four alignment marks on each sample shot on the stage coordinate system (X, Y) are measured. From these measurement results, the correction of chip rotation, etc. and exposure for each wafer are performed in accordance with the steps 203, 204 and 206 in FIG. 12.

At this time, instead of obtaining a nonlinear error amount of each alignment mark in the step 205, four error parameters (rotation error $\theta$, rectangular degree error w, linear expansion or contraction rx (=1+$\gamma$x) and ry (=1+$\gamma$y)) related to the chip pattern among ten error parameters ($\Theta$, W, $\Gamma$x, $\Gamma$y, $O_X$, $O_Y$, $\theta$, w, $\gamma$x, $\gamma$y) in the transformation (17) are stored in a memory. Next, in a process corresponding to the step 207 of FIG. 12, the respective average values of the four error parameters ($\theta$, w, rx, ry) related to the chip patterns in the first to Q-th wafers are obtained. Thereafter, when exposing left wafers, corrections of the chip rotation, the rectangular degree of the chip and the expansion or contraction of the chip are performed by commonly utilizing the average values of the four error parameters ($\theta$, w, rx, ry) obtained with respect to the first to Q-th wafers.

Among the average values of the four error parameters ($\theta$, w, rx, ry) with respect to the first to Q-th wafers, the average value of at least one error parameter (e.g., only the chip scaling rx) may be commonly utilized, and the other error parameters are obtained separately for each wafer. For example, depending on lots, there is a case that tendencies of the chip scalings rx and ry and the rectangular degree error w of the chip are the same over whole wafers. In such a case, as to the chip scalings rx and ry and the rectangular degree error w of the chip, the average values of the measurement results of several initial wafers in the lot may be utilized commonly. On the other hand, the rotation error of the chip rotation is liable to be varied for each wafer in the same lot, so is obtained for each wafer.

Accordingly, when exposing a (Q+1)-th wafer in the fourth embodiment, the average values of the four error parameters concerning the chip patterns are utilized, so that it is necessary to determine only six error parameters ($\Theta$, W, Rx, Ry, $O_X$, $O_Y$) similarly to the conventional EGA method. That is, about ten shot areas are specified as sample shots in a similar manner to the conventional EGA method, and the coordinate value of one alignment mark (e.g., 29 ($n$, 1)) of each sample shot is measured. And, based on the measurement result, values of six error parameters are determined. Then, arrangement coordinate values upon calculation of the shot areas are obtained from the transformation (17) and each shot area is aligned for exposure based on the obtained arrangement coordinate values.

Thus, according to the fourth embodiment, the number of sample shots and that of alignment marks to be measured are large in several initial wafers while those in the left wafers are the same as in the conventional EGA method. Therefore, without lowering the throughput of the whole exposure process so much, it is possible to improve alignment accuracy by correcting chip rotation, etc. The methods of the third and fourth embodiments in which the number of alignment marks is gradually increasing or decreasing can be applied to the conventional EGA method.

As in the above embodiments, the method wherein the shot arrangement error in the wafer is assumed to be linear belongs to the EGA method. In the EGA method of the above embodiments, the chip rotation and chip magnification errors are calculated on the assumption that the chip rotation and chip magnification (distortion) errors in each shot area are uniform in the same wafer. Therefore, if the partial arrangement error on the wafer or the variation (nonlinear condition) of the distortion elements is large, it is difficult to improve the alignment accuracy. Consequently, it is desirable to provide an alignment method wherein the chip rotation and magnification errors can be preferably corrected and even a wafer having nonlinear distortion can be aligned with high precision. Hereinafter, will be described an embodiment of an improved EGA method by which highly accurate alignment is possible. This alignment method is formed by applying U.S. patent application Ser. No. 5,146 (filed on Jan. 15, 1993) to the above embodiments.

Such a fifth preferred embodiment will be described with reference to FIG. 10. Although the projection exposure apparatus 2 is utilized in this embodiment also, alignment is performed by a first weighted enhanced global alignment method (hereinafter called "W1-EGA Method") which is formed by improving the EGA methods in the first and second embodiments. The alignment by the W1-EGA method is effective in a wafer with regular nonlinear distortion and it takes much consideration into a fact that even the wafer with regular nonlinear distortion has partial areas where the arrangement errors are approximately equal. Then, in the alignment by the W1-EGA method, weights are given in accordance with distances between a shot area and sample shots.

Figure 10:
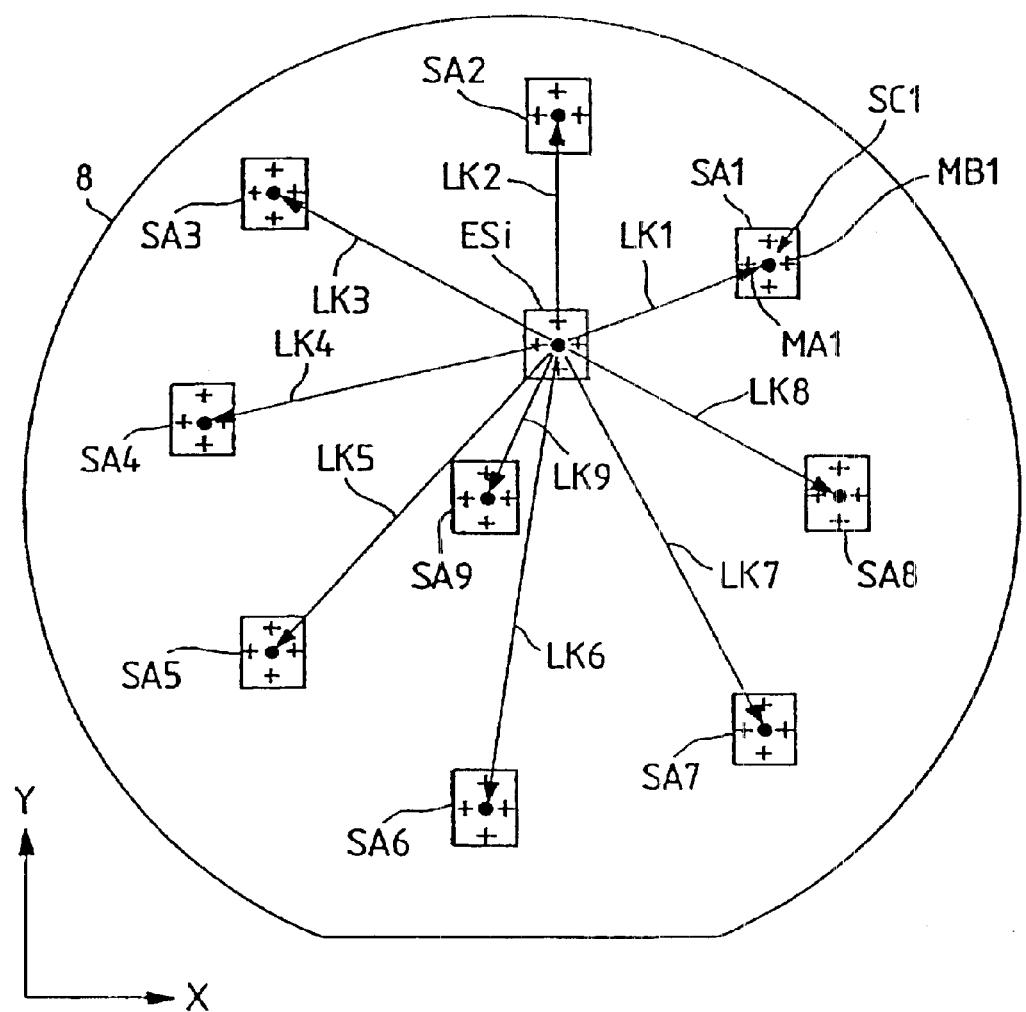
FIG. 10 is a diagram for explaining a principle of a first weighted EGA method according to another preferred embodiment of the present invention.

FIG. 10 illustrates a wafer 8 to be exposed in this embodiment. When determining the coordinate position of the i-th shot area ESi on the wafer 8 upon calculation, in accordance with distances LK1 to LK9 between a shot area ESi and m (m=9 in FIG. 10) sample shots SA1 to SA9, a weight $W_{in}$ is given to each of measured coordinate positions (alignment data) of alignment marks in the nine sample shots. Concretely, the weight $W_{i1}$ is given to each of measured coordinate positions of two alignment marks MA1, MB1 in accordance with the distance LK1. Strictly speaking, it is preferable to give weights in accordance with a distance between a reference point of the shot area ESi and each alignment mark in sample shots. Also, it is not necessary to measure the coordinate values of two alignment marks in each shot area.

Instead of the simple residual error element of the sum of squared values in the EGA method, a residual error element Ei obtained by the following equation (18) is defined in the W1-EGA method. In the equation (18), the coordinate value ($FM_{NXn}$, $FM_{NYn}$) is the actually measured coordinate value of an n-th alignment mark in an n-th sample shot and: the coordinate value ($F_{NXn}$, $F_{NYn}$) is the coordinate value upon calculation thereof.

$$Ei = \sum_{n=1}^{n} W_{in} \left[ \sum_{N=1}^{4} \{(F_{NXn} - FM_{NXn})^2 + (F_{NYn} - FM_{NYn})^2\} \right] \quad (18)$$

Then, ten error parameters ($\Theta$, W, $\Gamma x$, $\Gamma y$, $O_X$, $O_Y$, $\theta$, w, $rx$, $ry$) satisfying the equation (10) or the equation (17) are obtained such that the residual error element Ei is minimized. The sample shots SA1 to SA9 used for each shot area ESi are the same here, but the distance between the shot area ESi and the sample shot SAn is different for each shot area ESi. Accordingly, the weight $W_{in}$ to be given to the the coordinate position (alignment data) of the sample shot SAn is changed for each shot area ESi. The error parameters ($\Theta$, W, Rx, Ry, $O_X$, $O_Y$, $\theta$, w, rx, ry) are determined for each shot area ESi. Then, the wafer rotations $\Theta$ in the transformation matrix A in the equation (10) or the equation (17) and the chip rotation $\theta$ in the transformation matrix B are corrected and then the chip magnification error (chip scalings rx, ry) in the transformation matrix B in the equation (10) or the equation (17) is corrected.

Thereafter, the transformation matrices A and O including the error parameters ($\Theta$, W, $\Gamma x$, $\Gamma y$, $O_X$, $O_Y$) are used and the arrangement coordinate value upon design of each shot area ESi on the wafer is substituted for the equation (12) to obtain the arrangement coordinate value upon calculation of the reference point of each shot area ESi on the stage coordinate system (X, Y).

As disclosed above, when the wafer is rotated, the arrangement coordinate value is calculated by the conventional EGA calculation based on the remeasured coordinate values of the alignment marks.

Thus, in the W1-EGA method, the weight $W_{in}$ for the coordinate data of each sample shot SAn is changed for each shot area ESi. For example, the weight $W_{in}$ is expressed by a function of the distance LKn between the i-th shot area ESi and the n-th sample shot SAn, as follows. A parameter S is for changing the degree of weighting.

$$W_{in} = \frac{1}{\sqrt{2\pi S}} \exp\{-LKn^2 / (2S)\} \quad (19)$$

As is apparent in the equation (19), the shorter the distance LKn between the i-th shot area and the sample shot SAn becomes, the larger the weight $W_{in}$ given to the alignment data in the sample shot area SAn becomes.

Also, when the value of the parameter S is sufficiently large in the equation (19), the result of the statistical calculation operation is approximately equivalent to the result of the calculation by the EGA method in the above embodiments. On the other hand, when the shot area ESi to be exposed is deemed to be the sample shot SAn and the value of the parameter S is made to approach zero, the result of the statistical calculation operation is approximately equivalent to the result of the calculation by the die-by-die method wherein the position of a wafer mark is measured for each shot area for alignment. That is, in the W1-ECA method, by setting the parameter S to be a proper value, it is possible to obtain the mean effect between the EGA method and the die-by-die method. For example, when the value of the parameter S is set to be small for a wafer having a larger nonlinear element, approximately the same effect (alignment accuracy) as the die-by-die can be obtained and it is possible to eliminate the alignment error caused by the nonlinear element preferably. Besides, when the measurement reproducibility of the alignment is not good, the value of the parameter is set to be large, whereby approximately the same effect as the EGA method can be obtained and it is possible to reduce the alignment error by the mean effect.

Further, the weighted functional equation (19) may be provided separately for the X-coordinate values of the alignment marks and the Y-coordinate values of the alignment marks and the weight $W_{in}$ may be set independently for the X-coordinate values and the Y-coordinate values. In this case, even though the degree (largeness) of the nonlinear distortion of the wafer, the regularity, the step pitch, and the distance of the centers of two adjacent shot areas (approximately corresponding to the shot size though it depends on the width of the street line) are different in the X and Y directions, it is possible to correct the shot arrangement error on the wafer with high accuracy by setting the values of the parameter S independently. At this time, the value of the parameter S may be differentiated between the X and Y directions, as above. Furthermore, although the value of the parameter S is the same or different between the X and Y directions, the value of the parameter should be changed properly in accordance with the largeness of the regular nonlinear distortion, the regularity, the step pitch, the measurement reproductivity or the like.

Thus, by changing the value of the parameter S, the effect can be changed in a range from the EGA method to the die-by-die method. Accordingly, alignment can be performed with optimum conditions for each layer and each element (X direction and Y direction) by changing the alignment flexibly in accordance with, e.g., the characteristics (e.g., largeness, regularity or the like) of the nonlinear element, the step pitch, the measurement reproductivity of the alignment sensor.

Next, a second weighted enhanced global alignment method (hereinafter called "W2-EGA method") will be described. To describe briefly, it is deemed that the wafer is distorted regularly, in particular, point-symmetrically and the center of the point symmetry coincides with the center of the wafer (wafer center).

Figure 11:
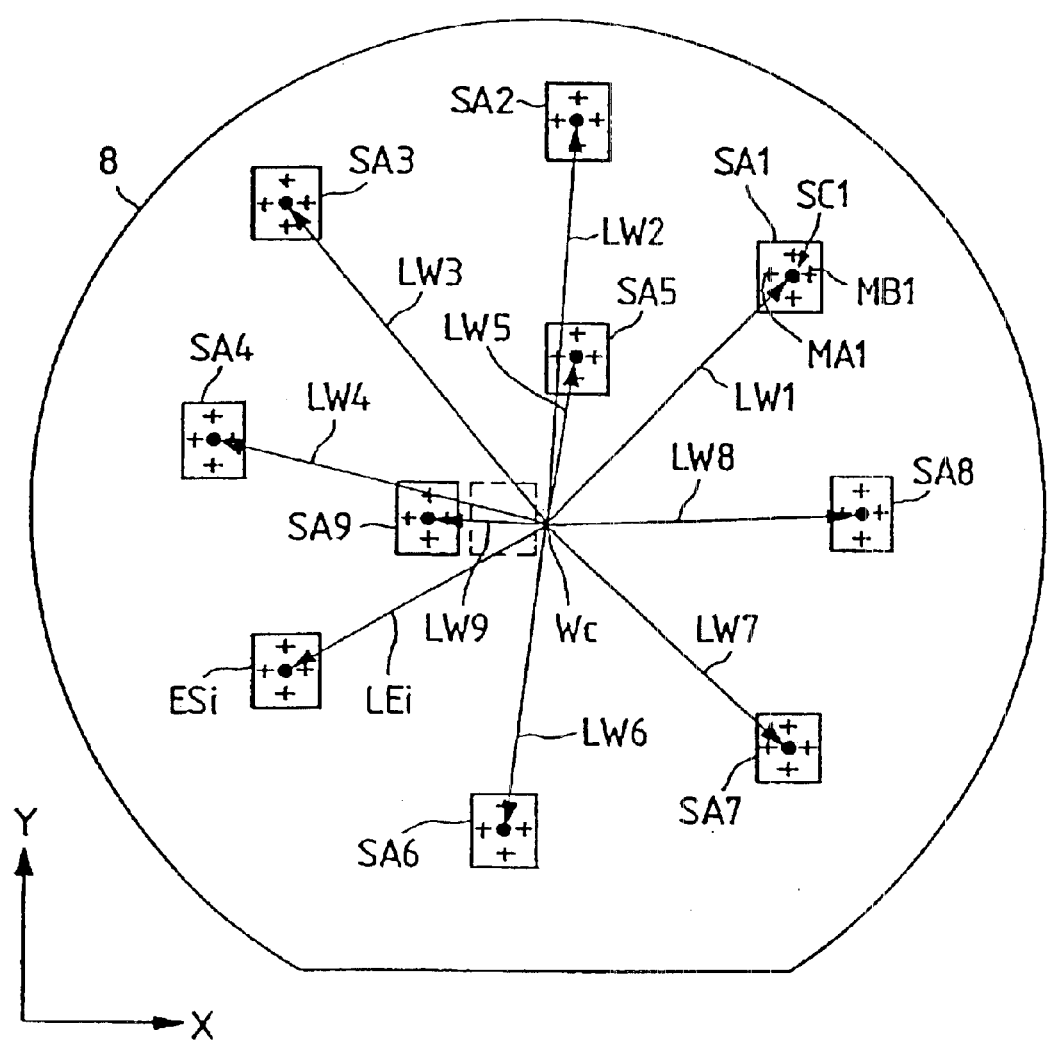
FIG. 11 is a diagram for explaining a principle of a second weighted EGA method.

FIG. 11 illustrates the wafer 8 to be exposed. In FIG. 11, it is assumed that the distortion center of the wafer 8 (the center of the point symmetry of the nonlinear distortion). i.e., the wafer center is the wafer center Wc, the distance (radius) between the wafer center Wc and the i-th shot area ESi is the distance LEi and the distances between the wafer center Wc and m (m=9 in FIG. 11) sample shots SA1 to SA9 are the distances LW1 to LW9. In the W2-EGA method similarly to the W1-EGA method, the weight $W_{in}$ is given to measured coordinate positions (alignment data) of alignment marks of nine sample shots SA1 to SA9 in accordance with the distance LEi and the distances LW1 to LW9. In the W2-EGA method, two alignment marks (MAi, MBi) are detected for each sample shot. Thereafter, the residual error element Ei' is defined in the following equation (20) similarly to the equation (18) and the error parameters ($\Theta$, W, $\Gamma$x, $\Gamma$y, $O_X$, $O_Y$, $\theta$, w, rx, ry) in the equation (10) or the equation (17) are determined such that the equation (20) is minimized.

$$Ei' = \sum_{n=1}^{m} W'_{1n}\left(\sum_{N=1}^{4} [(F_{NXn} - FM_{NXn})^2 + (F_{NYn} - FM_{NYn})^2]\right) \quad (20)$$

In the W2-EGA method similarly to the W1-EGA method, the weight $W_{in}$' given to the alignment data is changed for each shot area ESi, so that the error parameters ($\Theta$, W, $\Gamma$x, $\Gamma$y, $O_X$, $O_Y$, $\theta$, w, rx, ry) are determined for each shot area ESi to determine the chip rotation, the chip rectangular degree, the chip magnification error and the arrangement coordinate values upon calculation.

In order to change the weight $W_{in}$' to each sample shot for each shot-area ESi on the wafer 8, the weight $W_{in}$' in the equation (20) is expressed by the function of the distance (radius) LEi between the i-th shot area ESi and the wafer center Wc. The parameter S is for changing the degree of weighting.

$$W'_{in} = \frac{1}{\sqrt{2\pi S}}\exp\{-(LEi - LWn)^2/(2S)\} \quad (21)$$

As apparent from the equation (21), the nearer the distance between the sample shot SAn and the wafer center Wc with respect to the distance between the wafer center Wc and the i-th shot area ESi becomes, the larger the weight $W_{in}$' given to the alignment data of each sample shot becomes. Namely, the largest weight $W_{in}$' is given to the alignment data of the sample shots positioned on the circle drawn by the radius LEi from the wafer center Wc. And, the farther the sample shot SAn is positioned in the radius direction away from the circle, the smaller the weight $W_{in}$' given to the alignment data of the sample shot SAn becomes.

Also, similarly to the W1-EGA method, the value of the parameter S may be determined properly in accordance with the required alignment accuracy, the characteristics of the nonlinear distortion (e.g., largeness, regularity or the like), the step pitch, the measurement reproductivity of the alignment sensor. That is, when the nonlinear element is comparatively large, the value of the parameter S is set to be small, whereby the influence of the sample shots whose distance LWn from the wafer center Wc is larger can be reduced. On the other hand, when the nonlinear element is comparatively small, the value of the parameter S is set to be large, whereby the degradation of the alignment accuracy of the alignment sensor (or layer) with bad measurement reproductivity is reduced.

Further, in the W2-EGA method, naturally, the identical weight $W_{in}$' is given to the alignment data of a plurality of sample shots positioned approximately at the same distance from the center of the point symmetry on the wafer, i.e., the plurality of shot areas positioned on the same circle having the center of the point symmetry. Therefore, when a plurality of shot areas are positioned on the circle having the center of the point symmetry the weighting and the statistical calculation are performed only in one of those shot areas so as to obtain the error parameters ($\Theta$, w, $\Gamma$x, $\Gamma$y, $O_X$, $O_Y$, $\theta$, w, rx, ry) and the calculated error parameters can be used for the remaining shot areas to determine the chip rotation, the chip rectangular degree, the chip magnification error and the coordinate positions. As a result, the calculation amount can be reduced.

In order to realize the preferable alignment of sample shots in the W2-EGA method, it is desirable to specify the sample shots so as to be symmetrical with respect to the center of the point symmetry of the nonlinear distortion, i.e., the wafer center wc and, e.g., to specify the sample shots in the X-shape or the cross shape on the basis of the wafer center Wc. Besides, the same arrangement in the W1-EGA method may be preferable. When the center of the point symmetry of the nonlinear distortion is not the wafer center Wc, the arrangement of the sample shots may be in the X shape or the cross shape on the basis of the center of the point symmetry.

Also, when determining the values of the error parameters, the weighted function in the equation (21) may be provided independently for the X and Y directions. Besides, it is needless to say that the weighted function may be provided for each alignment mark.

In the W1-EGA method and the W2-EGA method, when correcting the rotation error and the magnification error based on the four error parameters ($\theta$, w, rx, ry), the corrections may be performed for each shot area by using the parameters obtained for each shot area. Also, a set of parameters obtained for each shot area may be averaged to obtain a set of parameters based on which corrections may: be performed at a time for the whole of the wafer. Further, the wafer may be divided into a plurality of blocks and the corrections may be performed for each block. Furthermore, according to the W2-EGA method, in the shot areas positioned on the concentric circle with respect to the center of the point symmetry, there is no need to obtain the parameters for each shot area and the parameters may be obtained for one of those shot areas.

Figure 15:
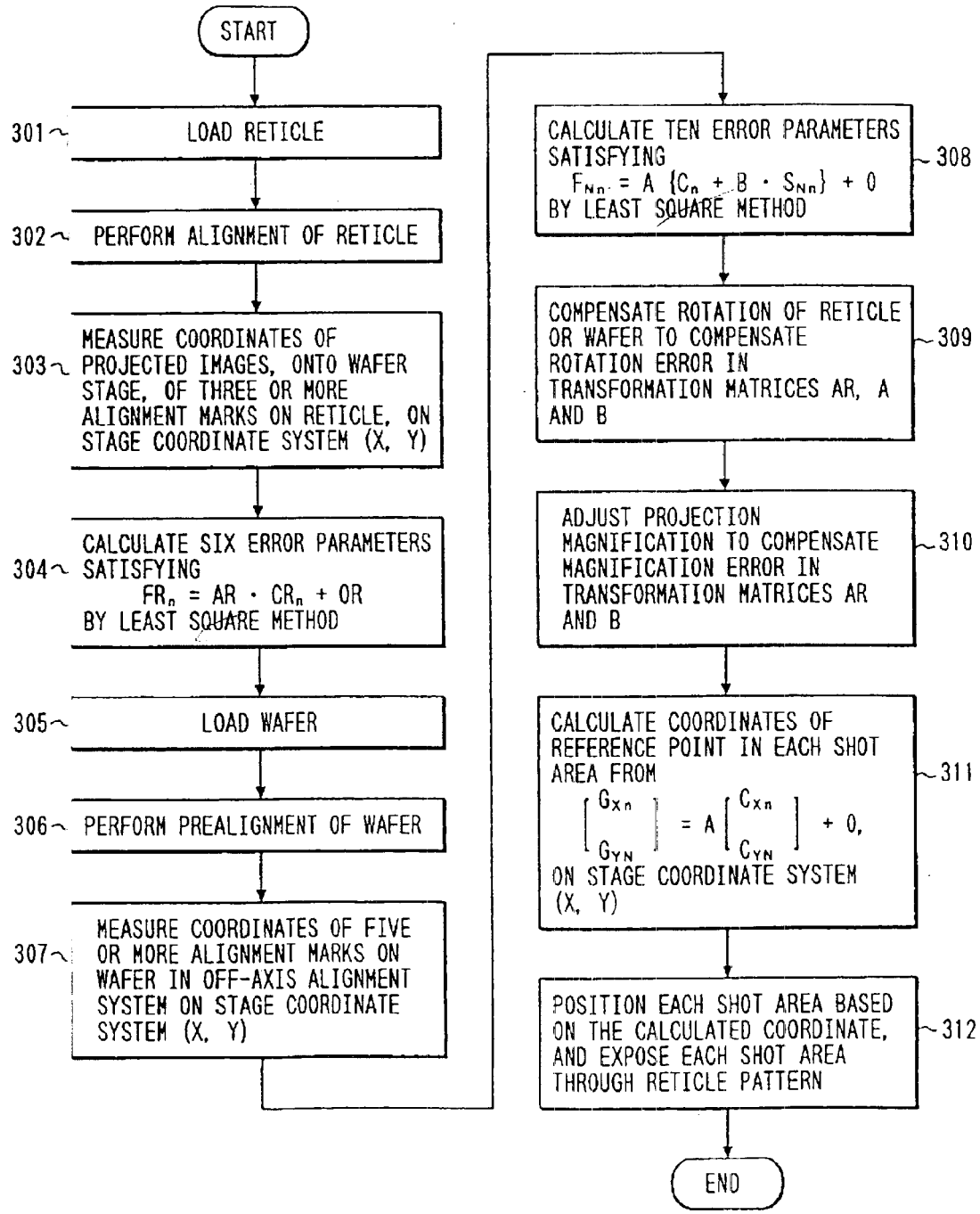
FIG. 15 is a flow-chart showing alignment operation and exposure operation in a sixth embodiment of the present invention.

Next, referring to FIGS. 15 to 17, explanation will be made of a sixth embodiment of the present invention. In this embodiment, the positional alignment (or superposition) between the pattern image of the reticle 2 and the chip pattern on the wafer 8 is to be carried out even in consideration with an error in the rotation of the reticle 2 and/or an error in the magnification of the projection optical system 7. It is noted that the explanation will be made on the premise that the use of the projection and exposure device shown in FIG. 2 is also used in this embodiment.

Figure 16A:
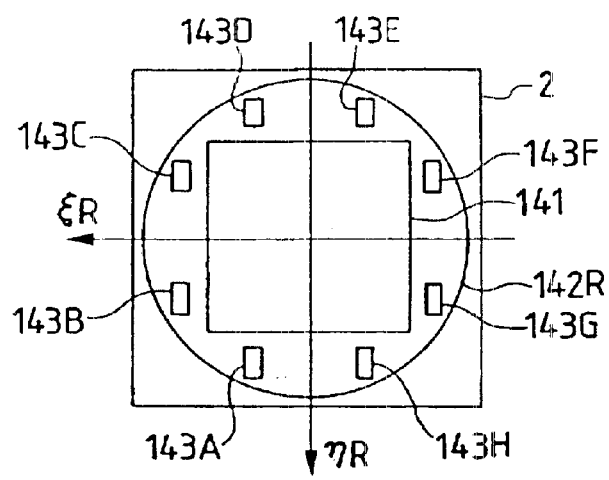
FIG. 16A is a view illustrating a pattern arrangement of a reticle used in the sixth embodiment.

Referring to FIG. 16A which shows the structure of the reticle 2 used in this embodiment, an exposure circuit pattern 141 is formed in the center part of the reticle 2, and eight identical alignment marks 143A to 143H are also formed in the image field 142R of the projection optical system 7 around the circuit pattern 141. The positions of the alignment marks 143A to 143H are beforehand determined in the rectangular coordinate system ($\xi$R, $\eta$R) having its origin point (O, O) located at the center of the reticle 2. In addition to the alignment marks 143A to 143H, alignment marks for positioning the reticle 2 on the reticle stage 3 are formed on the reticle 2 although they are not shown.

Figure 16B:
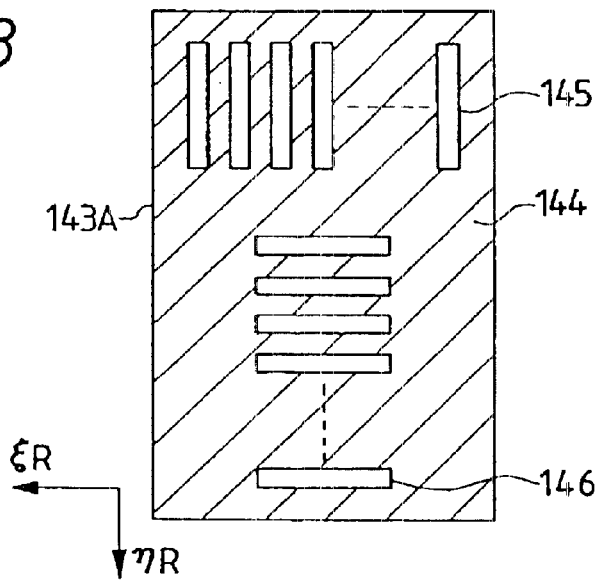
FIG. 16B is a view illustrating the structure of an alignment mark on the reticle.

Referring to FIG. 16B which shows the shape of the alignment mark 143A, the alignment mark 143A is the one in which a line and space pattern 145 composed of a plurality of opening patterns laid in the direction $\xi$R and a line and space pattern 146 composed of a plurality of opening patterns laid in the direction $\eta$R, are formed in a shading film 144. With the use of these line and space patterns 145, 146, the positions of the alignment mark 143A in the directions $\xi$R, $\eta$R are designated. It is noted that the other alignment marks 143B to 143H also has the same shape as that of the alignment mark 143A. Further, patterns conjugate with the line and space patterns 145, 146 shown in FIG. 16B are formed in the slit plate of the photoelectric sensor PS shown in FIG. 2.

Next, explanation will be made of exposure operation of this embodiment with reference to the flow-chart shown in FIG. 15. After the reticle 2 is loaded on the reticle stage 3 at step 301, at step 302, the reticle 2 is aligned. That is, with the use of an alignment microscope (which is not shown), as disclosed in U.S. Pat. No. 4,710,029, the alignment marks on the reticle 2 (which are different from the alignment marks 143A to 143H shown in FIG. 16B), are detected so as to position the reticle 2 in order to align the center of the reticle 2 with the optical axis 7a of the projection optical system 7.

Thereafter, at step 303, the coordinate positions of the projected images of more than three of the eight alignment marks 143A to 143H in the stage coordinate system (X, Y) are measured.

Figure 17:
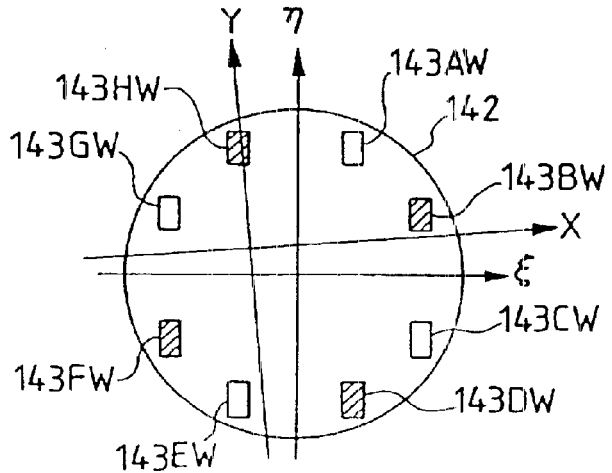
FIG. 17 is a view illustrating a projected image of the reticle shown in FIGS. 16A and 16B.

Referring to FIG. 17 which shows the images of the alignment marks 143A to 143H projected onto the wafer stage 10 from the reticle 2, the images 143AW to 143HW of the eight alignment marks are projected in the exposure field 142 of the projection optical system 7. Further, the image of the coordinate system ($\xi$R, $\eta$R) projected onto the wafer stage 10 from the reticle 2 in an ideal image forming condition the projection optical system 7 is shown by the coordinate system ($\xi$, $\eta$). In this embodiment, designed arrangement coordinates (CR$\xi_{Xn}$, CR$\eta_{Yn}$, n=1 to 8) of the alignment marks 143A, 143H in the coordinate system ($\xi$R, $\eta$R) on the reticle 2 are converted into arrangement coordinates (CR$_{Xn}$, CR$_{Yn}$) of the alignment mark images 143AW to 143HW in the coordinate system ($\xi$, $\eta$) on the wafer stage 10. Further, the arrangement coordinates of the alignment mark images 143A to 143H are denoted by (FR$_{Xn}$, FR$_{Yn}$).

In this case, since the reticle 2 has the following error factors with respect to the stage coordinate system (X, Y), the arrangement coordinates (CR$_{Xn}$, CR$_{Yn}$) do not coincide with the arrangement coordinates (FR$_{Xn}$, FR$_{Yn}$)

(1) The rotation of the Reticle 2:

This causes an Error $\Theta_R$ in residual rotation of the reticle converted into the wafer side, in the coordinate system ($\xi$, $\eta$), with respect to the stage coordinate system (X, Y);

(2) The Orthogonal Degree of the Reticle Coordinate System ($\xi$, $\eta$):

This causes an orthogonal degree error $W_R$ since the patterns in the $\xi$-axis and the $\eta$-axis are not precisely orthogonal to each other due to errors in depiction;

(3) Errors in Magnification of in the Directions $\xi$, $\eta$ in the Reticle Coordinate System ($\xi$, $\eta$):

These are caused by an error in the length of a pattern on the reticle 2, or caused by a deviation (for example ⅕) of the projection magnification of the projection optical system 7 from its designed value. These errors are denoted by magnification errors RRx, RRy, respectively in the directions $\xi$, $\eta$. It is noted that the magnification error RRx in the direction $\xi$ is exhibited by the ratio between measured and designed values of the distance between two alignment marks on the wafer stage in the direction $\xi$, and the magnification error RRy in the direction $\eta$ is exhibited by the ratio between measured and designed values of the distance between two alignment marks on the wafer stage in the direction $\eta$.

(4) Offset of the Reticle Coordinate System ($\xi$, $\eta$) with Respect to the Stage Coordinate System (X, Y):

This is caused by such a fact that the projected image of the reticle 2 is slightly deviated with respect to the wafer stage 10 as a whole, and is denoted by offset errors OR$_x$, OR$_y$.

In the case of the above-mentioned error factors (1) to (4) being concerned, the coordinate value ($FR_{Xn}$, $FR_{Yn}$) on the stage coordinate system (X, Y) of the alignment mark image having the designed coordinate value ($CR_{Xn}$, $CR_{Yn}$) can be expressed as follows:

$$\begin{pmatrix} FR_{Xn} \\ FR_{Yn} \end{pmatrix} = \begin{pmatrix} RRx & 0 \\ 0 & RRy \end{pmatrix}\begin{pmatrix} \cos\Theta_R & -\sin\Theta_R \\ \sin\Theta_R & \cos\Theta_R \end{pmatrix}\begin{pmatrix} 1 & -\tan W_R \\ 0 & 1 \end{pmatrix}\begin{pmatrix} CR_{Xn} \\ CR_{Yn} \end{pmatrix} + \begin{pmatrix} OR_X \\ OR_Y \end{pmatrix} \quad (22)$$

Estimating that the orthogonal degree error $W_R$ and the residual rotation error $\Theta_R$ are very small, equation (22) is subjected to a first order approximation carried out so as to obtain:

$$\begin{pmatrix} FR_{Xn} \\ FR_{Yn} \end{pmatrix} = \begin{pmatrix} RRx & -RRx(W_R+\Theta_R) \\ RRy\cdot\Theta_R & RRy \end{pmatrix}\begin{pmatrix} CR_X \\ CR_{Yn} \end{pmatrix} + \begin{pmatrix} OR_x \\ OR_Y \end{pmatrix} \quad (23)$$

Next, matrices and vectors are substituted with matrices FRn, ARn and vectors CRn, OR as follows:

$$FRn = \begin{pmatrix} FR_{Xn} \\ FR_{Yn} \end{pmatrix}, \quad AR = \begin{pmatrix} RRx & -RRx(W_R+\Theta_R) \\ RRy\cdot\Theta_R & RRy \end{pmatrix} \quad (24)$$

$$CRn = \begin{pmatrix} CR_{Xn} \\ CR_{Yn} \end{pmatrix}, \quad OR = \begin{pmatrix} OR_x \\ OR_Y \end{pmatrix}$$

Accordingly, equation (23) is exhibited as follows:

$$FRn = AR\cdot CRn + OR \quad (25)$$

The purpose of the this embodiment is to obtain four errors RRx, RRy, $W_R$, $\Theta_R$ (which will be sometimes denoted as "error parameters") in the matrix AR in the equation (25), and two offset errors $OR_x$, $OR_y$ in the vector OR. For example, an EGA type calculating technique as disclosed in U.S. Pat. No. 4,780,617 or U.S. Pat. No. 4,833,621 can be used for this purpose. That is, since the number of error parameters is six, the coordinate positions of more than three of the alignment mark images 143AW to 143HW in the stage coordinate system (X, Y) are measured, and the values of the six error parameters are obtained in such a way that the sum of squares of the measured coordinate positions and calculated coordinate positions given by equation (25) are minimized by these six parameters.

It is noted that each of the alignment marks 143AW to 143HW is a two-dimensional mark in combination of two one-dimensional marks, and accordingly, although more than three of the alignment marks are used in this embodiment, the positions of more than six alignment marks have to be measured if only one-dimensional marks are selected. Further, such a condition that more than three alignment mark images selected from a group consisting of the alignment mark images 143AW to 143HW shown in FIG. 17 are not on one and the same line is required. Further, it is desirable that the alignment mark images from which coordinate positions are measured are uniformly distributed without deviation. For example, they are preferably distributed with point symmetry with respect to the optical axis 7.

Accordingly, at step 303, the coordinate positions, in the stage coordinate system (X, Y), of four alignment mark images 143BW, 143DW, 143FW, 143HW which are substantially point-symmetric with respect to the optical axis 7a, as shown by oblique lines, are measured. In this case, an X-Y plane is scanned with the photoelectric sensor PS shown in FIG. 2 so as to obtain a position where a photoelectrically converted signal which is obtained from the photoelectric sensor PS at every alignment mark becomes maximal. Thereafter, at step 304, completely similar to the conventional EGA type technique, the least square method is used for obtaining values of the six parameters (RRx, RRy, $W_R$, $\Theta_R$, $OR_x$, $OR_y$) which satisfy equation (25).

It is noted that although the six parameters are calculated with the use of the EGA type calculation technique in this embodiment, the above-mentioned W1-EGA type or W2-EGA type calculation technique can be applied for calculating the six error parameters. In this case, each of measured data (coordinate positions) of a plurality of alignment mark images shown in FIG. 17 is weighed in accordance with, for example, a distance from the center of the reticle 2 to an alignment mark, and thereafter, the six parameters which satisfy equation (18) or (20) are obtained with the use of a least square method.

Further, in a certain case, the orthogonal degree error $W_R$ is neglected (regarded as zero), and the magnification errors RRx, RRy can be sometimes commonly substituted by an averaged value RR (=(RRx+RRy)/2). In this case, the matrix AR in equation (25) can be approximated as follows:

$$AR = RR\begin{pmatrix} 1 & -\Theta_R \\ \Theta_R & 1 \end{pmatrix} \quad (26)$$

In this equation (26), since the number of error parameters is reduced to four, the number of alignment mark images to be measured for the application of the least square method can be more than two in the case of the two-dimensional marks.

Next, at step 305, the wafer 8 shown in FIG. 4A is loaded on the wafer holder 9. Chip patterns have been already formed in the shot areas on the wafer 8, respectively, during the previous process step. Then, at step 306, an original point is set for the wafer 8 (prealignment), and further at step 307, with the use of the off-axis type alignment system 15, the coordinate values ($FM_{NXn}$, $FM_{NYn}$), in the stage coordinate system (X, Y), of more than five alignment marks (29-n, 30-n, 34-n, or 35-n) on the wafer 8 are measured. In this embodiment, although the actually measured alignment marks are required to be selected from more than three shot areas 27-n, it is not always necessary to select four alignment marks from one shot area, but it is sufficient to select at least one alignment mark for each of the shot areas.

It is noted that the designed arrangement coordinate values ($C_{Xn}$, $C_{Yn}$), in the coordinate system ($\alpha$, $\beta$) on the wafer 8, of the reference points 28-n in the plurality of shot areas 27-n selected on the wafer, and the designed coordinate values (relative coordinate values) ($S_{NXn}$, $S_{NYn}$), in the coordinate system (x, y) on the shot-areas 27-n, of the alignment marks have been previously known. Accordingly, completely similar to the first embodiment, at step 308, by substituting the designed arrangement coordinate values ($C_{Xn}$, $C_{Yn}$) on the reference points in the shot areas to which the measured alignment marks belong, and the designed relative coordinate values ($S_{NXn}$, $S_{NYn}$) relating to the reference points of the alignment marks into the right side of equation (15), calculated coordinate values ($F_{NXn}$, $F_{NYn}$) with which the alignment marks should be on the stage coordinate system (X, Y) are obtained.

Further, ten error parameters ($\Theta$, W, $\Gamma x$, $\Gamma y$, $O_X$, $O_Y$, $\theta$, w, $\gamma x$, $\gamma y$) which satisfy equation (17) are obtained by a least square method. Specifically, differences ($E_{NXn}$, $E_{NYn}$) between the measured coordinate values ($FM_{NXn}$, $FM_{NYn}$) and the calculated coordinate values ($F_{NXn}$, $F_{NYn}$) thereof are regarded as alignment errors. Further, the sums of squares of five groups, that is, more than 10 alignment errors ($E_{NXn}$, $E_{NYn}$) are partially differentiated by ten error parameters, respectively, and the equations are established so that each of their values becomes zero. Further, ten established simultaneous equations are solved in order to obtain ten error parameters.

Next, at step 309, with the use of the rotation error $\Theta_R$ of the reticle in the transforming matrix AR in equation (25) as a reference value, the sum ($\Theta+\theta$) where $\Theta$ is a wafer rotation in the transforming matrix A in equation (16), and $\theta$ is a chip rotation in the transforming matrix B in equation (16) is adjusted to the rotation error $\Theta_R$. Therefore; the wafer 8 is rotated by the wafer stage 10 while the running direction of the wafer stage 10 is set to be oblique so as to be adjusted to the rotation of the reticle 2. It is noted that the reticle 2 can be rotated, instead of the rotation of the wafer 8.

However, if the wafer 8 is rotated, since offset errors ($O_X$, $O_Y$) of the wafer 8 vary, after the coordinate values of the alignment marks are measured again, the error parameters have to be again obtained with the use of the conventional EGA computation. Accordingly, for example, in the case of the rotation of the wafer 8 by a predetermined angle, the coordinate positions, in the stage coordinate system (X, Y), of alignment marks in at least three shot areas on the wafer 8 are measured. Further, from the result thereof, six error parameters ($\Theta$, W, Rx, Ry, $O_X$, $O_Y$) are obtained, and shot areas are positioned in accordance with arrangement coordinates calculated from these six error parameters, thereby the exposure is carried out. This can be also used for confirming whether a new residual rotation error $\Theta$ after the rotation of the wafer 8 has a value which corresponds to the rotated angle at step 309 or not.

Further, the orthogonal degree error $W_R$ of the reticle 2 and the orthogonal degree error w of the chip can not be strictly compensated for, but these errors can be restrained to be small by rotating the wafer 8. Further, the degree of rotation of the reticle 2 can be optimized so as to minimize the sum of the absolute values of the rotation error $\Theta$ of the wafer 8, the rotation error $\theta$ of the chip and the orthogonal degree error w.

Next, at step 310, the projection magnification of the projection optical system 7 is adjusted through the intermediary of the image-forming characteristic control device 14 so that magnification errors RRx, RRy of the projected image of the reticle 2 in the transforming matrix AR in equation (25), and the chip scaling errors rx, ry in the transforming matrix B in equation (16) are compensated for. For this purpose, if a pattern on the first layer is exposed onto the wafer 8, the projection magnification can be adjusted so that the magnification errors RRx, RRy are precisely adjusted to zero. In a condition in which the magnification errors RRx, RRy become precisely zero, the projected image of the pattern of the reticle 2 by the projection optical system 7, has a size equal to a designed value. Meanwhile, if pattern images of the reticle 2 on layers subsequent to the second layer are exposed, the projection magnification of the projection optical system 7 is compensated with the use of the chip scaling errors rx, ry as references. Accordingly, the size of the projected image of the reticle 2 becomes equal to that of a chip pattern which has been already formed on the wafer 2.

It is noted that as shown in FIG. 17, since the alignment mark images 143Aw to 143HW of the reticle 2 in this embodiment are sometimes formed outside of a rectangular exposure area within the exposure field 142 of the projection optical system 7, the measurement of the magnification of the projection optical system 7 is greatly affected by distortion. Accordingly, with the use of a reference reticle with which alignment mark images have been previously projected within the exposure area, the offset compensation for the projection magnification of the projection optical system 7 can be made so as to allow the magnification of the projected image of this reference reticle to be equal to the designed value. In this case, the compensation of the projection magnification of the projection optical system 7 during the exposure of the pattern on the first layer, is not necessary.

Thereafter, at step 311, with the use of the transforming matrices A and O including elements composed of error parameters obtained at step 308, by substituting the designed arrangement coordinate values ($C_{Xn}$, $C_{Yn}$) of the reference points 28-n of the respective shot areas 27-n, on the wafer 8 into equation (12), the calculated arrangement coordinate values ($G_{Xn}$, $G_{Yn}$) of the reference points 28-n in the stage coordinate system (X, Y) are obtained. However, if the wafer 8 is rotated in order to compensate the rotation error at step 305, the calculated arrangement coordinate values ($G_{Xn}$, $G_{Yn}$) of the reference points 28-n in the stage coordinate system (X, Y) are obtained from the coordinate values of the remeasured alignment marks.

Further, at step 312, with the use of the thus calculated arrangement coordinate values ($G_{Xn}$, $G_{Yn}$) and a previously obtained base line value, the reference points 28-n of the shot areas 27-n on the wafer 8 are positionally aligned successively with predetermined positions in the exposure field of the projection optical system 7, and then, the pattern image of the reticle 2 is transferred onto the shot areas 27-n. Further, after the exposure for all shot areas on the wafer 8 is completed, the development and the like are carried out for the wafer 8.

In this embodiment, as shown in equations (25) and (17), since not only the transforming matrices A and O but also the parameters such as the rotation error of the reticle, the magnification error of the reticle, the chip rotation and the chip scaling error, and the like are taken into consideration, the effects of the rotation error of the reticle 2, the magnification error of the projection optical system 7, the expansion and contraction, and the rotation of the chip patterns themselves, can be restrained to be small, and further, the projected images of chip patterns and the reticle pattern in the shot areas on the wafer can be superposed with each other over their entire surfaces.

It is noted that although multi-point measurement is carried out in the respective shot areas on the wafer 8 in this embodiment, the position of a specific one mark in each of the shot areas can be detected by directly applying the usual EGA type technique. In this case, the transforming matrix B in equation (17) is neglected, and further, for example the wafer rotation $\Theta$ is adjusted to the rotational error $\Theta_R$ of the reticle.

Further, in this embodiment, no positive compensation for the orthogonal degree error of the reticle 2 is carried out. However, for example, a part of lenses constituting the projection optical system 7, have toroidal surfaces, and further, a mechanism for rotating the lenses around the optical axis, is provided, with which the lenses can be rotated so as to minimize the orthogonal degree error $W_R$ of the projection image. With this arrangement, the orthogonal degree error $W_R$ caused by a depiction error or the like of the reticle 2 can be made to be small.

Further, in this embodiment, during compensation of the reticle rotation, or during compensation of the magnification of the projected image of the reticle (compensation with pattern exposure subsequent to the second layer), the rotation, and the expansion and contraction of the wafer and the chip are taken into consideration. However, if it is found that the magnification error, the rotation errors and the like are very small, from printed conditions of wafers in one and the same lot, to which the exposure process has been completed, and so forth, the compensation of the rotation of the reticle or the compensation of the projection magnification of the projection optical system 7 can be made only by use of the result of the measurement (EGA measurement) based upon equation (25).

Further, although the alignment system (equations (17) or (10)) as explained in the first embodiment, is used from steps 303 to 311, any of the EGA type technique as disclosed in the U.S. Pat. No. 4,780,617, the W1-EGA type technique or W2-type EGA technique which have been explained in the fifth embodiment, can be also used.

Further, although the coordinate positions, in the stage coordinate system (X, Y), of the alignment marks on the reticle are measured with the use of the photoelectric sensor PS (refer to FIG. 2) disclosed in the U.S. Pat. No. 4,629,313 at step 305 in FIG. 15 the coordinate positions of the alignment marks on the reticle can be measured with the use of the system disclosed, for example, in U.S. Pat. No. 4,780,616.

In addition to the step and repeat type exposure apparatus (e.g., the reduction projecting type stepper, isometric magnification projection type stepper), the present invention is applicable to the step and scan type exposure apparatus or the proximity type stepper (X-ray exposure apparatus or the like). Furthermore, the present invention is applicable to an inspecting apparatus (defect inspector, prober or the like) for inspecting a semiconductor wafer or a reticle with a plurality of chip patterns, wherein alignment is performed by the step and repeat method for each chip with respect to the reference position such as the inspection visual field, the probe needle or the like.

When applying the above alignment method to the scan type exposure apparatus such as the step and scan type exposure apparatus, a wafer is positioned to a position determined by adding a predetermined offset (the value to be determined unconditionally in accordance with the pattern size, the approach run area of the reticle and the wafer, or the like) to the coordinate position obtained in the above embodiments and thereafter the scan exposure is effected.

Next, a seventh embodiment of the present invention will be described with reference to FIGS. 18 to 24.

Figure 19:
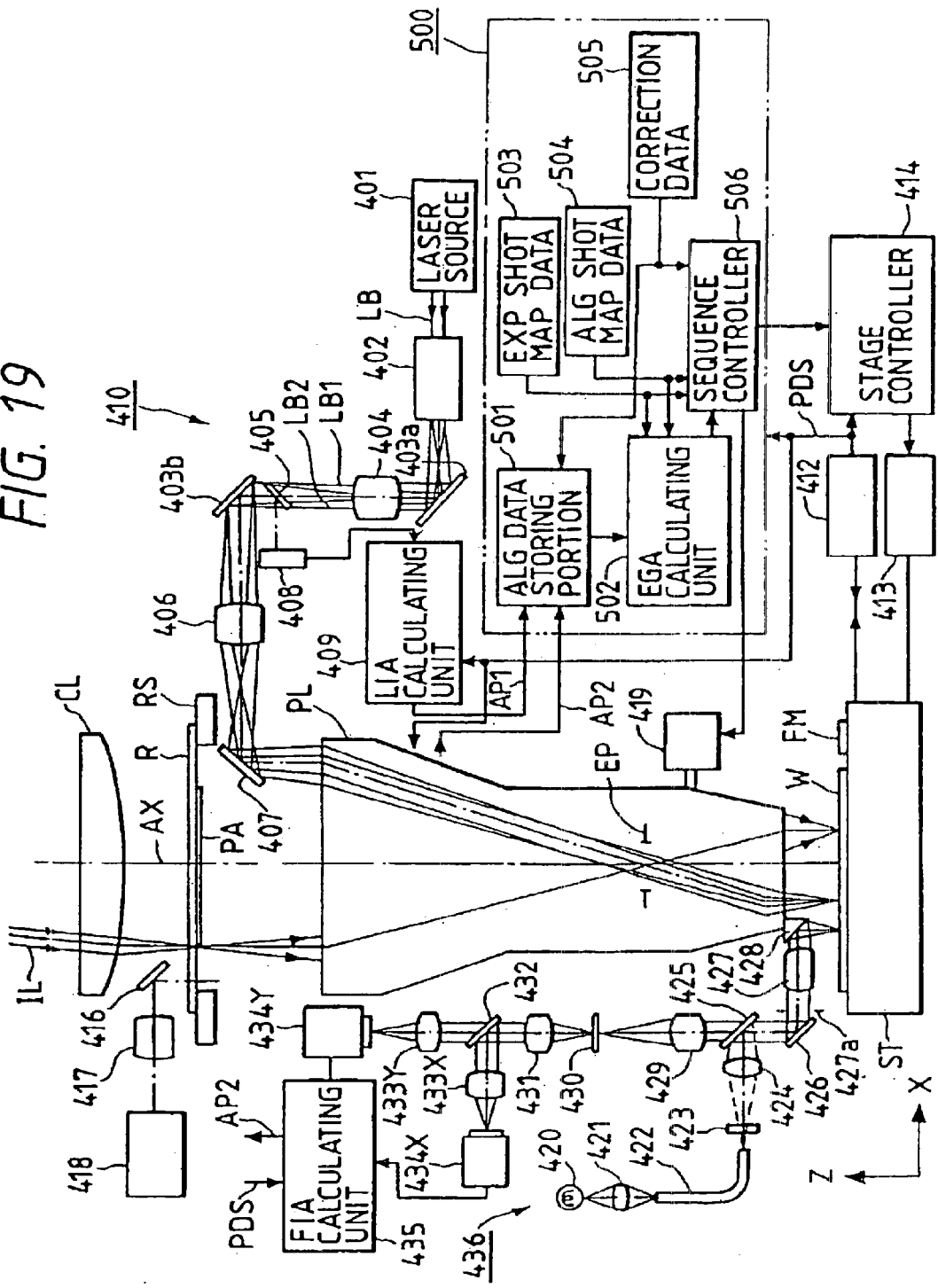
FIG. 19 is a structural diagram illustrating an essential portion of a projection exposure apparatus used in the seventh embodiment.

FIG. 19 illustrates an essential portion of a projection exposure apparatus which is provided with an alignment device to be used in the seventh embodiment. Referring to FIG. 19, an illumination light for exposure (g-ray and i-ray of a mercury-arc lamp for ultraviolet pulse ray from an excimer laser source) IL irradiates a pattern area PA of a reticle R with a uniform distribution of illuminance intensity through a condenser lens CL. The illumination light IL passing through the pattern area PA enters a projection optical system PL which is telecentric on both sides (or one side) and reaches a wafer W. The projection optical system PL is compensated to have an optimal aberration with respect to a wavelength of the illumination light IL, and the reticle R and the wafer W are conjugate with each other under the compensated wavelength. Description will now be made on a case where the Z axis is taken in parallel to the optical axis AX of the projection optical system PL, the X axis is taken in parallel to the sheet surface of FIG. 19 on a plane perpendicular to the Z axis, and the Y axis is taken in parallel to the sheet surface of the FIG. 19.

Now, the reticle R is supported by a reticle stage RS which is finely movable two-dimensionally, and the reticle R is positioned with respect to the optical axis AX of the projection optical system PL by detecting a reticle alignment mark formed in the circumference of the reticle R by the use of a reticle alignment system which comprises a mirror 416, an objective lens 417, and a mark detection system 418. On the other hand, the wafer W is mounted on a wafer stage ST which is two-dimensionally moved by a driving system 413, and a coordinate value of the wafer stage ST is successively measured by an interferometer 412. A stage controller 414 controls the driving system 413 on the basis of the measured coordinate value and the like from the interferometer 412 so as to control a movement or positioning of the wafer stage ST. A reference mark FM which is used for base line measurement or the like is provided on the wafer stage ST. The baseline measurement is to measure a distance (base line) between the center of detection of an alignment sensor and the center of the exposure field of the projection optical system PL. In this embodiment, this base line is obtained in advance.

Next, description will be made of a wafer mark serving as an alignment mark which is attached in each shot area on the wafer W.

Figure 20A:
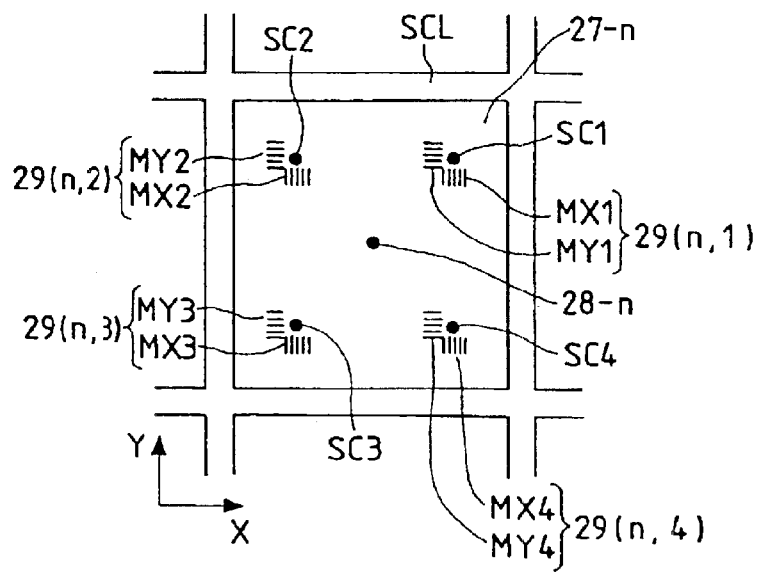
FIG. 20A is an enlarged plan view illustrating a shot area and a wafer mark on the wafer.

FIG. 20A shows a positional relationship between one shot area 27-$n$ on the wafer W and pairs of wafer marks 29 (n, 1) to 29 (n, 4) attached in said shot area 27-$n$. In this FIG. 20A, the four sides of the shot area 27-$n$ are surrounded by a scribe line SCL. Then, four measuring points SC1 to SC4 are set at the apexes of a substantially square form of the shot area 27-$n$, and the pairs of wafer marks 29 (n, 1) to 29 (n, 4) are respectively formed in the vicinity of the measuring points SC1 to SC4. In this embodiment, the pair of wafer marks 29 (n, 1) in the vicinity of the measuring point SC1 is comprised of a wafer mark MX1 arranged at a predetermined pitch in the X direction and a wafer mark MY1 arranged at a predetermined pitch in the Y direction. In the same manner, the pairs of wafer marks 29 (n, 2) to 29 (n, 4) are comprised of wafer marks MX2 to MX4 for the X axis and wafer marks MY2 to MY4 for the Y axis. The wafer marks MX1 to MX4 have the same configuration, while the wafer marks MY1 to MY4 have also the same configuration.

The reference mark 28-$n$ at the center of the shot area 27-$n$ is on the optical axis AX of the projection optical system PL in the exposure mode. Then the centers of, for example, the wafer marks MX1 and MY1 are positioned on straight lines which respectively pass through the measuring point SC1 and are extending in the X and Y directions. The wafer mark MX1 is used for detecting the position of the measuring point SC1 in the X direction, while the wafer mark MY1 is used for detecting the position of the measuring point. SC in the Y direction. Each of the wafer marks MY1 and MX1 is a multi-mark which has a plurality of linear patterns arranged in parallel. In the same manner, the other pairs of the wafer marks 29 (n, 2) to 29 (n, 4) are used for detecting the positions of the measuring points SC2 to SC4, respectively.

Figure 20B:
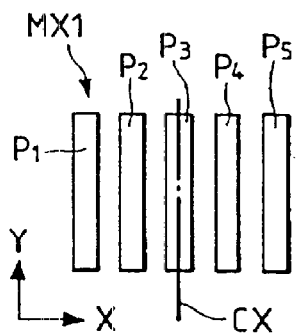
FIG. 20B is an enlarged plan view illustrating the wafer mark.
Figure 20C:
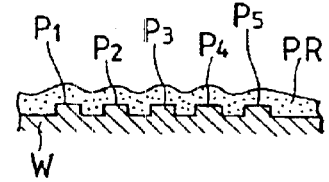
FIG. 20C is a cross-sectional view of the wafer mark shown in FIG. 20B.

FIG. 20B shows an enlarged view of the wafer mark MX1, as a representative example, in which five linear patterns $P_1$, $P_2$, $P_3$, $P_4$, and $P_5$ extending in the Y direction are arranged in the X direction at a substantially constant pitch. FIG. 20C shows a cross-sectional structure of said wafer mark MX1 in the X direction. In this FIG. 20C, each of five linear patterns $P_1$ to $P_5$ is formed in a convex form projecting from the ground of the wafer W, and the upper face thereof is coated with a photoresist layer PR. As also shown in FIG. 20B, a straight line which passes through the measuring point SC1 in the shot area 27-n and is in parallel to the Y axis is designed to pass through the center of the width of the central linear pattern $P_3$ of the wafer mark MX1. Note that the wafer mark MY1 has the same configuration, which is comprised of five linear patterns, and the center line of the central linear pattern is aligned with the center line of the measuring point SC1 in the Y direction.

In the present embodiment, since four pairs of wafer marks are provided in each shot area 27-n, an alignment by the EGA method of four points can be performed in the shot area.

Returning to FIG. 19, in this embodiment, there are provided an alignment sensor (hereinafter called the "FIA system") 436 of the FIA method (image pick-up method) of the off-axis system serving as the first alignment sensor and an alignment sensor (hereinafter called the "LIA system") 410 of the LIA method (laser interferometric alignment method) of the TTL system serving as the second alignment sensor. In this embodiment, the wafer marks MX1 to MX4 for the X axis shown in FIGS. 20A to 20C are subjected to the detection by the LIA system 410 for the X axis of the TTL system and the FIA system 436 of the off-axis system in common, while the wafer marks MY1 to MY4 for the Y axis are subjected to the detection by the LIA system (not shown) for the Y axis of the TTL system and the FIA system 436 of the off-axis system in common. Note that another wafer mark may be provided to be detected by the LIA sensor 410 separately from that to be detected by the FIA system 436. In this case, there occurs no problem if an amount of a positional deviation between the different kinds of wafer marks has been obtained in advance.

Next, a configuration of an alignment sensor will be described in full. First, in the LIA system 410, a laser beam LB from the laser source 401 is red monochromatic light such as He-Ne laser light and is non-photosensitive for the photoresist layer on the wafer W. This laser beam LB is incident on a heterodyne beam generation optical system 402 which includes an acoustic optical modulation element and the like, while two laser beams LB1 and LB2 which have slightly different frequencies and are interferable with each other are emitted at predetermined cross angles from the heterodyne generation optical system 402.

The emitted two laser beams LB1 and LB2 are once Fourier-transformed via a mirror 403a and a lens system 404, and then reversely Fourier-transformed via a mirror 403b and the objective lens 406. Then, the two laser beams are reflected by a mirror 407 which is arranged slantingly at an angle of inclination of 45° below the reticle R and enter the circumference of the field of view of the projection optical system PL. In this case, the mirror 407 is fixed to be outside the circumference of the pattern area PA of the reticle R and within the field of view of the projection optical system PL. Accordingly, the laser beams LB1 and LB2 crossing on the wafer W are positioned outside a projected image of the pattern area PA. In order to detect the position of an alignment mark (wafer mark) in the form of a diffraction grating attached in each shot area of the wafer W in the X direction by the use of this crossing pair of laser beams, design is made such that a pitch of the wafer mark and a cross angle of the two laser beams have a predetermined relationship so as to emit diffracted light in the same direction from said wafer mark.

Figure 22:
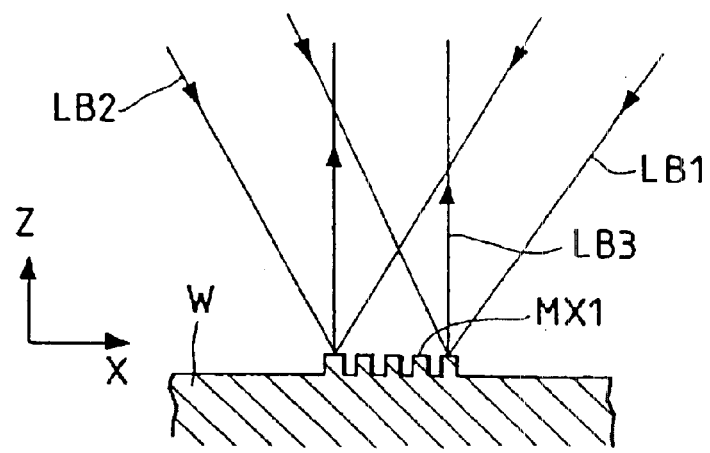
FIG. 22 is a diagram for explaining a principle of detection by an alignment sensor of the LIA method.

FIG. 22 shows a state in which the two laser beams LB1 and LB2 are applied symmetrically to the predetermined wafer mark MX1 on the wafer W. In this FIG. 22, a diffracted light LB3 consisting of +1st-order diffracted light of the laser beam LB1 and −1st-order diffracted light of the laser beam LB2 are emitted from the wafer mark MX1 perpendicularly upward. Since the laser beam LB1 and the laser beam LB2 are interferable with each other and have slightly different frequencies, the diffracted light LB3 is a heterodyne beam with a light intensity which changes using said difference in the frequency as a beat frequency. Also, since the phase of said diffracted light LB3 is changed in accordance with the position of said wafer mark MX1 in the X direction, the phase of a beat signal which is obtained by photoelectrically converting said diffracted light LB3 is compared with the phase of a beat signal which is obtained by photoelectrically converting, for example, a reference heterodyne beam so as to obtain the position of said wafer mark MX1 in the X direction with a extremely high resolution (e.g., in the order of a several nm).

Returning to FIG. 19, a diffracted light which is generated from the wafer mark on the wafer W substantially perpendicularly upward passes through the projection optical system PL, the mirror 407, the objective lens 406 and the mirror 403b, is reflected by a small-sized mirror 405 which is arranged between the two laser beams LB1 and LB2 on the incident side, and reaches a light-receiving element 408. A beat signal obtained by effecting photoelectrical conversion in the light-receiving element 408 is supplied to an LIA calculating unit 409, together with a position measurement signal PDS of the wafer stage ST from the interferometer 412. A reference beat signal which is obtained by photoelectrically converting the reference heterodyne beam generated in the heterodyne beam generation optical system 402 is also supplied to the LIA calculating unit 409. The LIA calculating unit 409 compares the phases of the two beat signals with each other to obtain the information $AP_1$ on the position of the wafer mark to be measured in the x direction, and supplies this information to a main control system 500.

In this connection, when, for example, the phase of the reference beat signal is aligned with the phase of the beat signal corresponding to the wafer mark, an X-coordinate of, for example, the wafer stage ST becomes the X-coordinate of the wafer mark as it is. When the phase of the reference beat signal deviates from that of the beat signal corresponding to the wafer mark, a coordinate value which is obtained by adding the X-coordinate of said wafer stage ST to a value converted from an amount of deviation of said phase into a displacement becomes an X-coordinate of said wafer mark. Also, since the phase of the beat signal is changed at, for example, a pitch cycle which is ½ of that of the wafer mark by 360°, it is required to position the wafer W in advance at a precision of, for example, at a pitch which is ½ of that the wafer mark by a search alignment (which is described later).

In the foregoing description, the laser source 401, the heterodyne beam generation optical system 402, the mirrors 403a and 403b, the lens system 404, the mirror 405, the objective lens 406, the mirror 407, the light-receiving element 408, the LIA calculating unit 409 and the projection optical system PL constitute the LIA system 410 for the wafer W. Note that this LIA system 410 is an alignment sensor for detecting the position of a wafer mark for the x axis, and there is also provided an LIA system (not shown in the figure) having the same configuration for detecting the position of the wafer mark in the Y direction for the Y axis.

Next, in the FIA system 436 serving as the first alignment sensor, a light having a wide band range generated from a halogen lamp 420 is converged onto one end surface of an optical guide 422 by a condenser lens 421. The light, after passing through the optical guide 422, passes through a filter 423 which cuts off a photosensitive wavelength (shortwave length) range of the photoresist layer and an infrared wavelength range, and reaches a half mirror 425. The illumination light reflected by this half mirror 425 enters an objective lens 427 after being reflected by a mirror 426 to be substantially horizontal, and is further reflected by a prism (mirror) 428 which is fixed in the vicinity of the lower portion of a lens barrel of the projection optical system PL so as not to shield the field of view of the projection optical system PL. The illumination light then irradiates the wafer W substantially perpendicularly. Though not shown in this figure, an appropriate illumination field stop is provided at a position conjugate with the position of the wafer W with respect to the objective lens 427 in an optical path from the emitting end of the optical guide 422 to the objective lens 427. The objective lens 427 is made as telecentric. An image of the emitting end of the optical guide 422 is formed on a surface 427a of an aperture stop (the same as the pupil) of the objective lens 427 so as to perform Köhler's illumination. Design is made so that the optical axis of the objective lens 427 is fixed to be perpendicular on the wafer W, and no deviation is caused in the mark position due to falling of the optical axis when the mark is detected.

The reflected light from the wafer W passes through the objective lens 428 and the half mirror 425, and is imaged on an index plate 430 by the lens system 429. This index plate 430 is provided to be conjugate with the wafer W by the use of the objective lens 427 and the lens system 429, and is provided with index marks each in the form of a straight line and projecting in the X and Y directions, respectively, in a rectangular transparent window. Accordingly, the image of the wafer mark on the wafer W is formed in the transparent window of the index plate 430. Light beams from the wafer mark image and the index marks pass through a first relay system 431 and enter the half mirror 432. Each of the light beams is split into two beams by the half mirror 432, so as to form images on image pick-up elements 434X and 434Y of a CCD camera, or the like, respectively, through a second relay system 433X and the SSY. Image pick-up signals from the image pick-up elements 434X and 434Y are supplied to the FIA (field image alignment) calculating unit 435, together with a position measurement signal PDS from the interferometer 412. Deviation of the wafer mark image with respect to the index mark on the index plate 430 is calculated by the FIA calculating unit 435 on the basis of the waveforms of the image pick-up signals. In this case, the position of the wafer mark in the X direction is detected by processing the image pick-up signal from the image pick-up element 434X for the X axis, while the position of the wafer mark in the Y direction is detected by processing the image pick-up signal from the image pick-up element 434Y for the Y axis.

Figure 21:
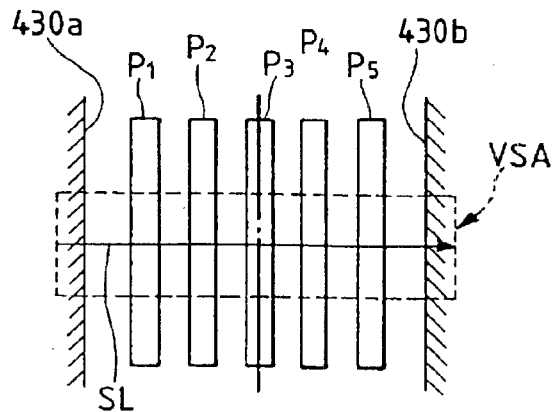
FIG. 21 is a view illustrating an image observed by an alignment sensor of the FIA method.

FIG. 21 shows the wafer mark MX1 detected by the image pick-up element 434X for the X axis. As shown in FIG. 21, the wafer mark MX1 to be detected is positioned between the index marks 430a and 430b on the index plate 430 (see FIG. 19), and the accurate position XA of the wafer stage ST in the X direction at that time is calculated. The image pick-up element 434X electrically scans the five linear patterns $P_1$ to $P_5$ of the wafer mark MX1 and an image by the index marks 430a and 430b along a scan line SL. In this case, when there is only one scan line, for example, it is disadvantageous in terms of an SN ratio so that levels of image pick-up signals which can be obtained by a plurality of horizontal scan lines supplied to a video sampling area VSA indicated by a broken line may be weighted-averaged for each pixel in the horizontal direction. Each image pick-up signal has rising and falling waveform portions on its both sides for each of the index marks 430a and 430b.

The positions $XR_1$, $XR_2$ of these portions (the positions on the pixel) have been obtained in advance, and the position $XR_0$ of the median thereof has been also obtained.

On the other hand, since the image pick-up element 434X photoelectrically detects a bright field image of the wafer mark MX1, a light to return to the objective lens 427 is extremely decreased by scattering of the light in the right and left step edges of each of the five linear patterns $P_1$ to $P_5$. For this reason, the right and left edges of each of the linear patterns $P_1$ to $P_5$ are image-picked up as black lines. As a result, a waveform of the image pick-up signal has its bottom at a position corresponding to the right edge or the left edge of each linear pattern.

The FIA calculating unit 435 calculates the position Xm of the center (the straight line CX) of the wafer mark MX1 (the patterns $P_1$ to $P_5$) in the X direction on the basis of such waveform. More specifically, after calculating the central position of each of the patterns $P_1$ to $P_5$ on the basis of the right and left edge positions, the FIA calculating unit 435 adds up the positions of the five linear patterns $P_1$ to $P_5$ and divides the sum by 5, thereby detecting the mark position in the X direction to serve as the center.

Then, the FIA calculating unit 435 calculates a difference $\Delta XF(=XR_0-X_m)$ between the position $XR_0$ which has been obtained in advance and the mark measuring position Xm, and supplies a value which is obtained by adding the difference $\Delta XF$ to a position at which the wafer stage T is positioned to the main control system 500 as mark position information AP2.

Further, in the FIA system 436, the illumination light of the wafer W passing through the filter 423 illuminates a local area (smaller than a shot area) including a wafer mark on the wafer W with a substantially uniform intensity of illuminance, and the wavelength range is determined to be 200 nm or around.

Then, the FIA system 436 is constituted by the components from the halogen lamp 420 to the FIA calculating unit 435, in the order of reference numeral. Since the light in the wavelength band range of 200 nm or around passes through a telecentric image forming optical system which comprises the objective lens 427, the lens system 429, the relay systems 431 and 433X (or 433Y), it is clearly required to compensate a color aberration corresponding thereto. Further, it is preferable that the numerical aperture (N.A.) on the wafer side of the objective lens 427 be smaller than the numerical aperture of the projection optical system PL.

In the present embodiment, a part of an observation field range of the objective lens 427 is slipped into a lower surface of the lens barrel of the projection optical system PL by a prism 428 so as to be close to the field of view of the projection optical system PL as much as possible. In general, a projection exposure apparatus of this type is provided with a focus sensor for detecting a gap (deviation) between an image forming plane of the projection optical system PL and the surface of the wafer W accurately, and a leveling sensor for detecting a relative inclination between the plane of a shot area on the wafer W and the image forming plane of the projection optical system PL. These focus sensor and leveling sensor are arranged to apply a light flux of infrared range in a slanting manner onto the wafer W in which the projection field of the projection optical system PL exists and to perform focusing and leveling in order to obtain a deviation in a light-receiving position of the light reflected therefrom. In this connection, if the numerical aperture of the objective lens 427 is small, the depth of focus of the objective lens 427 is deepened. If a focusing is effected based on a result of detection by said focus sensor, the detection is performed also by the FIA system 436 in an in-focus state.

In the structure shown in FIG. 19, since the center of detection of the FIA system 436 of the off-axis system (a position of a conjugate image at the center of the index plate 430) is separated from the center of the projection optical system PL, Abbe's error (off-axial error caused by an inclination of the stage) ia suppressed to the minimum by providing the center of detection of said FIA system 436 on a straight line for connecting the measurement position of the interferometer 412 to the center of the projection optical system PL, i.e., on the length-measurement axis (the center line of a length-measuring beam).

Moreover, in order to execute an alignment, it is required to perform a search alignment for roughly positioning the wafer (global alignment) and a fine alignment for performing an alignment with a high accuracy. With respect to this search alignment, there is also proposed a method of mixing the alignment system of the TTL method and the alignment system of the off-axis method, as disclosed in U.S. Pat. No. 4,677,301, for example. The apparatus of this embodiment normally adopts a sequence for performing the search alignment by detecting three or two alignment marks on the wafer by the use of the LIA system 410 of the TTL method which has a high processing speed. However, there are cases where the alignment is not performed normally because of a wafer ground, or a thickness or kind of the photoresist layer (specially when the mark detection is not performed satisfactorily) so that there is also provided means for switching the sequence to execute the search alignment by using the FIA system 436 with an illumination wavelength having a wide band range of the off-axis type. In this case, the sequences are switched over by determining a mark detection time, a size, a distortion, or the like of a mark detection signal when the search alignment is executed by the LIA system 410 of the TTL type.

Next, description will be made of the main control system 500 for integrally controlling the LIA system 410 of the TTL method, the FIA system 436 of the off-axis system, the stage controller 414, and the like. The main control system 500 is arranged to always receive positional information PDS from the interferometer 412. An alignment (ALG) data storing portion 501 is capable of receiving both mark positional information $AP_1$, from the LIA calculating unit 409 and mark positional information $AP_2$ from the FIA calculating unit 435.

An EGA (enhanced global alignment) calculating unit 502 calculates an actual shot arrangement coordinate value on the wafer, and a magnification (shot magnification) of a chip parameter, and the like, by a statistical computation method based on each mark positional information stored in the ALG data storing portion 501. A result of said calculation is sent to a sequence controller 506.

An exposure (EXP) shot map data portion 503 stores designed values in the arrangement coordinate of four pairs of wafer marks in each of all the shot areas to be exposed on the wafer, and these designed values are sent to the EGA calculating unit 502 and the sequence controller 506. An alignment shot map data portion 504 stores designed values in the arrangement coordinate of the four pairs of wafer marks in each of all the shot areas (sample shots) to be measured on the wafer, and these coordinate values are sent to the EGA calculating unit 502 and the sequence controller 506. A correction data storing portion 505 stores various kinds of data for alignment, correction data for positioning an exposure shot, or the like, and these kinds of correction data are sent to the ALG data storing portion 501 or the sequence controller 506. The sequence controller 506 determines a series of procedures for controlling a movement of the wafer stage ST in the alignment mode or the exposure mode of the step and repeat method.

Also, the projection optical system PL of this embodiment is provided with an imaging characteristic control device 419. The imaging characteristic control device 419 adjusts a projection magnification and a distortion of the projection optical system PL by adjusting a gap between predetermined lens groups out of the lens groups constituting, for example, the projection optical system PL, or adjusting a pressure of a gas inside a lens chamber between predetermined lens groups. As a result, a magnification of a projected image of the reticle is adjusted in accordance with a shot magnification measured, for example, by the in-shot multi-point EGA alignment. An operation of the imaging characteristic control device 419 is also controlled by the sequence controller 506.

Next, description will be made of a basic alignment sequence of the present embodiment. Also in the present embodiment, a shot area 27-$n$ as shown in FIG. 13 is formed on the wafer W. As shown in FIG. 13, four cross-shaped alignment marks 29 (n, N) (N=1 to 4) are formed on each shot area 27-$n$ on the wafer W. A reference position is determined for each of the shot area 27-$n$. For example, assuming that the reference position is determined to be the reference point 28-$n$ at the center of the shot area 27-$n$, designed coordinate value of this reference point 28-$n$ in the coordinate system ($\alpha$, $\beta$) on the wafer W is represented by ($C_{Xn}$, $C_{Yn}$) (see FIG. 13). Also in this embodiment, pairs of wafer marks 29 (n, 1) to 29 (n, 4) attached in each of shot area 27-$n$ are actually comprised of the wafer marks MX1 to MX4 for the x axis and the wafer marks MY1 to MY4 for the Y axis, as described with reference to FIG. 20A. For the convenience of explanation, the marks formed in each shot area will be described as cross-shaped marks. In this case, the centers of the cross-shaped marks are positioned on the measuring points SC1 to SC4 in the shot area shown in FIG. 20A.

In this case, if a coordinate system (x, y) on the shot area is set to be parallel to the coordinate system ($\alpha$, $\beta$) on the wafer W in FIG. 4A, as shown in FIG. 13, coordinate values upon the design of the measuring points in the coordinate system (x, y) corresponding to the paired wafer marks 29 (n, 1), 29 (n, 2), 29 (n, 3) and 29 (n, 4) are respectively represented by ($S_{1Xn}$, $S_{1Yn}$), ($S_{2Xn}$, $S_{1Yn}$), ($S_{3Xn}$, $S_{3Yn}$) and ($S_{4Xn}$, $S_{1Yn}$). For example, with respect to the paired wafer marks 29 (n, 1), the X-coordinate $S_{1Xn}$ in the coordinate ($S_{1Xn}$, $S_{1Yn}$) indicates the X-coordinate of the wafer mark MX1 for the X axis, while the Y-coordinate ($S_{1Yn}$) indicates the Y-coordinate of the wafer mark MY1 for the Y axis.

In this embodiment, like the foregoing first and second embodiments, 10 error parameters contained in the transformation matrices A, B and O in the coordinate transformation in the equation (10) or (17) are obtained by using statistical computation (e.g., by the method of least squares). In the present embodiment, error parameters contained in the transformation matrices A, B and O in the coordinate transformation in the equation (10) or (17) are obtained in the following manner.

The 10 error parameters ($\Theta$, W, $\Gamma x$ (or Rx), $\Gamma y$ (or Ry), $O_X$, $O_Y$, $\theta$, wx (=rx−1), ry) contained in the transformation matrices A, B and O in the coordinate transformation in the equation (17) are called in-shot multi-point EGA parameters. Out of these 10 error parameters, four error parameters indicating a status in a shot area, namely, the shot magnifications γx (or rx), γy (or rx), and the shot rotation $\theta$ and the chip rectangular degree w, are called the in-shot parameters. The above-mentioned 10 in-shot multi-point EGA parameters can be obtained by, for example, the method of least squares. In this embodiment, errors in calculated coordinates in the stage coordinate system (X, Y) and in each chip in each shot area on the wafer W are obtained on the basis of the coordinate transformation in the equation (17). Then, based on these errors, an error in the shot rotation (chip rotation), an error in the shot magnification (chip magnification), and the like, are compensated, and thereafter, arrangement coordinates ($F_{xn}$, $F_{yn}$) upon calculation of each shot area 27-$n$ on the wafer W are calculated. On the basis of this coordinates, alignment between each shot area 27-$n$ and the reticle is performed so as to expose the pattern image of the reticle.

Here, the above-mentioned process will be described with reference to the corresponding components in the main control system 500 shown in FIG. 19. In this main control system 500, the arrangement coordinates values upon the design of the four paired wafer marks in all of the shot areas on the wafer are stored in the EXP shot map data portion 503, while the coordinates values upon the design of the four paired wafer marks in the sample shot areas are stored in the ALG shot map data portion 504. Then, the calculation equation of the approximation of least squares for determining the above-mentioned 10 in-shot multi-point EGA parameters is stored in the EGA calculating unit 502.

It is noted that the method of least squares is not necessarily applied to the equation (17). Instead, the 10 in-shot multi-point EGA parameters may be obtained in the step of the equation (15).

The above-mentioned equation (16) contains all of the four in-shot parameters regarding the chip pattern (i.e., the shot rotation 8, the chip rectangular degree w, and the shot magnifications rx (=1+yx), ry (=1+yy)). However, it is possible to employ the equation (16) (or the equation (15)) by giving attention to any one parameter out of these four. More specifically, when attention is given only to the shot rotation θ, the equation (16) is employed by considering the chip rectangular degree w to be zero, and the shot magnifications rx and ry as 1, respectively. With regard to this, it is also possible to employ the equation (16) when attention is given to the shot magnifications rx and ry, assuming that rx=ry, that is, the linear expansion and contraction are isotropic.

A parameter to which an attention is to be given may be selected out of the four in-shot parameters in accordance with a kind (characteristics) of a wafer to be exposed.

Here, it is assumed that a wafer mark should be measured with respect to a sample shot which has been selected in advance out of all of the shot areas 27-$n$ of the wafer W. However, since a distance between the reference point 28-$n$ of each sample shot and the wafer mark in said shot area is comparatively short, there are generated large errors due to the reproductivity of measurement, or the like, with respect to the four in-shot parameters (θ, w, rx and ry) out of the above-mentioned 10 in-shot multi-point EGA parameters. For this reason, in order to reduce the errors, the number of sample shots and the number of wafer marks to be measured must be comparatively large. However, in this case, a through-put of the exposure process is lowered. Then, in the present embodiment, the decrease of the through-put is prevented and the alignment accuracy is kept high by using the following sequence. The following process utilizes the fact that an amount of linear error and an amount of non-linear error generally generated on the wafer and a deformation in a chip pattern in each shot area have the same tendencies in the same lot.

Also in the present embodiment, since there are provided two alignment sensors, two types of 10 in-shot multi-point EGA parameters can be obtained by an alignment sensor for detecting coordinate values of each wafer mark in a sample shot. More specifically, when an alignment of the EGA method is executed on the basis of a result of measurement by the LIA system 10, it is possible to obtain the 10 in-shot multi-point EGA parameters which include the scaling Γx and Γy, the shot magnifications γx and γy, the shot rotation θ, and the chip rectangular degree w in (Numerical Formula 10). In the same manner, when an alignment of the EGA method is executed on the basis of a result of the measurement by the FIA system 36, the 10 in-shot multipoint EGA parameters of the equation (27) can be obtained. However, some of the parameters obtained on the basis of the result of the measurement by, for example, the LIA system 410 may have predetermined deviations. Then, such a deviant parameter is corrected by a transformation parameter which is obtained based on a result of the measurement by the FIA system 436 and is used.

Next, an operation of an exposure using an alignment of the in-shot multi-point EGA method with respect to a wafer in one lot in the present embodiment will be described below with reference to a flowchart in FIG. 18. The following operation is executed when an exposure is effected onto a predetermined circuit pattern layer (process layer on the wafer. On said process layer, errors having substantially the same tendencies, that is, predetermined deviations from correct values are mixed in the scaling Rx and Ry and the shot magnifications rx and ry (or γx and γy) out of the in-shot multi-point EGA parameters which are obtained on the basis of a result of measurement by the alignment sensor of the LIA method from results of experiments and evaluation at trial in advance. However, errors in the other parameters are small. On the other hand, it is understood that errors in the scalings Rx and Ry and the shot magnifications rx and ry out of the in-shot multi-point EGA parameters which are obtained on the basis of a result of the measurement by the alignment sensor of the FIA method are small.

First, the first alignment sequence of the in-shot multi-point EGA method using the LIA system 410 and the second alignment sequence of the in-shot multi-point EGA method using the FIA system 436 are stored in the main control system 500, and an arrangement of sample shots (wafer marks, to be correct) to be measured on the wafer is set in the same manner by the first and second alignment sequences. Then, the in-shot multipoint EGA parameters obtained by the first alignment sequence are basically used. However, only the scalings Rx and Ry and the shot magnifications rx and ry out of said parameters are corrected in the following manner on the basis of the in-shot multipoint EGA parameters obtained by the second alignment sequence.

Figure 18:
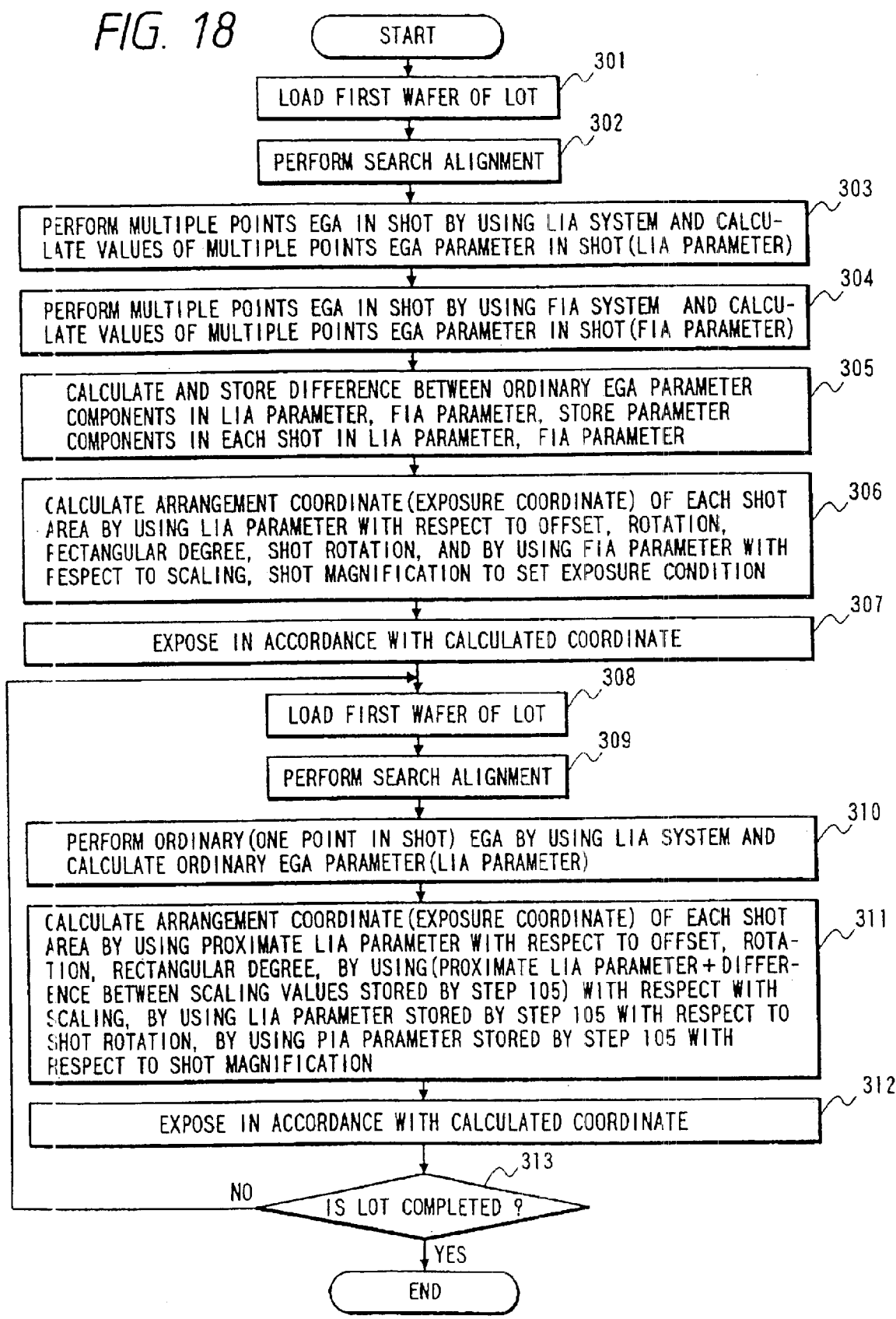
FIG. 18 is a flowchart illustrating an exposure operation according to a seventh embodiment of the present invention.

More specifically, at step 301 shown in FIG. 18, the first wafer W in one lot is loaded onto the wafer stage ST in FIG. 19. In this case, since an alignment of the reticle R has been completed, amounts of deviations of the reticle R in the X and Y directions and the direction of rotation with respect to the rectangular coordinate system which are specified by an unrepresented interferometer are substantially zero.

Figure 23:
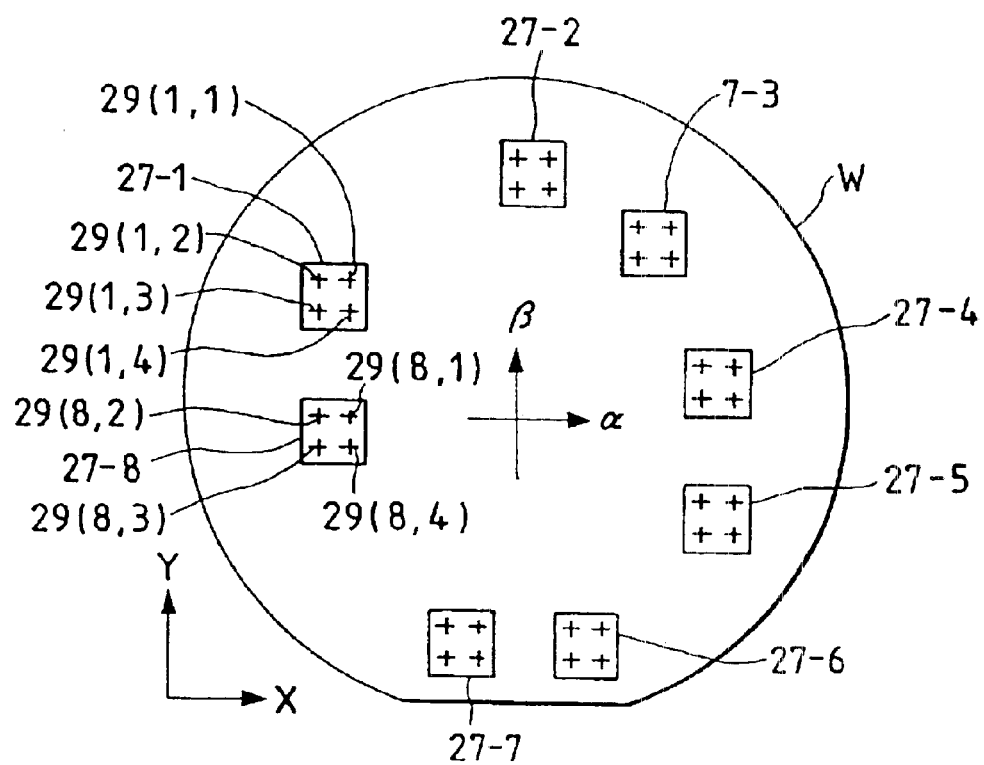
FIG. 23 is a plan view illustrating an arrangement of a sample shot on the wafer W to be subjected to an exposure operation in the seventh embodiment.

FIG. 23 shows a wafer W to be exposed. Referring to this FIG. 23, though a lot of shot areas are arranged on the wafer W along a coordinate system (sample coordinate system) (α, β) on the wafer W, only sample shots 27-1 to 27-8 to be measured are illustrated. In the shot area 27-$n$(n=1 to 8), four paired wafer marks 29 (n, 1) which are the same as the paired wafer marks 29 (n, 1) in FIG. 20A are respectively formed. After that, at step 302, a search alignment (global alignment) is executed. More specifically, several alignment marks for rough positioning are formed along the sample coordinate system (α, β) separately from the wafer marks attached in each shot area. Then, coordinate values of these alignment marks in the stage coordinate system (static coordinate system) (X, Y) are measured by, for example, the LIA system 410 (including an LIA system for the Y axis, the same is applied to the followings) or the FIA 436 in FIG. 19. Transformation parameters (scaling, rotation, offset, etc.) which are approximated to the stage coordinate system (X, Y) from the sample coordinate system (α, β) are obtained based on a result of said measurement and are stored in a memory of the EGA calculating unit 502 inside the main control system 500.

After that, when an alignment of the in-shot multi-point EGA method is performed, coordinate values of said paired wafer marks in the stage coordinate system (X, Y) are calculated in the EGA calculating unit 502 based on the arrangement coordinates in the sample coordinate system (α, β) at the reference point in a shot area to be measured, arrangement coordinates of each paired wafer mark having said reference point as the origin point, and transformation parameters approximated thereto. These coordinate values are supplied to the stage controller 414 via the sequence controller 506. Then, on the basis of these supplied coordinate values, the wafer marks for the X axis and the Y axis out of the paired wafer marks to be measured are successively moved to an observation field of the FIA system 436 or a laser beam irradiation area from the LIA system 410.

Next, at step 303 in FIG. 18, an alignment of the in-shot multi-point EGA method is executed by using the LIA system 410 of the TTL method. In other words, coordinate values ($FM_{NXn}$, $FM_{NYn}$) on the stage coordinate system (X, Y) of the paired wafer marks (29 (1, 1) . . . , 29 (1, 4) to 29 (8, 1) . . . , 29 (8, 4)) in all of the sample shots 27-1 to 27-8 on the wafer W in FIG. 23 are actually measured by the LIA system 410 (including the LIA system for the Y axis), which means all of the paired wafer marks in all of the sample shots on the wafer W are to be subjected to the measurement. However, it is not necessary to measure all of the wafer marks in all of the sample shots. Since two one-dimensional wafer marks are provided for one pair of wafer marks, it is necessary to actually measure the coordinate values of at least five paired wafer marks in order to determine 10 or more parameter values. However, it is possible to select to measure the wafer marks for the X axis only with respect to some paired marks, and to measure the wafer marks for the Y axis only with respect to the other paired wafer marks.

In this case, the arrangement coordinate values ($C_{Xn}$, $C_{Yn}$) upon the design of the reference mark 28-n(see FIG. 13) on the coordinate system (α, β) on the wafer W and the coordinate values upon design (relative coordinate values) ($S_{NXn}$, $S_{NYn}$) of the measured paired wafer marks 29 (n, N) (N=1 to 4) on the coordinate system (x, y) in each sample shot 27-n are obtained in advance. Then, at step 303, the arrangement coordinate values upon the design ($C_{Xn}$, $C_{Yn}$) of the reference mark in the shot area to which the measured alignment mark belongs and the relative coordinate values upon the design ($S_{NXn}$, $S_{NYn}$) related to the reference point of said alignment mark are substituted for the right side of the equation (17) so as to obtain coordinate values ($F_{NXn}$, $F_{NYn}$) upon calculation of said paired wafer mark 29 (n, N) to be in the stage coordinate system (X, Y).

Then, the 10 in-shot multi-point EGA parameters (hereinafter called the "LIA parameters") to satisfy the equation (17) by a calculation by the method of least squares by the EGA calculating unit 502 are calculated. These LIA parameters includes the scaling Γx (or Rx) and scaling Γy (or Ry), the rotation Θ, the rectangular degree w, the offsets Ox, Oy, the shot magnifications γx (or rx) and γy (or ry), the shot rotation θ, and the chip rectangular degree w.

More specifically, a difference ($E_{NXn}$, $E_{NYn}$) between the measured values ($FM_{NXn}$, $FM_{NYn}$) measured actually and the coordinate values upon calculation ($F_{NXn}$, $F_{NYn}$) thereof is considered as an alignment error. As a result, $E_{NXn}$=$FM_{NXn}$−$F_{NXn}$, $E_{NYn}$=$FM_{NYn}$−$F_{NYn}$ is satisfied. Then, if such an equation in which a square sum of the alignment errors ($E_{NXn}$, $E_{NYn}$) related to the measured alignment mark are partially differentiated with each of these 10 parameters successively and each of the obtained values becomes zero is set up, and if these 10 simultaneous equations are solved, the 10 parameters can be obtained.

After that, at step 304, the coordinate values in the stage coordinate system (X, Y) of each paired wafer mark 29 (n, N) in each of the sample shots 27-1 to 27-8 on the wafer W shown in FIG. 18 are measured by using the FIA system 436 to execute an alignment of the in-shot multi-point EGA method. The measured values obtained in this step are processed by the EGA calculating unit 502 so as to calculate the 10 in-shot multi-point EGA parameters (hereinafter called the "FIA parameters"). These FIA parameters also comprise the scaling Γx (or Rx) and scaling Γy (or Ry), the rotation Θ, the rectangular degree w, the offsets Ox, Oy, the shot magnifications γx (or rx) and γy (or ry), the shot rotation θ, and the chip rectangular degree w.

At the next step 305, with respect to the ordinary EGA parameters (the parameters related to the wafer) including the scaling Γx (or Rx) and scaling Γy (or Ry), the rotation Θ, the rectangular degree W, and the offsets Ox, Oy out of the obtained 10 in-shot multipoint EGA parameters, a difference $\Delta\Gamma x_{FL}$ (or $\Delta R_{XFL}$), $\Delta\Gamma y_{FL}$ (or $\Delta Ry_{FL}$) $\Delta\Theta_{FL}$, $\Delta W_{FL}$, $\Delta O_{YFL}$, and $\Delta O_{YFL}$, each of which is obtained by subtracting the LIA parameter from the FIA parameter, are calculated, and these obtained differences are stored in a correction data storing portion 505 inside the main control system 500. Further, with respect to the shot magnifications γx (or rx) and γy (or ry), the shot rotation θ, and the chip rectangular degree w which are the in-shot parameters out of the in-shot multi-point EGA parameters, the LIA parameters and FIA parameters themselves are stored in the correction data storing portion 505.

Then, for the wafer W for which the measurement is effected, at step 306, values of the LIA parameters are used for the offsets Ox, Oy, the rotation Θ, the rectangular degree W, the chip rectangular degree w and the shot rotation θ, while the scaling Γx (or Rx) and scaling Γy (or Ry) and the shot magnifications γx (or rx) and γy (or ry), values of the FIA parameters are used. Then, an appropriate rotation is applied to the reticle R via the reticle stage RS in FIG. 19 so as to correct the rotation Θ of the wafer in the transformation matrix A in the equation (17) and the shot rotation Θ in the transformation matrix B, or the wafer W is rotated so as to correct a rotation of a chip pattern for the stage coordinate system (X, Y), which means that the reticle R or the wafer W is rotated in accordance with a sum (Θ+θ) of the rotation Θ for constituting an element of the transformation matrix A and a shot rotation θ for constituting an element of the transformation matrix B in the equation (27).

However, when the wafer W is rotated, there is a possibility that the offsets (Ox, Oy) of the wafer may change, it is required to re-calculate error parameters by performing a calculation (an in-shot multi-point EGA calculation) for obtaining parameters by the above-mentioned method of least squares after the coordinate values of the wafer mark are remeasured. That is, when the wafer W is rotated only by the angle (Θ+θ), it is required to repeat the above-mentioned processes at steps 303 to 306, which also means to confirm whether or not a new rotation Θ after the rotation of the wafer W is a value corresponding to the angle of rotation at step 306.

The chip rectangular degree w can not be corrected in a strict sense. However, an error in said chip rectangular degree w can be suppressed to be small by rotating the reticle R properly. Then, it is possible to optimize an amount of rotation of the reticle R or the wafer W such that respective sums of absolute values of the rotation Θ, the shot rotation θ and the chip rectangular degree w are minimized.

Next, a projection magnification of the projection optical system PL is adjusted via the imaging characteristic control device 419 in FIG. 19 in such a manner that the shot magnifications γx (or rx) and γy (or ry) in the transformation matrix B in the equation (17) are corrected, which means that the projection magnification of the projection optical system PL is adjusted in accordance with the shot magnifications γx (=rx−1) and γy (=ry−1) for constituting elements of the transformation matrix B in the equation (27).

Thereafter, the transformation matrices A and O containing the elements comprising the in-shot multipoint EGA parameters obtained at step 305 are used to substitute the arrangement coordinate values upon the design ($C_{Xn}$, $C_{Yn}$) of the reference point 28-$n$ in each shot area 27-$n$ on the wafer W for the following equation so as to obtain the arrangement coordinate values ($G_{Xn}$, $G_{Yn}$) upon calculation of said reference point 28-$n$ in the stage coordinate system (X, Y).

At step 307, arrangement coordinates which are calculated on the basis of the arrangement coordinate system ($G_{Xn}$, $G_{Yn}$) obtained at step 306 and an amount of a base line (a distance between the center of detection of an alignment sensor and the center of exposure) which has been obtained in advance are successively supplied to the stage controller 414 via the sequence controller 506. Then, the reference point 28-$n$ of each shot area 27-$n$ on the wafer W is aligned with the center of an exposure field of the projection optical system PL shown in FIG. 19 so as to perform a projection-exposure of a pattern image of the reticle R onto said shot area 27-$n$. As a result, the program advances to step 308 upon completion of the exposure onto all of the shot areas on the wafer W.

At step 308, the exposed wafer W is conveyed, and the i-th (i=2, 3, . . . ) wafer to be exposed next in the same lot is loaded onto the wafer stage ST in FIG. 19.

In this embodiment, on the assumption that process status in the same lot has no large difference, a deviation (process offset) mixed into the scaling Γx (or Rx) and the scaling Γy (or Ry) out of the LIA parameters which are obtained on the basis of the measurement results by the LIA system 410 has substantially a constant value in the one lot. Further, the shot magnifications γx (=rx−1) and γy (=ry−1), and the shot rotation are considered to have substantially constant values.

Then, with respect to the second and subsequent wafers, the ordinary alignment of the EGA method is performed by using only the LIA system 410, the scaling out of the obtained LIA parameters is corrected by using the difference obtained for the first wafer, and for the shot rotation and the shot magnification the values obtained and stored for the first wafer are used.

Accordingly, as a sequence, after the search alignment is executed at step 309 in the same manner as that at step 302, the flow moves to the step 310 to measure the coordinate values of, for example, the first paired wafer marks 29 (1, 1) to 29 (8, 1) only with respect to the sample shots 27-1 to 27-8 having the same arrangement as those on the i-th wafer in FIG. 23 by using the LIA system 410, and a result of this measurement is processed to calculate the values for the ordinary EGA parameters (LIA parameters). In this case, the values for the LIA parameters obtained at the following step 311 are used for the wafer W measured at this step, while the values for the LIA parameters obtained immediately before are used for the offsets $O_x$ and $O_y$, the rotation Θ and the rectangular degree W. Values which are obtained by adding the scaling differences $\Delta \Gamma x_{FL}$ (or $\Delta Rx_{FL}$) and $\Delta \Gamma y_{FL}$ (or $\Delta Ry_{FL}$) stored at step 305 to the LIA parameter values obtained immediately before are used for the scaling Γx (or Rx) and the scaling Γy (or Ry), the LIA parameter values stored at step 305 are used for the shot rotation θ and the chip rectangular degree w, and the FIA parameter values stored at step 305 are used for the shot magnification γx (or rx) and γy (or ry).

Though all of the parameter values are determined in this manner, the values for the shot rotation and the shot magnification are corrected with respect to the first wafer so that there is no special need for performing correction with respect to the second and subsequent wafers. However, with respect to the rotation Θ, the correction may be performed by rotating the wafer or the reticle R.

After that, the transformation matrices A and O which contain the elements comprising these in-shot multi-point EGA parameters are used to substitute arrangement coordinate values ($C_{Xn}$, $C_{Yn}$) upon the design of the reference point 28-$n$ in each shot area 27-$n$ on the wafer for the equation (28) in the EGA calculating unit 505. Thus, the arrangement coordinate values ($G_{Xn}$, $G_{Yn}$) upon calculation in the stage coordinate system (X, Y) of said reference point 28-$n$ can be obtained.

At step 312, the arrangement coordinates ($G_{Xn}$, $G_{Yn}$) obtained at step 311 and the arrangement coordinates to be obtained on the basis of the amount of base line which has been obtained in advance are successively supplied to the stage controller 314 via the sequence controller 506 so as to align the reference point 28-$n$ in each shot area 27-$n$ on the wafer W with the center of the exposure field of the projection optical system PL shown in FIG. 19, successively. Thus, a pattern image of the reticle R is projection-exposed onto said shot area 27-$n$.

Next, at step 313, it is determined whether there is a wafer to be exposed residual in this lot or not. If there is one, the steps 308 to 312 are repeated to perform alignment and exposure. If there is no residual wafer to be exposed at step 313, this process is completed.

As described above, in the present embodiment, since the alignment is performed by the in-shot multipoint EGA method by using the LIA system 410 and the FIA system 436, not only the alignment accuracy between the shot areas, but also the alignment accuracy in a shot area such as that of the shot rotation and, shot magnification, etc., can be advantageously improved. However, taking into consideration that the in-shot parameters have the same tendencies in one lot, only the first wafer is required for the measurement by the in-shot multi-point EGA method actually. With respect to the subsequent wafers, measured values, stored values or values corrected with the stored values are used so that the through-put is hardly lowered, compared with that in the alignment by the ordinary EGA method.

It is noted that, in the foregoing description, the sample shots are measured respectively by the FIA system 436 and the LIA system 410 only for the first wafer in a lot in order to obtain a difference between an FIA parameter and an LIA parameter and in-shot parameters (shot magnification, shot rotation, and chip rectangular degree). However, with respect to the first several wafers, the alignment by the in-shot multi-point EGA method and, the alignment by the in-shot multi-point parameter method may be performed by using the LIA system 410 and the FIA system 436, respectively, so as to obtain an average of the LIA parameters and an average of the FIA parameters for said several wafers or a difference between said averages.

Then, with respect to subsequent wafers, the LIA system 410 which is capable of a high through-put may be used to perform alignment by the in-shot multi-point EGA method. In this case, with respect to the parameters (the scaling, and the shot magnification) which may have deviations in the LIA system 410, a high through-put and high alignment accuracy can be obtained by correcting said deviations with the difference between the average of the FIA parameters and that of the LIA parameters which have been already calculated.

Also, like at steps 303 and 304 in FIG. 18, the number of sample shots for calculating correction values for the in-shot multi-point EGA parameters may be large, compared with the number of ordinary sample shots as to be measured at step 310 in FIG. 18.

The two-dimensional coordinate values of one point in each sample shot (the X-coordinate and the Y-coordinate of one paired wafer mark) are measured by the LIA system 410 with respect to any of the second subsequent wafers in the above description. Though the measurement of the ordinary EGA method is performed by using the LIA system 410 capable of a high throughput with respect to any of the second and subsequent wafers (or the third or fourth and subsequent wafers), the Y-coordinate of one wafer mark for the Y axis which has a different position in the X direction in each sample shot may be measured by the LIA system 410 or the FIA system 436, together with said ordinary measurement. For example, in FIG. 23, the Y-coordinate of the paired wafer mark 29 (1, 2) or 29 (1, 3) in each of the sample shots 27-1 to 27-8 is measured by using LIA-system 410, while the X-coordinate and the Y-coordinate of one of the paired wafer marks 29 (1, 1) to 29 (8, 1) in each of the sample shot 27-1 to 27-8 are measured by using the LIA system 410.

In this case, since a multi-point measurement is performed with respect to the Y axis in each sample shot, the shot rotation θ which is one of the in-shot parameters out of the in-shot multi-point EGA parameters can be obtained. Then, at a step corresponding to the step 311 in FIG. 18, the value for the shot rotation which is obtained immediately before is used for the shot rotation θ, and the reticle R or the wafer W is rotated in accordance with a sum (Θ+θ) which is obtained by adding the value for the rotation Θ for constituting an element of the transformation matrix A in the equation (27) to the shot rotation θ obtained immediately before constituting an element of the transformation matrix B. After that, the exposure is effected so that the exposure is effected in a state in which a rotation error between the reticle R and each shot area on the wafer W is small.

Further, in addition to the measurement of one paired wafer marks by using the LIA system 410 in each sample shot, the X-coordinate of the paired wafer marks which have substantially the same Y-coordinate may be measured by using the FIA system 436. Thereby, the shot magnification γx (or rx), γy (or ry) serving as in-shot parameters can be obtained. However, there arises no substantial inconvenience if the FIA parameter value which is measured and stored for the wafers up to the fourth or fifth wafer is used for the shot magnification. This is because the shot magnification is normally stable in a lot, while the shot rotation is sometimes different for each wafer.

In the present embodiment, as shown in FIG. 20B, the paired wafer marks 29 (n, 1) to 29 (n, 4) which comprise one-dimensional wafer marks arranged in the X and Y directions in the stage coordinate system are provided at the four corners on the diagonal lines in the shot area 27-n. However, if, for example, four paired wafer marks are designed not to be arranged on one straight line, the above-mentioned arrangement is not always required. Further, the number of paired wafer marks may be two or more. Also, the position of the wafer mark for the X axis may be different from that for the Y axis.

Furthermore, a two-dimensional mark having, for example, a cross-shaped pattern may be used, depending on a combination of alignment sensors to be used.

It is not required to form wafer marks inside each shot area 27-n. Wafer marks may be formed at predetermined positions on a street line area SCL between the shot area 27-n and an adjacent shot area, for example, in FIG. 20A.

In the above embodiment, the FIA system 436 in FIG. 19 is of the off-axis method, while the LIA system 410 of the TTL method. However, the FIA system 436 may use, for example, the TTL method or the TTR method. In the opposite way, the LIA system 410 may use the TTR method. In the above embodiment, the LIA system 410 and the FIA system 436 are used as alignment sensors. However, an alignment sensor of the laser step alignment (LSA) method for relatively scanning the wafer marks and the laser beams which are converged in a slit-like form and the like may be used, in addition.

Further, in the present embodiment, a method for treating the wafer marks in each sample shot equally is employed as the in-shot multi-point EGA method.

However, it is possible to employ a weighing method in which a value of a transformation parameter is determined in such a manner that a residual error component which can be obtained by applying a weight determined in accordance with a distance from, for example, the center of the wafer with respect to each wafer mark in a sample shot on the wafer is minimized.

As described, the present invention is not limited to the foregoing embodiments, but can take various configurations within a scope of the concept of the present invention.

What is claimed is:

1. A method of aligning each of a plurality of processing areas arranged on a substrate with a predetermined transfer position in a static coordinate system XY for defining a moving position of said substrate, a pattern of a mask being transferred to each of said plurality of processing areas, wherein each of said plurality of processing areas has a plurality of positioning marks arranged by a predetermined positional relationship with respect to a specific point set in each of said plurality of processing areas, said method comprising:

(1) with respect to at least one substrate among a first to (K−1)th substrates (integer: $2 \leq K \leq N$):

measuring a coordinate position of a positioning mark in said static coordinate system XY in each of several processing areas out of said plurality of processing areas on said substrate by first and second alignment sensors;

calculating parameters of a first model equation expressing the regularity of arrangement of said plurality of processing areas by performing a statistical computation using first coordinate positions measured by said first alignment sensor and second coordinate positions measured by said second alignment sensor, and arrangement coordinates upon a design of said specific point and relative arrangement coordinates upon a design of said positioning mark for said specific point in said several processing areas; and moving said substrate relative to said mask based on coordinate positions of said plurality of processing areas in said static coordinate system XY, determined in accordance with said calculated parameters; and (2) with respect to a K-th substrate and subsequent substrates:

measuring coordinate positions of a plurality of positioning marks on said substrate in said static coordinate system XY by one of said first and second alignment sensors;

calculating parameters of a second model equation expressing the regularity of arrangement of said plurality of processing areas based on the coordinate positions measured by said one alignment sensor; and moving said substrate relative to said mask based on coordinate positions of said plurality of processing areas in said static coordinate system XY, determined in accordance with the parameters of said first model equation and the parameters of said second model equation.

2. A method according to claim 1, wherein (1) with respect to said at least one substrate:

calculating and storing differences between said parameters of said first model calculated by a first statistical computation using said first coordinate positions and said parameters of said first model calculated by a second statistical computation using said second coordinate positions, (2) with respect to said K-th substrate and subsequent substrates:

at least one of said parameters of said second model equation is determined in accordance with said stored differences and said coordinate positions measured by said one alignment sensor, and the others of said parameters of said second model equation are determined in accordance with said coordinate positions measured by said one alignment sensor.

3. A method according to claim 1, further comprising:

correcting at least on of a relative rotation error between said mask pattern and each of said processing areas and a relative configuration error between said mask pattern and each of said processing areas based on said stored parameters.

4. A method according to claim 1, further comprising:

measuring some of said plurality of positioning marks by the use of only one of said two alignment sensors with respect to the K-th and subsequent substrates, while measuring another some of said plurality of positioning marks by the use of any alignment sensor; and determining parameters based on results of these measurements.

5. A method in which each of a plurality of shot areas two-dimensionally arranged on each of N (integer: $N \geq 2$) substrates in accordance with an arrangement coordinate upon the design on said substrate is to be aligned with a predetermined reference position in a static coordinate system for defining a moving position of said substrate, a coordinate position of each of said plurality of shot areas in said static coordinate system is calculated by measuring a coordinate position of a shot area selected in advance out of said plurality of shot areas in said static coordinate system and by performing a statistical computation of said plurality of coordinate positions measured, and each of said plurality of shot areas is aligned with said reference position by controlling said moving position of said substrate in accordance with said calculated coordinate positions, wherein:

prior to the alignment of each of the plurality of shot areas on a k-th (integer: $2 \leq k \leq N$) and subsequent substrates with said reference position in accordance with the coordinate positions calculated by said statistical computation, one-dimensional or two-dimensional position measurement is performed at a plurality of points in each of the shot areas by the use of two alignment sensors with respect to at least one of the first to the (k-1)th substrates, and a difference between results of the statistical computations of the coordinate positions measured by the respective alignment sensors and a result of the statistical computation in a shot area of the coordinate positions measured by said respective alignment sensors is obtained and stored; and one-dimensional or two-dimensional position measurement is performed at one point in each of the shot areas by the use of only one of said two alignment sensors when the k-th substrate or any substrate subsequent thereto is aligned, and the already-stored difference between results of the statistical computations of the coordinate positions measured by said two alignment sensors and the already-stored result of the statistical computation in said shot area of the coordinate positions measured by said respective alignment sensors is corrected, whereby alignment can be effected based on said corrected results.

6. A method according to claim 5, comprising:

performing one-dimensional or two-dimensional position measurement at one point in a shot area by the use of one of said two alignment sensors when the k-th substrate or any substrate subsequent thereto is aligned, and measuring a one-dimensional coordinate position to a predetermined direction at a different point in said shot area by the use of either of the alignment sensors; and correcting a result obtained by performing statistical computation of a measurement result at said one point in said shot area and a measurement result at said different point by the use of the already-stored difference between results of the statistical computations of the coordinate positions measured by said two alignment sensors and the already-stored result of the statistical computation of the coordinate positions in said shot area measured by said two alignment sensors, respectively, thereby effecting alignment based on said corrected results.

7. A method of transferring a pattern of a mask onto each of a plurality of shot areas on a substrate, comprising:

measuring coordinate positions, on a static coordinate system in which said substrate is moved, of first marks on said substrate;

determining two sets of parameters in a single model equation, any one of the parameters in said two sets of parameters to be used commonly upon calculating coordinate positions of said plurality of shot areas on said substrate, the parameters in one of the two sets of parameters relating to arrangement of said plurality of shot areas on said substrate and the parameters in the other set of parameters relating to said shot areas per se, said parameters relating to said shot areas per se including at least one of shot area rotation, size and shape; and relatively moving said mask and said substrate in accordance with said determined parameters to transfer said pattern onto said each shot area.

8. A method according to claim 7, further comprising:

forming an image of said pattern on said substrate through a projection optical system; and relatively rotating said mask and said substrate based on a rotation error, of said areas relative to said formed image, determined in accordance with a part of said parameters.

9. A method according to claim 7, further comprising:

forming an image of said pattern on said substrate through a projection optical system; and adjusting an optical property of said projection optical system based on a configuration error, of said areas relative to said formed image, determined in accordance with a part of said parameters.

10. A method according to claim 7, further comprising:

measuring coordinate positions on said static coordinate system, of a plurality of second marks on said mask; and determining a parameter in an equation to define arrangement of said plurality of second marks in accordance with the measured coordinate positions, wherein said mask and said substrate are relatively moved in accordance with the determined parameter and said parameters.

11. A method according to claim 7, wherein said parameters being calculated so that each of deviations between said measured coordinate positions and coordinate positions determined by said equation for each of said first marks is minimized.

12. A method according to claim 11, wherein coordinate positions on said static coordinate system, of said plurality of areas are determined in accordance with said equation of which said parameters are calculated to relatively move said mask and said substrate based on the determined coordinate positions.

13. A method according to claim 9, wherein said configuration error includes a magnification error of said areas relative to said formed image.

14. A method according to claim 2, wherein the others of said parameters of said second model equation includes an offset, a rotation and a rectangular degree of said substrate and a rotation of said processing areas.

15. A method of illuminating a mask on which a pattern for exposure is formed, and projection-exposing said pattern of the mask onto a substrate through a projection optical system, comprising:

(a) using as said mask a mask formed with a plurality of marks to be used for position detection, as well as said pattern for exposure, and detecting position information on images of said plurality of marks which are projected through said projection optical system;

(b) obtaining a plurality of error parameters by performing statistical computation using the position information detected in (a); and (c) controlling an image-forming characteristic of said projection optical system based upon said error parameters obtained by (b).

16. A method according to claim 15, wherein said error parameters include a magnification error on a coordinate system on said mask.

17. A method according to claim 16, wherein in (c), a projection magnification of said projection optical system is controlled based upon said magnification error.

18. A method according to claim 17, wherein said projection optical system comprises a plurality of lens groups, and in (c), a space between predetermined lens groups of said projection optical system is adjusted, or a gas pressure in a lens space between predetermined lens groups, is adjusted.

19. A method according to claim 16, wherein, in exposing an image of the pattern of said mask onto a first layer on said substrate, a projection magnification of said projection optical system is adjusted so that said magnification error becomes one.

20. A method according to claim 16, wherein, in exposing an image of the pattern of said mask onto one of layers subsequent to a second layer on said substrate, a projection magnification of said projection optical system is adjusted so that said magnification error coincides with a magnification error of a pattern which has already been formed on said one layer.

21. A method according to claim 15, wherein said plurality of error parameters include information on an error of a second coordinate system on said mask with respect to a first coordinate system which defines the position of said substrate.

22. A method according to claim 21, wherein said plurality of error parameters include at least one of a rotation error of said mask, a rectangular degree error of said second coordinate system, a magnification error of said mask on said second coordinate system, and an offset error of said second coordinate system with respect to said first coordinate system.

23. A method according to claim 22, further comprising:

(d) rotating said mask or said substrate based upon a rotation error of said mask.

24. A method according to claim 15, wherein, in projecting an image of the pattern on said mask onto said substrate, said image of the pattern is moved relative to said substrate.

25. A method of manufacturing a device, comprising:

projecting, onto a substrate, a circuit pattern for forming a semiconductor device or a liquid crystal display device, using a method according to claim 24.

* * * * *